US012243900B2

(12) United States Patent
Ikuma et al.

(10) Patent No.: US 12,243,900 B2
(45) Date of Patent: Mar. 4, 2025

(54) SOLID-STATE IMAGING APPARATUS AND IMAGING APPARATUS INCLUDING THE SAME

(71) Applicant: Nuvoton Technology Corporation Japan, Kyoto (JP)

(72) Inventors: Makoto Ikuma, Hyogo (JP); Hiroyuki Amikawa, Ishikawa (JP); Yutaka Abe, Osaka (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 44 days.

(21) Appl. No.: 17/879,428

(22) Filed: Aug. 2, 2022

(65) Prior Publication Data

US 2022/0367557 A1 Nov. 17, 2022

Related U.S. Application Data

(63) Continuation of application No. PCT/JP2021/003103, filed on Jan. 28, 2021.

(30) Foreign Application Priority Data

Feb. 18, 2020 (JP) ................. 2020-025065

(51) Int. Cl.
*H01L 27/146* (2006.01)
*H04N 25/59* (2023.01)
(Continued)

(52) U.S. Cl.
CPC .. *H01L 27/14643* (2013.01); *H01L 27/14609* (2013.01); *H04N 25/59* (2023.01);
(Continued)

(58) Field of Classification Search
CPC ........ H01L 27/14643; H01L 27/14609; H04N 25/59; H04N 25/65; H04N 25/75;
(Continued)

(56) References Cited

U.S. PATENT DOCUMENTS 6,777,660 B1 8/2004 Lee
7,274,397 B2 9/2007 Fowler
(Continued)

FOREIGN PATENT DOCUMENTS

GB 2525625 A 11/2015
JP 2018-117347 A 7/2018
(Continued)

OTHER PUBLICATIONS

International Search Report issued on Apr. 20, 2021 in International Patent Application No. PCT/JP2021/003103, with English translation.
(Continued)

*Primary Examiner* — Ahmed A Berhan
(74) *Attorney, Agent, or Firm* — Rimon P.C.

(57) ABSTRACT

A solid-state imaging apparatus includes a pixel circuit and a negative feedback circuit. The pixel circuit includes: a photodiode; a charge storage that holds a signal charge generated by the photodiode; an amplification transistor that outputs a pixel signal corresponding to the signal charge in the charge storage; a first reset transistor that resets the charge storage; a first storage capacitive element for holding a signal charge; and a first transistor that controls the connection between the charge storage and the first storage capacitive element. The negative feedback circuit negatively feeds back a feedback signal corresponding to a reset output of the amplification transistor to the charge storage via the first reset transistor.

23 Claims, 61 Drawing Sheets

(51) Int. Cl.
*H04N 25/65* (2023.01)
*H04N 25/75* (2023.01)
*H04N 25/771* (2023.01)
*H04N 25/778* (2023.01)

(52) U.S. Cl.
CPC ............. *H04N 25/65* (2023.01); *H04N 25/75* (2023.01); *H04N 25/771* (2023.01); *H04N 25/778* (2023.01)

(58) Field of Classification Search
CPC .... H04N 25/771; H04N 25/778; H04N 25/58; H04N 25/621
See application file for complete search history.

(56) References Cited

U.S. PATENT DOCUMENTS

| | | | | |
|---|---|---|---|---|
| 9,917,119 | B2* | 3/2018 | Murakami | H01L 27/14643 |
| 10,720,467 | B2* | 7/2020 | Sugawa | H04N 25/778 |
| 2009/0045319 | A1* | 2/2009 | Sugawa | H04N 25/771 |
| | | | | 250/208.1 |
| 2015/0015760 | A1 | 1/2015 | Tsunai | |
| 2016/0150175 | A1* | 5/2016 | Hynecek | H04N 25/65 |
| | | | | 250/214 A |
| 2017/0118422 | A1 | 4/2017 | Tsunai | |
| 2017/0134675 | A1 | 5/2017 | Hynecek | |
| 2018/0205896 | A1* | 7/2018 | Nishimura | H04N 25/573 |
| 2018/0227512 | A1 | 8/2018 | Tsunai | |
| 2019/0238768 | A1 | 8/2019 | Yamada et al. | |
| 2020/0043971 | A1 | 2/2020 | Sugawa et al. | |
| 2020/0236307 | A1 | 7/2020 | Tsunai | |
| 2021/0337141 | A1 | 10/2021 | Tsunai | |
| 2023/0362504 | A1 | 11/2023 | Tsunai | |

FOREIGN PATENT DOCUMENTS

| | | |
|---|---|---|
| JP | 2020-017987 A | 1/2020 |
| JP | 2020-025264 A | 2/2020 |
| WO | 2018/070377 A1 | 4/2018 |

OTHER PUBLICATIONS

Extended European Search Report issued in corresponding European Patent Application No. 21757737.8, dated Jun. 30, 2023.
Japanese Office Action dated Nov. 5, 2024 issued in the corresponding Japanese Patent Application No. 2022-501736.

* cited by examiner

| | LCG readout |
|---|---|
| Reset component (down-count) | (2) |
| Signal component (up-count) | (1) |
| Reset noise | Generated upon shutter and reset readout →Reduced by noise canceling circuit (RS) |

Readout order of reset component and signal component (1) → (2)

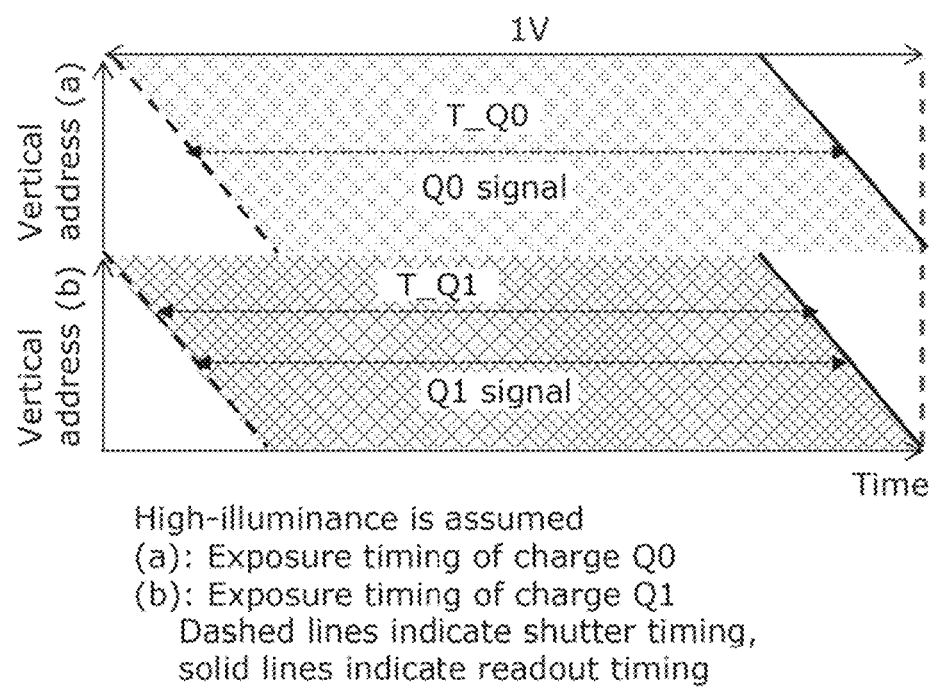

FIG. 17

|  | Unit | Low-illuminance frame<br>PD<N> @<br>HCG readout | High-illuminance frame<br>C1<N> @<br>LCG readout |
|---|---|---|---|
| FD potential | Charge (ele) | Q0 | Q1 |
|  | FD potential (V) | Q0/C0 | Q1/C1 or Q1/C4 |
| FD mixed potential | Total charge (ele) | Q0 | Q0+Q1 |
|  | FD potential (V) | Q0/C0 | (Q0+Q1)/(C0+C1) or (Q0+Q1)/(C0+C4) |
|  | LSB | ADH = ADC × FD potential | ADM = ADC × FD potential |

ADC: quantization unit (LSB/mV)

|  | LCG readout |
|---|---|
| Reset component (down-count) | (2) |
| Signal component (up-count) | (1) |
| Reset noise | Generated upon shutter and reset readout →Reduced by noise canceling circuit (RS) |

Readout order of reset component and signal component (1)→(2)

FIG. 28B

| | HCG readout | LCG readout |
|---|---|---|
| Reset component (down-count) | (1) | (4) |
| Signal component (up-count) | (2) | (3) |
| Reset noise | Canceled via CDS | Generated upon shutter and reset readout →Reduced by noise canceling circuit (RS) |

Readout order of reset component and signal component (1)→(2)→(3)→(4)

FIG. 33B

| | HCG readout | LCG readout |
|---|---|---|
| Reset component (down-count) | (1) | (4) |
| Signal component (up-count) | (2) | (3) |
| Reset noise | Canceled via CDS | Generated upon shutter and reset readout →Reduced by noise canceling circuit (RS, TGC) |

Readout order of reset component and signal component (1)→(2)→(3)→(4)

FIG. 35B

| | HCG readout | MCG readout | LCG readout |
|---|---|---|---|
| Reset component (down-count) | (1) | (6) | (5) |
| Signal component (up-count) | (2) | (3) | (4) |
| Reset noise | Canceled via CDS | Generated upon shutter and reset readout →Reduced by noise canceling circuit (RS, GC2) | |

Readout order of reset component and signal component (1)→(2)→(3)→(4)→(5)→(6)

High-illuminance is assumed
(a): Exposure timing of charge Q0
(b): Exposure timing of charge Q1
(c): Exposure timing of charge Q2
 Dashed lines indicate shutter timing,
 solid lines indicate readout timing

FIG. 38

| | | Unit | Low-illuminance frame PD<N> @ HCG readout | Medium-illuminance frame C1<N> @ MCG readout | High-illuminance frame C2<N> @ LCG readout |
|---|---|---|---|---|---|
| | | Charge (ele) | Q0 | Q1 | Q2 |
| FD potential | | FD potential (V) | Q0/C0 | Q1/C1 or Q1/C3 | Q2/C2 or Q2/C4 |
| FD mixed potential | | Total charge (ele) | Q0 | Q0+Q1 | Q0+Q1+Q2 |
| | | FD potential (V) | Q0/C0 | (Q0+Q1)/(C0+C1) or (Q0+Q1)/(C0+C3) | (Q0+Q1+Q2)/(C0+C1+C2) or (Q0+Q1+Q2)/(C0+C3+C4) |
| | | LSB | ADH = ADC × FD potential | ADM = ADC × FD potential | ADL = ADC × FD potential |

ADC: quantization unit (LSB/mV)

FIG. 41B

|  | HCG readout | MCG readout | LCG readout |
|---|---|---|---|
| Reset component (down-count) | (2) | (1) | (6) |
| Signal component (up-count) | (3) | (4) | (5) |
| Reset noise | Canceled via CDS | Canceled via CDS | Generated upon shutter and reset readout →Reduced by noise canceling circuit (RS, TGC) |

Readout order of reset component and signal component (1)→(2)→(3)→(4)→(5)→(6)

FIG. 43B

| | HCG readout | MCG readout | LCG readout |
|---|---|---|---|
| Reset component (down-count) | (1) | (4) | (6) |
| Signal component (up-count) | (2) | (3) | (5) |
| Reset noise | Canceled via CDS | Generated upon shutter and reset readout →Reduced by noise canceling circuit (RS, GC2) | |

Readout order of reset component and signal component (1)→(2)→...→(5)→(6)

Exposure timing of charges Q0, Q1, Q2, Q3, and Q4
Dashed lines indicate shutter timing,
solid lines indicate readout timing

FIG. 46B

| | HCG readout | MCG readout | LCG readout |
|---|---|---|---|
| Reset component (down-count) | (1) | (4) | (6) |
| Signal component (up-count) | (2) | (3) | (5) |
| Reset noise | Canceled via CDS | Generated upon shutter and reset readout →Reduced by noise canceling circuit (RS, TGC) | |

Readout order of reset component and signal component (1)→(2)→...→(5)→(6)

SOLID-STATE IMAGING APPARATUS AND IMAGING APPARATUS INCLUDING THE SAME

CROSS REFERENCE TO RELATED APPLICATIONS

This is a continuation application of PCT International Application No. PCT/JP2021/003103 filed on Jan. 28, 2021, designating the United States of America, which is based on and claims priority of Japanese Patent Application No. 2020-025065 filed on Feb. 18, 2020. The entire disclosures of the above-identified applications, including the specifications, drawings, and claims are incorporated herein by reference in their entirety.

FIELD

The present invention relates to a solid-state imaging apparatus and an imaging apparatus including the same.

BACKGROUND

Patent Literature (PTL) 1 discloses a negative feedback circuit that reduces reset noise.

CITATION LIST

Patent Literature

PTL 1: U.S. Pat. No. 6,777,660

SUMMARY

Technical Problem

Unfortunately, with the conventional technique, it is difficult to extend the dynamic range and improve SN.

In view of the above, the present disclosure provides a solid-state imaging apparatus and an imaging apparatus that can both extend the dynamic range and improve SN.

Solution to Problem

In order to overcome the above-described problem, a solid-state imaging apparatus according to the present disclosure includes a pixel circuit and a negative feedback circuit. The pixel circuit includes: a photodiode; a charge storage; a transfer transistor that transfers a signal charge generated by the photodiode to the charge storage; an amplification transistor that outputs a pixel signal corresponding to a signal charge in the charge storage; a first reset transistor that resets the charge storage; a first storage capacitive element; and a first transistor that controls a connection between the charge storage and the first storage capacitive element. The negative feedback circuit negatively feeds back a feedback signal according to a reset output of the amplification transistor to the charge storage (FD0) via the first reset transistor. This configuration provides transfer element Tr and a switching element, which is disposed between a photodiode (PD) and storage capacitive element C. This configuration improves low-illuminance image quality via correlated double sampling (CDS) by turning off the first storage capacitive element in low-illuminance conditions and improves high-illuminance image quality by turning on the first storage capacitive element in high-illuminance conditions, while at the same time reducing reset noise via the negative feedback circuit.

Advantageous Effects

With the solid-state imaging apparatus and the imaging apparatus according to the present disclosure, it is possible to both extend the dynamic range and improve SN.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 11 illustrates timing related to the accumulating of charges of a photodiode and a storage capacitive element.

FIG. 17 illustrates the FD potentials in the HCG readout operation for a low-illuminance frame and the LCG readout operation for a high-illuminance frame.

FIG. 28B illustrates the readout sequence of the reset component and the signal component in the HCG readout and the LCG readout of FIG. 28A.

FIG. 33B illustrates the readout sequence of the reset component and the signal component in the HCG readout and the LCG readout of FIG. 33A.

FIG. 35B illustrates the readout sequence of the reset component and the signal component in the HCG readout, the MCG readout, and the LCG readout of FIG. 35A.

FIG. 38 illustrates the FD potentials in the HCG readout, the MCG readout, and the LCG readout in FIG. 37.

FIG. 41B illustrates the readout sequence of the reset component and the signal component in the HCG readout, the MCG readout, and the LCG readout of FIG. 41A.

FIG. 43B illustrates the readout sequence of the reset component and the signal component in the HCG readout, the MCG readout, and the LCG readout of FIG. 43A.

FIG. 46B illustrates the readout sequence of the reset component and the signal component in the HCG readout, the MCG readout, and the LCG readout of FIG. 46A.

DESCRIPTION OF EMBODIMENTS (Underlying Knowledge Forming the Basis of the Present Disclosure)

The inventors have found that the following issues arise in relation to the solid-state imaging apparatus described in the Background Art section.

In the solid-state imaging apparatus disclosed in PTL 1, the signal charge generated by the photodiode is stored in the floating diffusion layer (hereinafter called FD capacitor) as-is, and the feedback circuit that inputs the reset level output from the source follower circuit into reset transistor RS via the feedback amplifier and feedback line reduces reset noise.

Figure 51A:
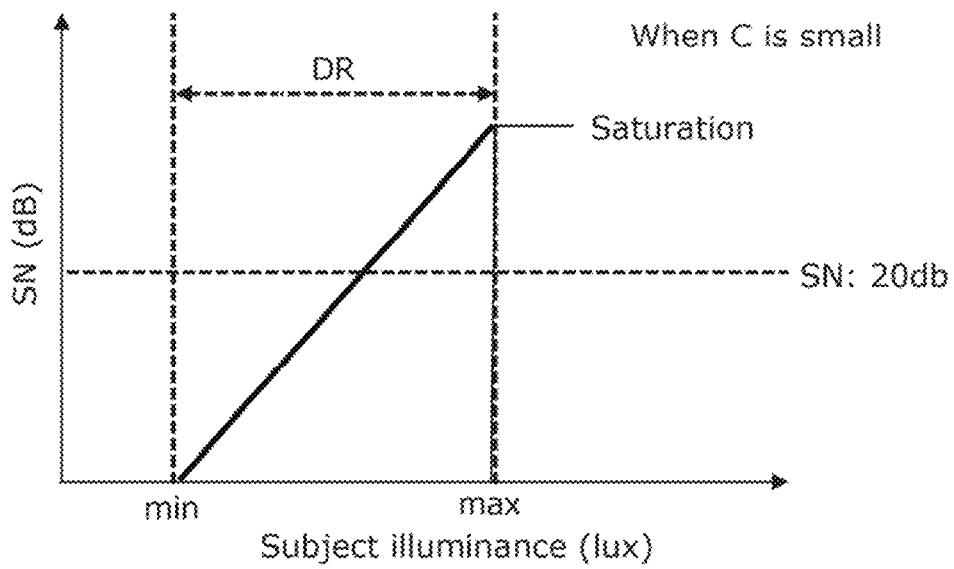
FIG. 51A illustrates the relationship between subject illuminance and SN when the FD capacitor directly connected to the photodiode is small in PTL 1.

FIG. 51A illustrates the relationship between subject illuminance and signal-to-noise ratio (SN) when the FD capacitor directly connected to the photodiode is small in PTL 1. Subject illuminance is represented on the horizontal axis, and SN is represented on the vertical axis. min indicates the minimum subject illuminance at which imaging is possible, and max indicates the maximum subject illuminance. FIG. 51A shows that if the size of the FD capacitor is reduced, the minimum subject illuminance will be better (lower), but the maximum subject illuminance will be worse (lower) (Problem 1).

Figure 51B:
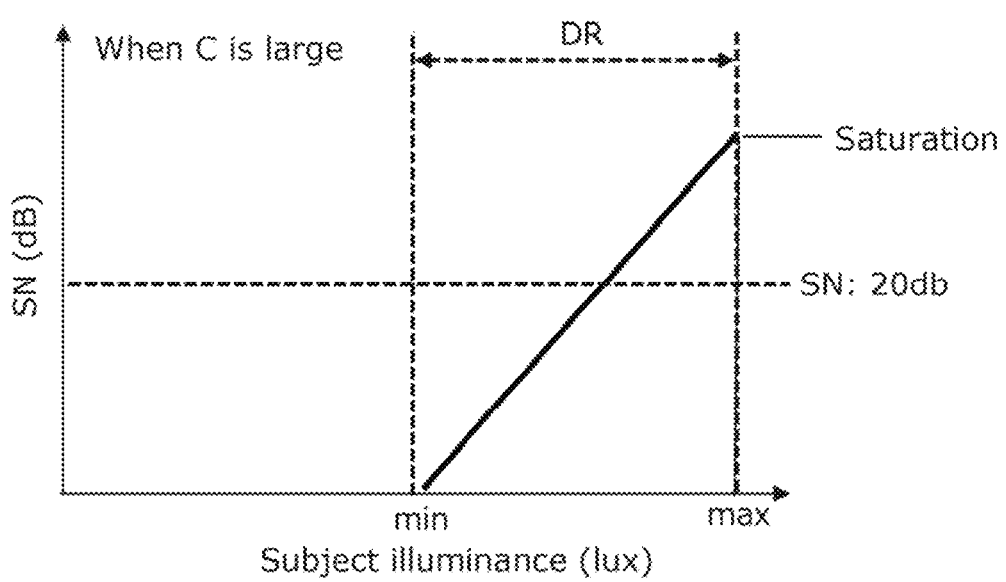
FIG. 51B illustrates the relationship between subject illuminance and SN when the FD capacitor is larger than in FIG. 51A.

FIG. 51B conversely illustrates the relationship between subject illuminance and SN when the FD capacitor is large. It can be seen that if the size of the FD capacitor is increased, the minimum subject illuminance will be worse (higher), but the maximum subject illuminance will be better (higher) (Problem 2).

Neither a larger nor a smaller FD capacitor can significantly extend the dynamic range.

Another possible configuration is to allow the addition of other capacitive elements in addition to the FD capacitor to, in essence, expand or make variable the capacitance of FD capacitor, but adding capacitive elements would create another problem, namely that reset noise is likely to occur (Problem 3).

In view of the above, the present disclosure provides a solid-state imaging apparatus and an imaging apparatus that can both extend the dynamic range and improve SN.

(Outline of the Solid-State Imaging Apparatus According to One Aspect of the Present Disclosure)

The solid-state imaging apparatus according to one aspect of the present disclosure includes a storage circuit group, for overflow signal charge, that includes a plurality of stages ($m \geq 1$) of storage circuits in series for holding the signal charge that overflows from a photodiode. A single storage circuit is made up of a switching element functioning as an overflow gate and a storage capacitive element. Here, there are two configurations for photodiode PD: one in which the storage circuit group is arranged in series in the horizontal direction, and the other in which the storage circuit group is arranged in series in the vertical direction.

During the exposure period, when m=1, the storage capacitive element of a storage circuit receives the charge that overflows from photodiode PD. When m>2, the charge that overflows from this storage capacitive element is further received by the storage capacitive elements in the subsequent stage storage circuits.

The storage capacitive element in a storage circuit cannot completely transfer the signal charge, so reset noise is generated upon signal shutter and reset. Here, reset noise indicates kTC noise. Noise level is expressed as $\sqrt{(kTC)(C)}$ or $\sqrt{(kTC)}/e(ele)$ in terms of amount of charge and $\sqrt{(kT/C)}$ (V) in terms of voltage. To inhibit such reset noise, the solid-state imaging apparatus according to one aspect of the present disclosure further includes a negative feedback circuit that negatively feeds back the reset signal.

Next, an overview of the solid-state imaging apparatus according to one aspect of the present disclosure will be given by way of three configuration examples illustrated in FIG. 1A through FIG. 1C.

[0.1 First Configuration Example of the Solid-State Imaging Apparatus]

First, the first configuration example will be given. The first configuration example is a configuration including two stages (m=2) of the storage circuits connected in the vertical direction.

Figure 1A:
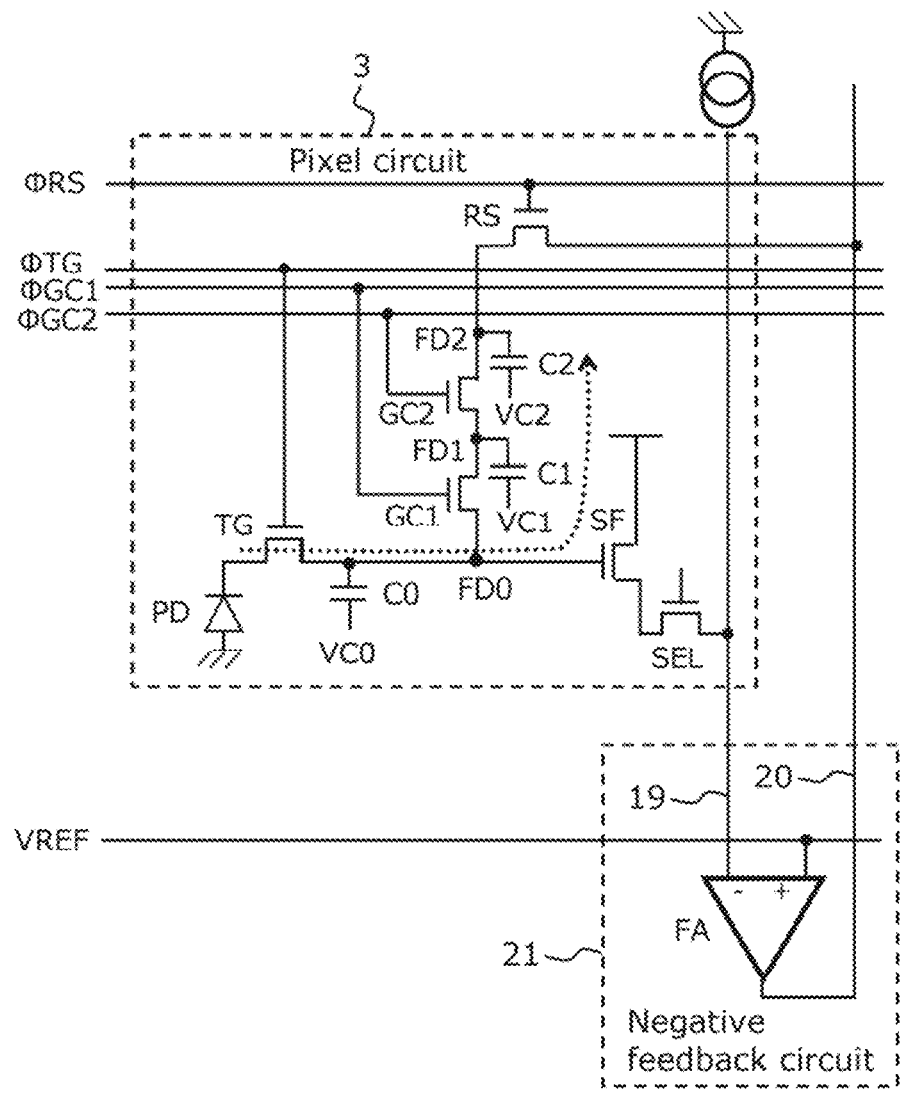
FIG. 1A illustrates a first configuration example of the main part of a solid-state imaging apparatus according to one aspect of the present disclosure.

FIG. 1A illustrates the first configuration example of the main part of solid-state imaging apparatus 100 according to one aspect of the present disclosure.

Solid-state imaging apparatus 100 in FIG. 1A includes pixel circuit 3 and negative feedback circuit 21.

FIG. 1A illustrates one pixel circuit 3 among the plurality of pixel circuits 3 arranged in a matrix. Pixel circuit 3 includes photodiode PD, transfer transistor TG, charge storage FD0, transfer transistor TG, amplification transistor SF, reset transistor RS, first storage capacitive element C1, first transistor GC1, second storage capacitive element C2, second transistor GC2, and selection transistor SEL.

Photodiode PD is a photoelectric conversion element that converts incident light into a signal charge. The signal charge that overflows from photodiode PD during exposure is transferred to and held by first storage capacitive element C1, as shown by the dotted arrow line in FIG. 1A. The signal charge that overflows at first storage capacitive element C1 is further transferred to and held by second storage capacitive element C2.

Charge storage FD0 is formed as, for example, a floating diffusion layer, and holds the signal charge generated by photodiode PD. In FIG. 1A, the capacitance of charge storage FD0, or charge storage FD0 as a capacitive element, is denoted as C0.

Amplification transistor SF outputs the pixel signal corresponding to the signal charge in charge storage FD0 to vertical signal line 19 via selection transistor SEL.

Reset transistor RS resets charge storage FD0. More specifically, reset transistor RS can perform three different resets depending on how first transistor GC1 and second transistor GC2 are controlled. Even more specifically, reset transistor RS can (i) reset floating diffusion layer FD0, first storage capacitive element C1, and second storage capacitive element C2, (ii) reset first storage capacitive element C1 and second storage capacitive element C2, and (iii) reset second storage capacitive element C2.

First storage capacitive element C1 holds the signal charge that overflows from photodiode PD. For example, first storage capacitive element C1 stores the signal charge that overflows from photodiode PD during exposure via transfer transistor TG and first transistor GC1.

First transistor GC1 is a transistor that controls the connection between charge storage FD0 and first storage capacitive element C1. First transistor GC1 takes on and off states as a switching element. Furthermore, the gate voltages of transfer transistor TG and first transistor GC1 are not required to be in a completely off state during exposure; the gate voltages are set such that the signal charge overflowing from photodiode PD can be transferred from transfer transistor TG to first storage capacitive element C1 via charge storage FD0 and first transistor GC1 during exposure.

Second storage capacitive element C2 holds the signal charge that overflows from first storage capacitive element C1. For example, second storage capacitive element C2 stores the signal charge that overflows from first storage capacitive element C1 via second transistor GC2.

Second transistor GC2 is a gain control transistor that controls the connection between first storage capacitive element C1 and second storage capacitive element C2. Second transistor GC2 takes on and off states as a switching element. Furthermore, the gate voltage of second transistor GC2 is not required to be in a completely off state during exposure; the gate voltage is set such that the signal charge overflowing from first storage capacitive element C1 can be transferred to second storage capacitive element C2 via second transistor GC2 during exposure.

Selection transistor SEL is a switching element that selects whether or not to output the pixel signal from amplification transistor SF to vertical signal line 19. The pixel signal has at least two levels, a reset level and a signal level.

One negative feedback circuit 21 is provided per column of pixel circuits 3. Alternatively, one negative feedback circuit 21 is provided per pixel circuit 3. Negative feedback circuit 21 negatively feeds back the feedback signal according to the reset output of amplification transistor SF from vertical signal line 19, to charge storage FD0 from feedback line 20 via first reset transistor RS. More specifically, negative feedback circuit 21 includes feedback amplifier FA. The reset output of amplification transistor SF is input to the negative input terminal of feedback amplifier FA via vertical signal line 19. Reference voltage VREF, which serves as a reference for the reset level, is input to the positive input terminal of feedback amplifier FA. The output terminal of feedback amplifier FA negatively feeds back the difference between reference voltage VREF and the reset output to charge storage FD0 via feedback line 20 and first reset transistor RS.

In the first configuration example of solid-state imaging apparatus 100 illustrated in FIG. 1A, solid-state imaging apparatus 100 includes a storage circuit group, for overflow, that includes a plurality of stages (m 1) of storage circuits in series for holding the signal charge that overflows from photodiode PD. A single storage circuit is made up of a switching element and a storage capacitive element. In the example in FIG. 1A, m=2. The first stage storage circuit is made up of first transistor GC1 and first storage capacitive element C1. The second stage storage circuit is made up of second transistor GC2 and second storage capacitive element C2. The pair of transfer transistor TG and charge storage FD0 may be regarded as the $0^{th}$ stage storage circuit. The storage circuit group is a source of reset noise, but is reset by negative feedback circuit 21. This makes it possible to inhibit reset noise.

With this configuration, it possible to achieve both dynamic range extension and SN improvement.

[0.2 Second Configuration Example of the Solid-State Imaging Apparatus]

Next, the second configuration example will be given. The second configuration example is a configuration including two stages (m=2) of the storage circuits connected in the horizontal direction.

Figure 1B:
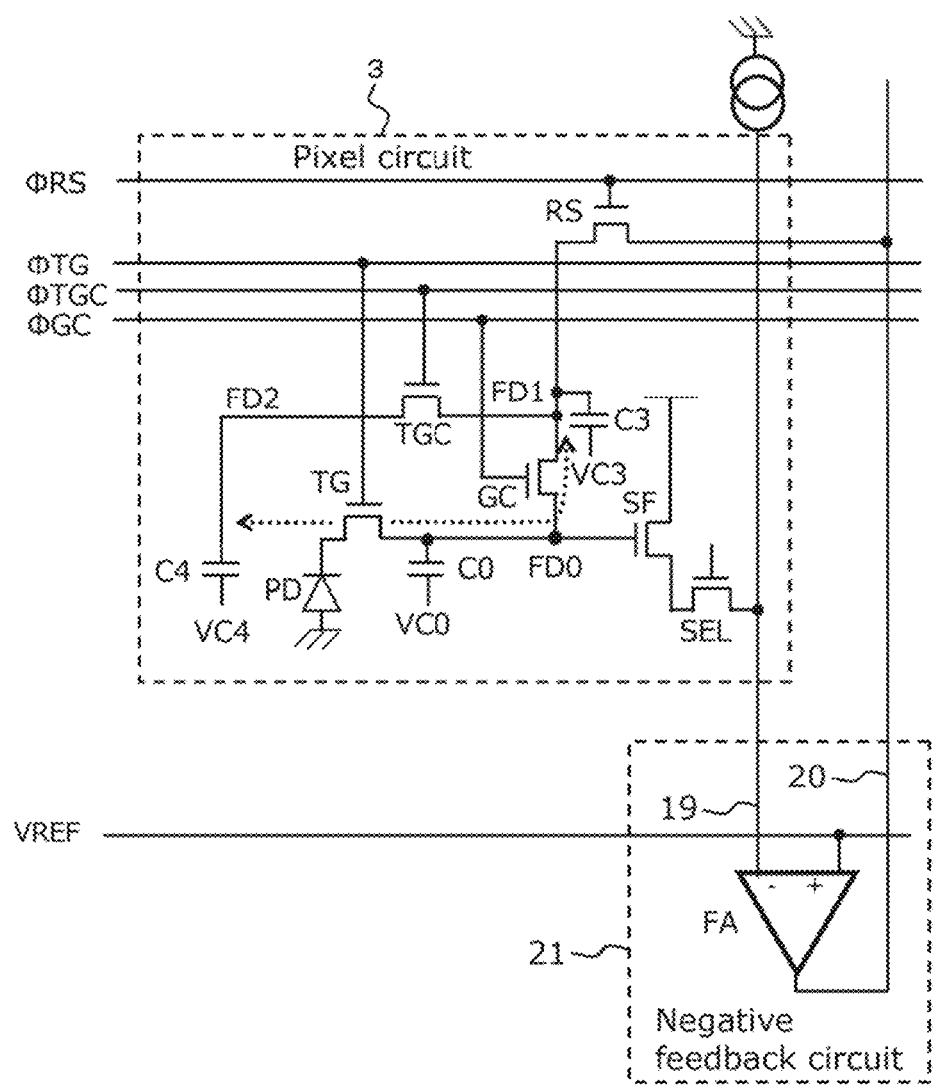
FIG. 1B illustrates a second configuration example of the main part of a solid-state imaging apparatus according to one aspect of the present disclosure.

FIG. 1B illustrates the second configuration example of the main part of solid-state imaging apparatus 100 according to one aspect of the present disclosure. The second configuration example in FIG. 1B differs from the first configuration example in FIG. 1A in regard to the circuit configuration inside pixel circuit 3. The following will focus on this point of difference.

This pixel circuit 3 differs from FIG. 1A in that first storage capacitive element C3, first transistor GC, second storage capacitive element C4, and second transistor TGC are provided instead of first storage capacitive element C1, first transistor GC1, second storage capacitive element C2, and second transistor GC2.

The signal charge that overflows from photodiode PD during exposure is transferred to and held by second storage capacitive element C4, as shown by the dotted arrow line in FIG. 1B. Here, there is no overflow element OF between photodiode PD and second storage capacitive element C4, but the potential structure allows charge to be transferred in this path.

Reset transistor RS can perform three different resets depending on how first transistor GC and second transistor TGC are controlled. More specifically, reset transistor RS can (i) reset floating diffusion layer FD0, first storage capacitive element C3, and second storage capacitive element C4, (ii) reset first storage capacitive element C3 and second storage capacitive element C4, and (iii) reset first storage capacitive element C3.

The charge that overflows at charge storage FD0 when transfer transistor TG is on is transferred to and held by first storage capacitive element C3, as shown by the dotted arrow line in FIG. 1B.

First transistor GC is a transistor that controls the connection between charge storage FD0 and first storage capacitive element C3. First transistor GC takes on and off states as a switching element.

The signal charge that overflows from photodiode PD during exposure is transferred to and held by second storage capacitive element C4, as shown by the dotted arrow line in FIG. 1B.

Second transistor TGC is a gain control transistor that controls the connection between first storage capacitive element C3 and second storage capacitive element C4. Second transistor TGC takes on and off states as a switching element.

In the second configuration example of solid-state imaging apparatus 100 illustrated in FIG. 1B, solid-state imaging apparatus 100 includes a storage circuit group, for overflow, that includes a plurality of stages (m≥1) of storage circuits in series for holding the signal charge that overflows from photodiode PD. A single storage circuit is made up of a switching element and a storage capacitive element. In the example in FIG. 1B, m=2. The first stage storage circuit is made up of first transistor GC and first storage capacitive element C3. The second stage storage circuit is made up of second transistor TGC and second storage capacitive element C4. The pair of transfer transistor TG and charge storage FD0 may be regarded as the $0^{th}$ stage storage circuit.

With this second configuration example, it possible to achieve both dynamic range extension and SN improvement.

[0.3 Third Configuration Example of the Solid-State Imaging Apparatus]

Next, the third configuration example will be given. The third configuration example is a configuration in which an overflow element has been added to the second configuration example that includes two stages (m=2) of the storage circuits connected in the horizontal direction.

Figure 1C:
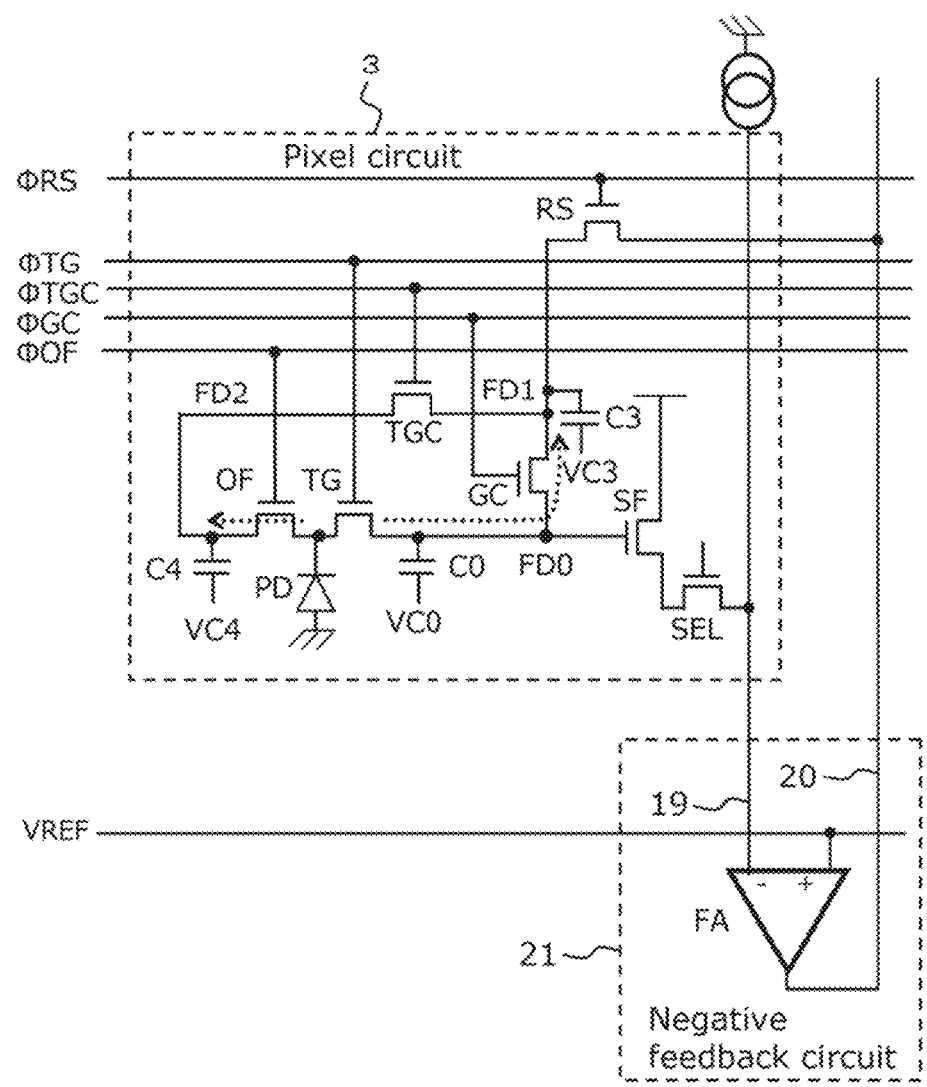
FIG. 1C illustrates a third configuration example of the main part of a solid-state imaging apparatus according to one aspect of the present disclosure.

FIG. 1C illustrates the third configuration example of the main part of solid-state imaging apparatus 100 according to one aspect of the present disclosure. The third configuration example in FIG. 1C differs from the second configuration example in FIG. 1B in that overflow element OF is added to pixel circuit 3. The following will focus on this difference.

Overflow element OF causes signal the signal charge that overflows from photodiode PD to be transferred to first storage capacitive element C4 via overflow element OF, instead of being transferred to second storage capacitive element C3 via transfer transistor TG.

The signal charge that overflows at first storage capacitive element C4 is further transferred to second storage capacitive element C3 via first transistor TGC.

In the third configuration example in FIG. 1C, as shown by the dotted arrow line, the direction in which the signal charge that overflows from photodiode PD flows is the same as in second configuration example in FIG. 1B. In the third configuration example, the signal charge that overflows from photodiode PD is stored in storage capacitor C4 without passing through charge storage FD0, thus reducing the dark current component more so than in the first configuration example. Moreover, the level of overflow can be controlled more so than in the second configuration example due to the inclusion of overflow element OF.

In the first to third configuration examples described above, for example, the following operations are performed: imaging a low-illuminance frame, imaging a high-illuminance frame, imaging a composite of a low-illuminance frame and a high-illuminance frame, and imaging a composite of a low-illuminance frame, a medium-illuminance frame, and a high-illuminance frame.

Here, a low-illuminance frame is, for example, a frame that is imaged with all m stages of storage circuits turned off, and is suitable for low-illuminance environments. A high-illuminance frame is, for example, a frame that is imaged with all m stages of storage circuits turned on, and is suitable for high illuminance environments. A medium-illuminance frame is, for example, a frame that is imaged with some of the m stages of storage circuits turned on, and is suitable for medium-illuminance environments. Note that high illuminance, medium illuminance, and low illuminance do not refer to absolute illuminances, but rather relative illuminances.

For example, in low-illuminance frame imaging, the signal charge fully transferred from photodiode PD to charge storage FD0 is read out by CDS (=signal component−reset component) by imaging while all m stages of storage circuits are in turned off.

In high-illuminance frame imaging, the reset noise of the storage capacitive elements can be reduced by negative feedback via feedback amplifier FA while applying a gradually sloped signal to the control voltage of the switching element in each storage circuit to transition the storage circuits from on to off. Furthermore, the signal from photodiode PD and the signal from one or more storage capacitive elements can be read out and combined.

This makes it possible to further extend the dynamic range by combining the signal components read out in the low-illuminance region with the signal components read out in the high-illuminance region, or by selectively reading out the appropriate frames according to the illuminance.

According to this method, only the signal charge transferred from photodiode PD to charge storage FD0 is used in low-illuminance frame imaging, which allows the gain in the pixel, i.e., the gain to convert the signal charge into a voltage by amplification transistor SF, to be higher, and the voltage (pixel signal) corresponding to the amount of light received can be increased relative to noise generated by amplification transistor SF and the analog circuit. Stated differently, for dark subjects, the camera is able to output high quality images with high signal-to-noise ratio (SN).

On the other hand, in high-illuminance frame imaging, the m stages of storage circuits are used to lower the intra-pixel gain, thereby extending the dynamic range and enabling high-illuminance light reception. Furthermore, negative feedback circuit 21 can improve SN. Stated differently, for bright subjects, the camera accurately reproduces tones according to the subject, enabling output of images with no whitewash.

In view of this, as a technique to extend the dynamic range and improve SN, the inventors have developed a configuration in which storage capacitive elements (C1, C2, C3, and C4) are added to photodiode PD, and which additionally includes switching elements (transistors (GC1, GC2, GC)) and a stored charge transfer element (TGC)}. This configuration enables dynamic range extension and SN improvement. Moreover, although the SN usually deteriorates when the signal level is increased, the deterioration of the SN can be inhibited even when the signal level is increased with this configuration.

Furthermore, since the three low-illuminance, medium-illuminance, and high-illuminance frames for wide dynamic range (WDR) can be generated by the exact same pixels at the exact same time, false color, coloring, and blurring can be eliminated.

This can be extended to the global shutter method in addition to the rolling shutter method, as well. This enables application as a time of flight (TOF) type ranging apparatus.

Moreover, the number of frames for WDR conversion can be extended from 2 or 3 to 5, depending on the number of stages, m, of the storage circuits, to extend the dynamic range.

In general, it is very difficult to use highly saturated pixels, but the technique according to the present embodiment allows the saturation level to be extended with the limited capacitance of photodiode PD. To expand the storage capacitance in the storage circuit, the voltage amplitude between the capacitor terminals may be expanded, and to expand the capacitance surface area in a limited number of pixel cells, a three-dimensional or multi-layered semiconductor chip that constitutes the solid-state imaging apparatus may be implemented.

For example, the storage capacitive elements of the storage circuits may be placed on the semiconductor chip including the pixels or on the semiconductor chip including the logic circuits. Even when placed on the semiconductor chip including the pixels, the storage capacitive elements may be formed in the top layer or the bottom layer of the metal layers.

In addition, the contacts or plug parts for connecting wiring of the storage capacitive elements to the silicon substrate can be sources of dark characteristics (dark current, noise, fixed pattern noise). Pixel chips and logic chips are also sources of dark characteristics (dark current, noise, fixed pattern noise) in TSV connections and hybrid connections.

These noises, when superimposed on the reset noise, can be reduced by negative feedback circuit 21, resulting in lower noise than when negative feedback circuit 21 is not provided.

As described above, a solid-state imaging apparatus according to one aspect of the present disclosure includes pixel circuit 3 and negative feedback circuit 21. Pixel circuit 3 includes: photodiode PD; charge storage FD0; transfer transistor TG that transfers a signal charge generated by photodiode PD to charge storage FD0; amplification transistor SF that outputs a pixel signal corresponding to a signal charge in charge storage FD0; first reset transistor RS that resets charge storage FD0; first storage capacitive element C1/C4; and first transistor GC1/TGC that controls a connection between charge storage FD0 and first storage capacitive element C1/C4. Negative feedback circuit 21 negatively feeds back a feedback signal according to a reset output of amplification transistor SF to charge storage FD0 via first reset transistor RS.

With this, the dynamic range can be extended by extending and switching the amount of saturated signal charge by first storage capacitive element C1 or C4 and first transistor GC1/TGC. Additionally, negative feedback circuit 21 can reset charge storage FD0 and first storage capacitive element C1 or C4 to the reset level, thus inhibiting kTC noise at reset and improving image quality.

A gate voltage of transfer transistor TG and a gate voltage of first transistor GC1/TGC may be set to enable a signal charge that overflows from photodiode PD to be transferred to first storage capacitive element C1/C4 during exposure.

With this, the overflowing signal charge can be used to generate a pixel signal for low illuminance and a pixel signal for high illuminance, making it easy to extend the dynamic range.

First transistor GC1 may be connected between first reset transistor RS and charge storage FD0, in series with first reset transistor RS, and first storage capacitive element C1 may be connected to a connection point of first reset transistor RS and first transistor GC1.

With this, at least one stage of the storage circuits shown in the first configuration example of FIG. 1A can be provided in the vertical direction. For example, it is possible to selectively or simultaneously generate a pixel signal for the low-illuminance frame and a pixel signal for the high-illuminance frame.

First transistor TGC may connect (i) a connection point of first reset transistor RS and charge storage FD0 and (ii) first storage capacitive element C4.

With this, at least one stage of the storage circuits shown in the second configuration example of FIG. 1C can be provided in the horizontal direction. For example, it is possible to selectively or simultaneously generate a pixel signal for the low-illuminance frame and a pixel signal for the high-illuminance frame.

The solid-state imaging apparatus may further include overflow element OF that transfers a signal charge that overflows from photodiode PD to first storage capacitive element C4.

With this, at least one stage of the storage circuits shown in the third configuration example of FIG. 1C can be provided in the horizontal direction, and overflow element OF can be provided. For example, the overflowing signal charge can be transferred to the first storage capacitive element without passing through charge storage FD0, thus inhibiting noise due to dark current, etc.

The solid-state imaging apparatus may further include: second transistor GC2 inserted in series between first reset transistor RS and first transistor GC1; and second storage capacitive element C2 that is connected to (i) a connection point of first reset transistor RS and second transistor GC2 and (ii) charge storage FD0 via first transistor GC1 and second transistor GC2.

With this, at least two stages of the storage circuits shown in the first configuration example of FIG. 1A can be provided in the vertical direction. For example, it is possible to selectively or simultaneously generate a pixel signal for the low-illuminance frame, a pixel signal for the medium-illuminance frame, and a pixel signal for the high-illuminance frame. The dynamic range can also be extended by combining the low-illuminance frame and the medium-illuminance frame.

The solid-state imaging apparatus may further include: second transistor GC inserted between (i) a connection point of first reset transistor RS and first transistor TGC and (ii) charge storage FD0; and second storage capacitive element C3 connected to the connection point of first reset transistor RS and first transistor TGC.

With this, at least two stages of the storage circuits shown in the second and third configuration examples of FIG. 1B and FIG. 1C can be provided in the horizontal direction. For example, it is possible to selectively or simultaneously generate a pixel signal for the low-illuminance frame, a pixel signal for the medium-illuminance frame, and a pixel signal for the high-illuminance frame. The dynamic range can also be extended by combining the low-illuminance frame and the medium-illuminance frame.

Pixel circuit 3 may include a plurality of pixel circuits 3. The solid-state imaging apparatus may further include: a drive unit that drives simultaneous exposure of the plurality of pixel circuits 3; and a control circuit that reads out the pixel signals of the plurality of pixel circuits 3 by scanning the plurality of pixel circuits 3.

This makes it possible to use a global shutter that exposes all pixels simultaneously, extend the dynamic range, and inhibit kTC noise during reset, thereby improving image quality.

The solid-state imaging apparatus may further include a control circuit that reads out, from pixel circuit 3, a first pixel signal for forming a first frame and a second pixel signal for forming a second frame. The second frame may be a frame for a higher illuminance level than the first frame. The first pixel signal may correspond to a signal charge transferred to charge storage FD0 from photodiode PD. The second pixel signal may correspond to a signal charge transferred to and mixed in charge storage FD0 and first storage capacitive element C1 from photodiode PD. The first pixel signal and the second pixel signal may be based on signal charges generated in a same exposure period by photodiode PD in a single pixel circuit 3.

With this, the first frame for low-illuminance and the second frame for high-illuminance can be generated simultaneously within one frame period, thereby extending the dynamic range and inhibiting kTC noise at reset.

The solid-state imaging apparatus may further include a control circuit that reads out, from pixel circuit 3, a first pixel signal for forming a first frame, a second pixel signal for forming a second frame, and a third pixel signal for forming a third frame. The second frame may be a frame for a higher illuminance level than the first frame. The third frame may be a frame for a higher illuminance level than the second frame. The first pixel signal may correspond to a signal charge transferred to charge storage FD0 from photodiode PD. The second pixel signal may correspond to a signal charge transferred to and mixed in charge storage FD0 and first storage capacitive element C1 from photodiode PD. The third pixel signal may correspond to a signal charge transferred to and mixed in charge storage FD0, first storage capacitive element C1, and second storage capacitive element C2 from photodiode PD. The first pixel signal, the second pixel signal, and the third pixel signal may be based on signal charges generated in a same exposure period by photodiode PD in a single pixel circuit 3.

With this, the first frame for low-illuminance, the second frame for medium-illuminance, and the third frame for high-illuminance can be simultaneously exposed and generated within one frame period, thereby further extending the dynamic range and inhibiting noise at reset.

The solid-state imaging apparatus may further include a control circuit that reads out, from pixel circuit 3, a first pixel signal forming a first frame, a second pixel signal forming a second frame, and a third pixel signal forming a third frame. The second frame may be a frame for a higher illuminance level than the first frame. The third frame may be a frame for a higher illuminance level than the second frame. The first pixel signal may correspond to a signal charge transferred to charge storage FD0 from photodiode PD. The second pixel signal may correspond to a signal charge transferred to and mixed in charge storage FD0 and first storage capacitive element C1 from photodiode PD. The third pixel signal may correspond to a signal charge transferred to and mixed in charge storage FD0, first storage capacitive element C1, and second storage capacitive element C2 from photodiode PD. The first pixel signal, the second pixel signal, and the third pixel signal may be based on signal charges generated in different exposure periods by photodiode PD in a single pixel circuit 3.

With this, the first frame for low-illuminance, the second frame for medium-illuminance, and the third frame for high-illuminance can be exposed at different times and generated within one frame period, thereby further extending the dynamic range and inhibiting kTC noise at reset.

A control signal input into at least first reset transistor RS among first reset transistor RS and the first transistor may include a sloped voltage waveform that gradually transitions from an on state to an off state.

With this, reset noise can be further inhibited by resetting via negative feedback circuit 21.

Pixel circuit 3 may include a plurality of pixel circuits 3. The solid-state imaging apparatus may further include: a measurement unit configured to measure reset noise levels of pixel circuits 3 located in a predetermined area among the plurality of pixel circuits 3; and a determination unit configured to determine an incline for the sloped voltage waveform that reduces variation in the reset noise levels, based on a measurement result of the measurement unit.

With this, the reset noise level can be inhibited in accordance with the characteristics of the solid-state imaging apparatus.

The measurement unit may be configured to measure the reset levels while varying the incline of the sloped voltage waveform, per row of the pixel circuits located in the predetermined area. The determination unit may be configured to determine an optimal incline for the sloped voltage waveform based on the variation per row of the pixel circuits located in the predetermined area.

With this, the reset noise level can be appropriately inhibited even if the characteristics of the solid-state imaging apparatus change.

Pixel circuit 3 may include a plurality of pixel circuits 3 arranged in a matrix. Negative feedback circuit 21 may be provided per column of the plurality of pixel circuits 3 or per pixel circuit 3.

Each negative feedback circuit 21 may include a first feedback amplifier that outputs the feedback signal to first reset transistors RS of the plurality of pixel circuits 3 located in the column to which negative feedback circuit 21 corresponds or to first reset transistor RS in pixel circuit 3 to which negative feedback circuit 21 corresponds.

With this, negative feedback circuit 21 can be provided per column of pixel circuits 3 or per pixel circuit 3.

Negative feedback circuit 21 may be provided per column of the plurality of pixel circuits 3. Each of the plurality of pixel circuits 3 may include second reset transistor RS2 that resets charge storage FD0. Each negative feedback circuit 21 may further include a second feedback amplifier that outputs the feedback signal to second reset transistors RS2 of the plurality of pixel circuits 3 located in the column to which negative feedback circuit 21 corresponds.

This configuration allows for resetting of two different pixel rows by negative feedback circuit 21. For example, a reset can be performed on one row at the start of exposure and a reset can be performed on another row at readout.

The solid-state imaging apparatus may include a first semiconductor chip and a second semiconductor chip that are bonded together. The first semiconductor chip may include photodiodes PD and first storage capacitive elements C1/C4 of the plurality of pixel circuits. The second semiconductor chip may include the first feedback amplifiers provided per column of the plurality of pixel circuits or per pixel circuit.

With this, the degree of freedom in designing the layout of negative feedback circuit 21 and first storage capacitive element C1 can be increased, parasitic resistance and parasitic capacitance can be relatively reduced because negative feedback can be applied per column or per pixel, high frequency noise can also be reduced by increasing speed, and reset noise can be reduced.

Negative feedback circuit 21 may be provided per pixel circuit. The solid-state imaging apparatus may include a first semiconductor chip and a second semiconductor chip that are bonded together. The first semiconductor chip may include photodiodes PD of the plurality of pixel circuits. The second semiconductor chip may include: the first feedback amplifiers provided per pixel circuit; and first storage capacitive elements C1/C4 of the plurality of pixel circuits.

With this, negative feedback is applied per pixel to speed up the process, so high-frequency noise can also be reduced, and reset noise can be significantly reduced.

The solid-state imaging apparatus may include a first semiconductor chip and a second semiconductor chip that are bonded together. The first semiconductor chip may include photodiodes PD and charge storages FD0 of the plurality of pixel circuits. The second semiconductor chip may include first storage capacitive elements C1/C4 of the plurality of pixel circuits.

With this, photodiode PD and storage capacitive element C can be provided per pixel on the first semiconductor chip, and a storage capacitive element can be provided per pixel on the second semiconductor chip, whereby the dynamic range can be significantly extended.

An imaging apparatus according to one aspect of the present disclosure includes the solid-state imaging apparatus described above. The imaging apparatus corresponds to at least one of a view system for transport equipment, an advanced driver assistance systems (ADAS) sensing system for transport equipment, or an autonomous driving sensing system for transport equipment. The imaging apparatus is provided at at least one of a front, a surround-view location, a side-view location, a rear-view location, or a rear-view mirror of the transport equipment.

Hereinafter, a solid-state imaging apparatus according to embodiments for implementing the present disclosure will be described with reference to the drawings.

Embodiment 1A

First, an example of a configuration of the solid-state imaging apparatus according to the present embodiment will be given. Embodiment 1A describes in detail an example of a configuration including one stage of the storage circuits in the vertical direction in the first configuration example illustrated in FIG. 1A.

[1A.1 Configuration Example of Solid-State Imaging Apparatus 100]

Figure 2:
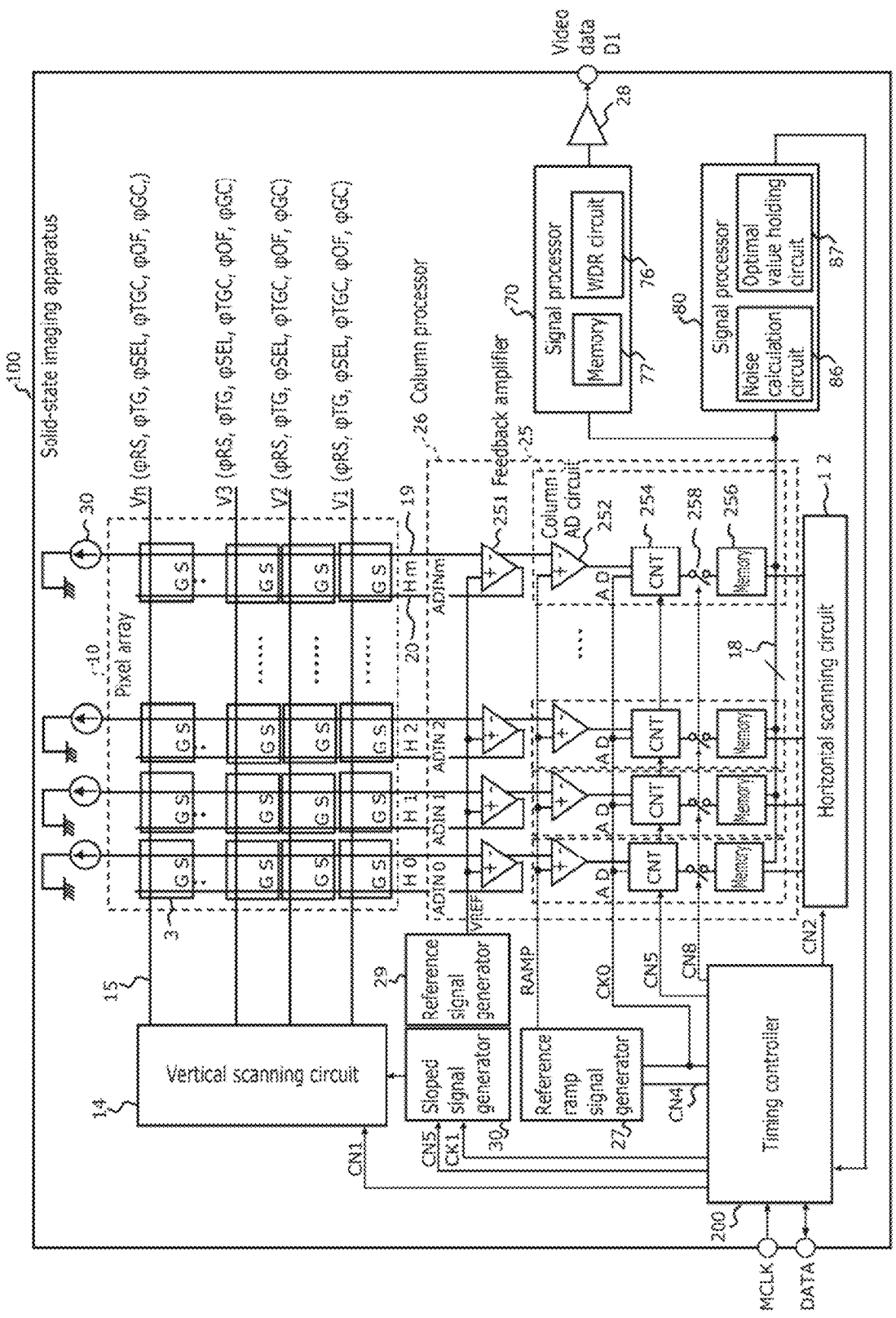
FIG. 2 is a block diagram illustrating an example of a configuration of a solid-state imaging apparatus according to Embodiment 1A.

FIG. 2 is a block diagram illustrating an example of a configuration of solid-state imaging apparatus 100 according to Embodiment 1A.

Solid-state imaging apparatus 100 illustrated in FIG. 2 includes pixel array 10, horizontal scanning circuit 12, vertical scanning circuit 14, a plurality of vertical signal lines 19, timing controller 200, column processor 26, reference ramp signal generator 27, output circuit 28, and signal processors 70 and 80. Solid-state imaging apparatus 100 further includes a MCLK terminal that receives an input of a master clock signal from an external component, a DATA terminal for transmitting and receiving a command or data to and from an external component, and a D1 terminal for transmitting video data to an external component, and still further includes other sorts of terminals to which power supply voltage and ground voltage are supplied.

Pixel array 10 includes a plurality of pixel circuits 3 arranged in a matrix. In FIG. 2, the plurality of pixel circuits 3 are arranged in n rows and m columns. Each pixel circuit 3 includes a high-sensitivity pixel, storage capacitive elements (C1, C2, C3, C4), an overflow element (OF), gain control elements (GC1, GC2, GC), a stored charge transfer element (TGC), and a charge transfer element (TG). Note than an overflow element is also referred to as an overflow gate.

Horizontal scanning circuit 12 outputs AD converted pixel signals to signal processors 70 and 80 via a horizontal signal line by sequentially scanning memories 256 in the plurality of column AD circuits 25. This scanning may be performed in the order of alignment of column AD circuits 25.

Vertical scanning circuit 14 scans, row by row, horizontal scan line groups (also referred to as a "row control line groups") 15 provided per row of pixel circuits 3 in pixel array 10. With this, vertical scanning circuit 14 selects pixel circuits 3 row by row, and concurrently outputs pixel signals from pixel circuits 3 belonging to the selected row to m vertical signal lines 19. The number of horizontal scan line groups 15 provided is the same as the number of pixel circuits 3 provided.

In FIG. 2, n horizontal scan line groups 15 (V1, V2, . . . , Vn in FIG. 2) are provided. Each horizontal scan line group 15 includes reset control line φRS, stored charge transfer control line φ(TG)C, gain control lines φGC1, φGC2, and φGC, selection control line φSEL, and overflow control line φOF.

Vertical signal line 19 is provided per column of pixel circuits 3 in pixel array 10, and transmits pixel signals from pixel circuits 3 belonging to the selected row to column AD circuit 25. In FIG. 2, there are m+1 vertical signal lines 19 (H0, . . . , Hm). In FIG. 2, there are m+1 ADC input lines (ADIN0, . . . , ADINm).

Sloped signal generator 30 determines the slope of the control signals of at least reset control line φRS among reset control line φRS, stored charge transfer control line φTGC, gain control lines φGC1, φGC2, and φGC, and overflow control line φOF, which are lines corresponding to the control signal switching elements of the pixel circuit, and generates an optimal sloped signal to reduce reset noise.

Vertical scanning circuit 14 is supplied with output signals supplied from sloped signal generator 30 as pixel control signals (V1, V2, . . . , Vn) based on control signal group CN1.

Timing controller 200 controls the entire solid-state imaging apparatus 100 by generating various groups of control signals. The various groups of control signals include control signal groups CN1, CN2, CN4, CN5, and CN8, and counter clock signals CK0 and CK1. For example, timing controller 200 receives master clock MCLK via a terminal, generates various internal clocks, and controls horizontal scanning circuit 12 and vertical scanning circuit 14 and the like.

Column processor 26 includes a column AD circuit 25 for each column. Each column AD circuit 25 AD converts pixel signals from vertical signal line 19.

Each column AD circuit 25 includes feedback amplifier FA, voltage comparator 252, counter 254, and memory 256.

Feedback amplifier FA compares the analog pixel signal from vertical signal line 19 with reference signal VREF generated by reference signal generator 29, and when reference signal VREF is larger than the pixel signal, for example, the output signal is fed back to the pixel to increase the pixel signal, thus realizing negative feedback circuit 21. Feedback lines 20, which are the plurality of output signal lines of feedback amplifier FA, comprise (m+1) lines, which is equal to the number of columns (H0, . . . , Hm) in FIG. 2, or, alternatively, 2×(m+1) lines, i.e., twice that number. Note that when the shutter and reset are performed at the same time, (m+1) lines are used, and when the shutter and reset are not performed at the same time, 2×(m+1) lines are used.

Voltage comparator 252 compares an analog pixel signal from vertical signal line 19 and reference signal RAMP that is generated by reference ramp signal generator 27 and includes a ramp waveform (i.e., a triangular wave), and, for example, when the former exceeds the latter, inverts an output signal indicating the comparison result.

Counter 254 counts time from a start of a change in the triangular wave of reference signal RAMP until the output signal from voltage comparator 252 is inverted. Since the time until the inversion is defined according to the value of an analog pixel signal, the count value is a value of a digitized pixel signal.

Memory 256 holds count values of counter 254, i.e., digital pixel signals.

Reference ramp signal generator 27 generates reference signal RAMP including a triangular wave, and outputs reference signal RAMP to the positive input terminal of voltage comparator 252 in each column AD circuit 25.

Output circuit 28 outputs digital pixel signals to video data terminal D1.

Signal processor 70 includes WDR circuit 76, and consists of memory 77, low-illuminance signal generating circuit 71, medium-illuminance signal generating circuit 72, high-illuminance signal generating circuit 73, and WDR circuit 76.

Figure 3:
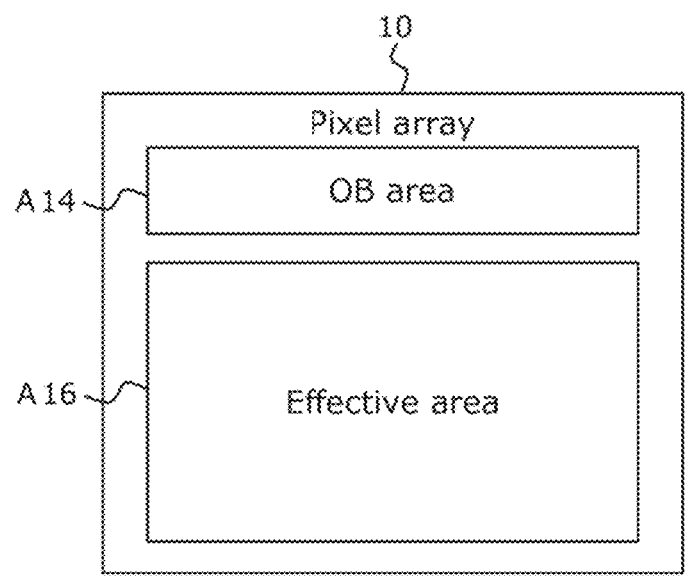
FIG. 3 illustrates a plurality of areas within a pixel array.
Figure 4:
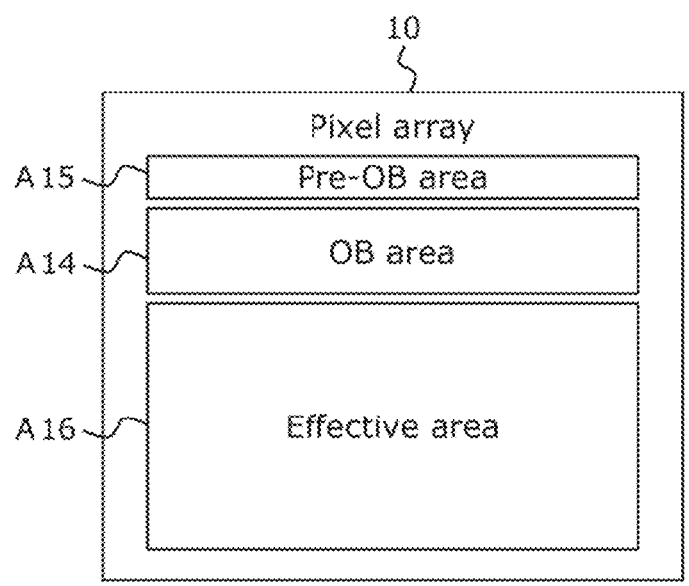
FIG. 4 illustrates a plurality of areas within a pixel array.

Signal processor 80 detects the reset noise in the reset noise detection area using noise calculation circuit 86 and holds the optimal value of the noise in optimal value holding circuit 87. The reset noise detection area may be, for example, OB area A14 in FIG. 3 or pre-OB area A15 in FIG. 4. FIG. 3 and FIG. 4 illustrate a plurality of areas within pixel array 10. OB area A14 is the area that includes the optical black pixels. Pre-OB area A15 is an area of the OB area designated for specific applications such as reset noise detection. Effective area A16 is the area that includes pixel circuits 3 for forming an image through imaging. As soon as the search in the reset noise detection area is completed, signal processor 80 sends the optimal value to the timing control circuit, and sloped signal generator 30 reads out the signal at the optimal slope voltage in effective area A16 in FIG. 3, and in OB area A14 and effective area A16 in FIG. 4.

With this, signal processor 70 and signal processor 80 both extend the dynamic range and improve SN.

Vertical scanning circuit 14, reference ramp signal generator 27, reference signal generator 29, sloped signal generator 30, and feedback line 20 may collectively be referred to as a drive unit. Column processor 26 and horizontal scanning circuit 12 may collectively be referred to as a control unit. Noise calculation circuit 86 may be referred to as a measurement unit. Optimal value holding circuit 87 may be referred to as a determination unit.

[1A.2 Configuration Example of Pixel Circuit]

Next, an example of a configuration of pixel circuit 3 will be described.

Figure 5:
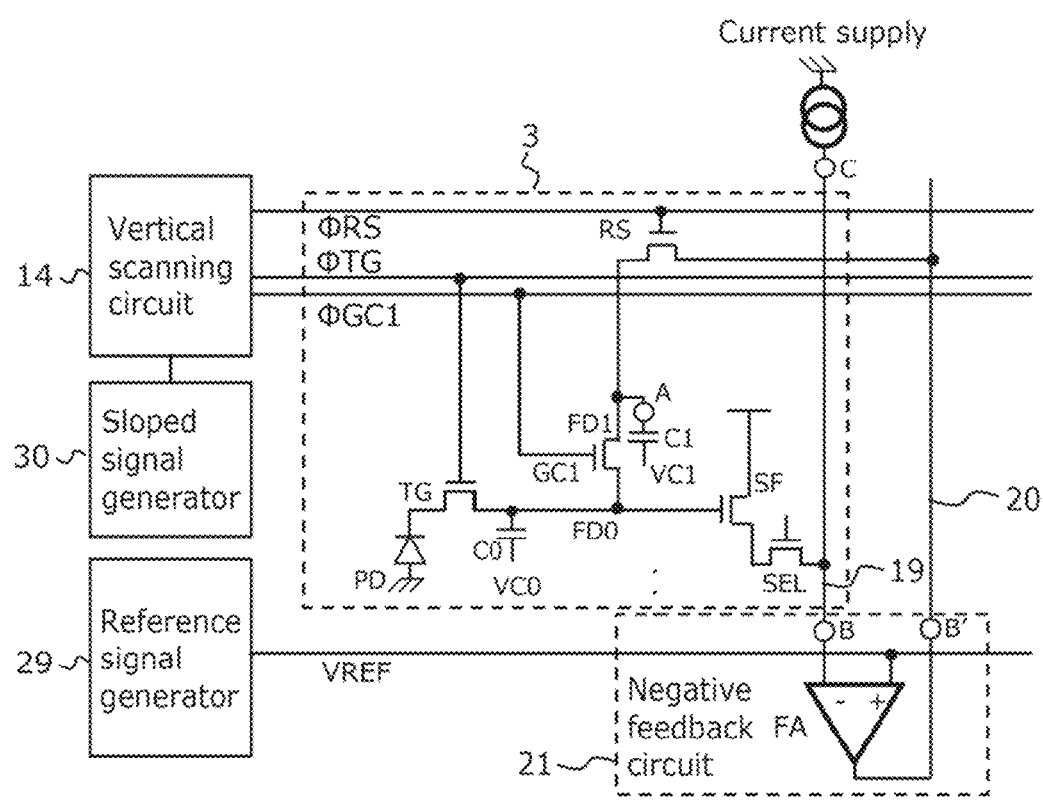
FIG. 5 illustrates a circuit example of a pixel circuit and a negative feedback circuit according to Embodiment 1A.

FIG. 5 illustrates a circuit example of pixel circuit 3 and negative feedback circuit 21 according to Embodiment 1A. Pixel circuit 3 in FIG. 5 includes photodiode PD, transfer transistor TG, storage capacitive element C1 and floating diffusion layer FD1, parasitic capacitor C0 and floating diffusion layer FD0, reset transistor RS, gain control transistor GC1, amplification transistor SF, and selection transistor SEL.

Horizontal scan line group 15 includes reset control line φRS, readout control line φTG, gain control line φGC1, and selection control line φSEL.

Photodiode PD is a photoelectric conversion element, such as a photodiode, that performs photoelectric conversion at a given sensitivity, that is to say, generates a charge according to the amount of light received.

Moreover, capacitor C0 connected to floating diffusion layer FD0 holds a signal charge (for example, electrons) transferred from photodiode PD, converts the held signal charge into voltage, and supplies the voltage resulting from the conversion to the gate of amplification transistor SF Practically speaking, the capacitance of floating diffusion layer FD0 is not only the capacitance of floating diffusion layer FD0 itself, but also includes the gate capacitance of amplification transistor SF, the gate-drain capacitance of amplification transistor SF, and the floating capacitance of the source wiring of gain control transistor GC1 when gain control transistor GC1 is off.

The transfer transistor (TG) is a switching transistor that turns on and off according to readout control signal φTG. When readout control signal φTG is high-level, transfer transistor TG transfers the signal charge resulting from photoelectric conversion by photodiode PD to floating diffusion layer FD.

When the signal charge resulting from photoelectric conversion by photodiode PD overflows, the signal charge is transferred to storage capacitive element C1 by adjusting the control voltage of gain control element GC1. Alternatively, the signal charge is transferred when the signal charge exceeds a preset potential.

Reset transistor RS is a switching transistor that turns on and off according to reset control signal φRS. When reset control signal φRS is high-level, reset transistor RS sets, via gain control transistor GC1, the power supply voltage applied to the drain as the reset level in floating diffusion layer FD0. In other words, when reset control signal φRS is high-level, reset transistor RS resets floating diffusion layer FD0 to the reset level.

Gain control transistor GC1 electrically disconnects or connects floating diffusion layer FD0 and floating diffusion layer FD1 according to gain control signal φGC1. This changes the conversion gain at which the signal charge in floating diffusion layer FD0 is converted into voltage. In other words, in the transferring of the signal charge from photodiode PD to floating diffusion layer FD0, if gain control transistor GC1 is turned off, the conversion gain of floating diffusion layer FD0 can be increased further, equal to C0. Conversely, if gain control transistor GC1 is turned on, floating diffusion layers FD0 and FD1 are connected and the conversion gain can be lower, equal to C0+C1.

Amplification transistor SF forms a source follower paired together with load current supply 30 connected to vertical signal line 19, and outputs the voltage of the gate, that is to say, the voltage of floating diffusion layer FD0 to vertical signal line 19 as an analog pixel signal.

Selection transistor SEL is a switching transistor that turns on and off according to selection control signal φSEL. Selection transistor SEL electrically connects the source of amplification transistor SF and vertical signal line 19 when selection control signal φSEL is high-level.

[1A.3 Configuration Example of Stacked Structure BSI of Pixel Circuit and Negative Feedback Circuit]

When the pixel cells are reduced in size or when the dynamic range is extended, the area of the aperture of photodiode PD can be increased by providing the MIM capacitor or MOS capacitor on the wiring layer side of the photodiode, which is on the opposite side of the light receiving side. It is also possible to provide the trench capacitor inside the cell.

Solid-state imaging apparatus 100 can also be configured as a stacked-structure back-side illumination image sensor.

Figure 6A:
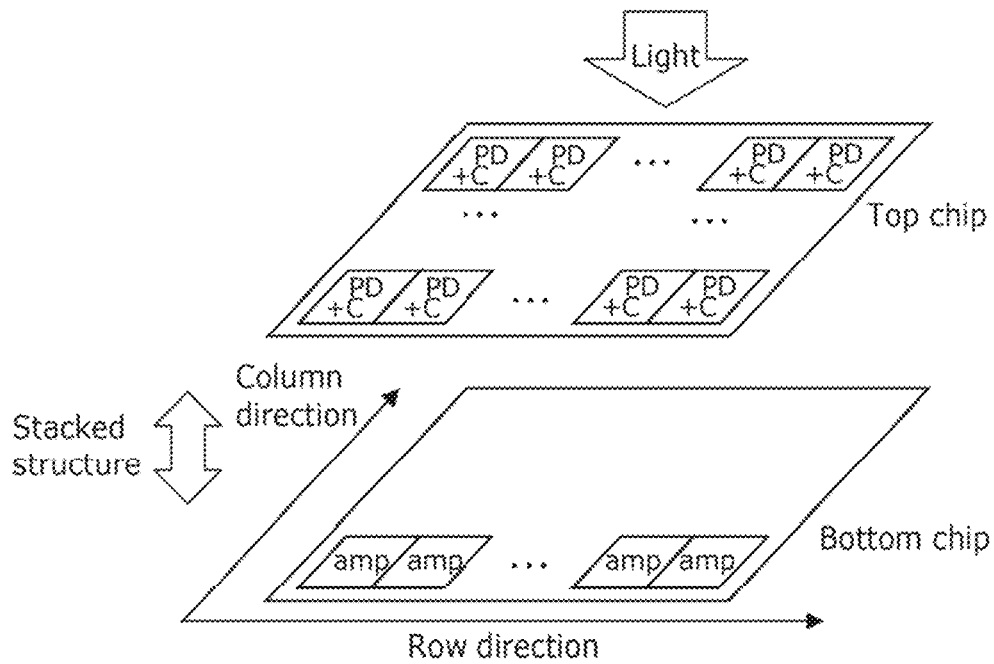
FIG. 6A illustrates an example of a solid-state imaging apparatus according to Embodiment 1A configured as a stacked-structure back-side illumination image sensor.

FIG. 6A illustrates an example of the solid-state imaging apparatus according to Embodiment 1A configured as a stacked-structure back-side illumination image sensor. The solid-state imaging apparatus in FIG. 6A includes a first semiconductor chip and a second semiconductor chip that are bonded together. The first semiconductor chip and the second semiconductor chip are bonded to each other on their respective wiring-layer-side surfaces. In FIG. 6A, PD indicates photodiode PD, C indicates first storage capacitive element C1, and amp indicates feedback amplifier FA.

The first semiconductor chip is labeled as the top chip in FIG. 6A, and includes the main part of solid-state imaging apparatus 100 as a back-side illumination CMOS image sensor. This first semiconductor chip includes photodiode PD and first storage capacitive element C1 of each pixel circuit 3.

The second semiconductor chip is labeled as the bottom chip in FIG. 6A, and includes main the logic circuits, such as signal processors 70 and 80. This second semiconductor chip includes feedback amplifiers FA respectively corresponding to the columns of pixel circuit 3.

In such a solid-state imaging apparatus 100, each pixel is mounted on the top chip as a stacked structure BSI type CIS, and feedback amplifiers FA respectively corresponding to the pixel columns are mounted on the bottom chip. Stated differently, the PD and storage capacitive element C can be provided per pixel on the top chip, and a feedback amplifier can be provided per column on the bottom chip, whereby negative feedback can be applied to each column, so parasitic resistance and parasitic capacitance can be relatively reduced to increase speed, which reduces high frequency noise and reduces reset noise, Specifically, the top and bottom chips may include connection points A, B, and B' illustrated in FIG. 5.

Figure 6B:
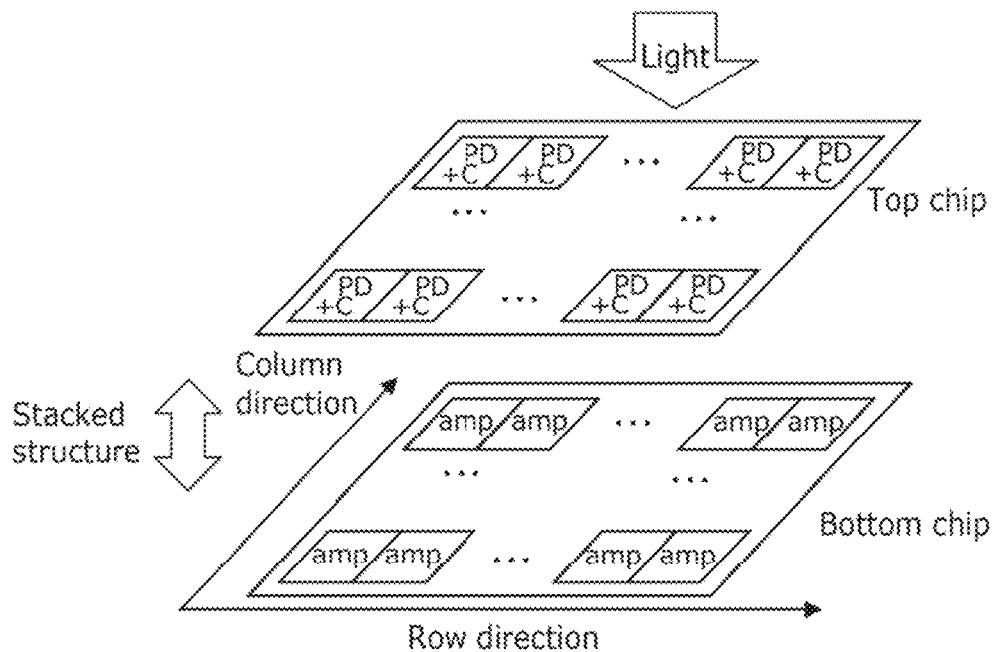
FIG. 6B illustrates an example of the solid-state imaging apparatus according to Embodiment 1A configured as a stacked-structure back-side illumination image sensor.

FIG. 6B illustrates an example of the solid-state imaging apparatus according to Embodiment 1A configured as a stacked-structure back-side illumination image sensor. This is a stacked structure BSI type CIS, with each pixel provided on the pixel chip (top chip) and the feedback amplifiers respectively corresponding to the pixels provided on the logic chip (bottom chip), Photodiode PD and storage capacitive element C can be provided per pixel on the top chip, and a feedback amplifier can be provided per pixel on the bottom chip, whereby negative feedback can be applied per pixel, so parasitic resistance and parasitic capacitance can be reduced to increase speed, which reduces high frequency noise and significantly reduces reset noise.

Figure 6C:
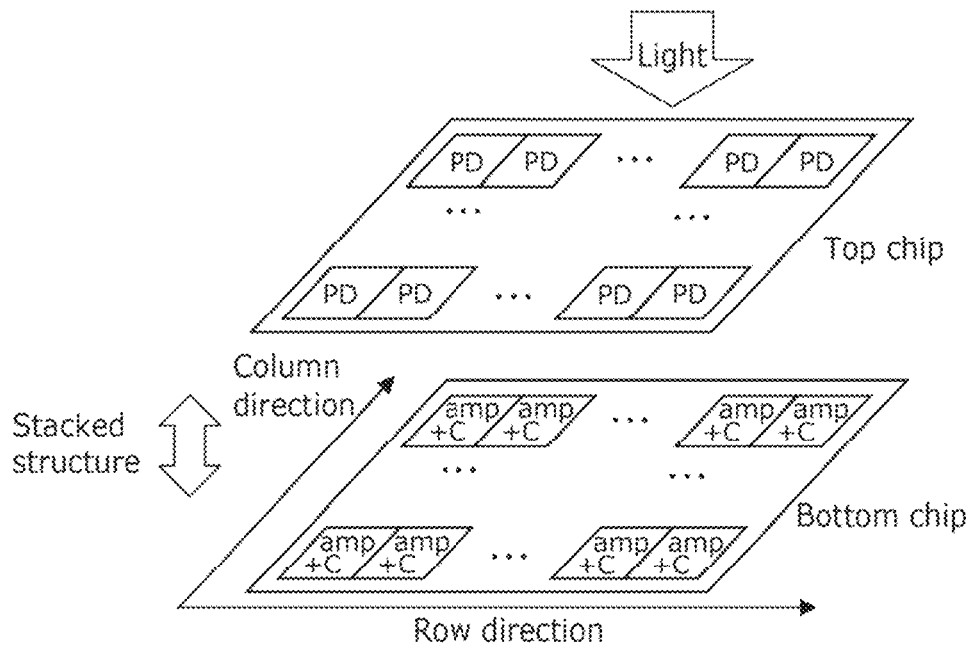
FIG. 6C illustrates an example of the solid-state imaging apparatus according to Embodiment 1A configured as a stacked-structure back-side illumination image sensor.

FIG. 6C illustrates an example of the solid-state imaging apparatus according to Embodiment 1A configured as a stacked-structure back-side illumination image sensor. This is a stacked structure BSI type CIS, with each pixel provided on the pixel chip (top chip) and the feedback amplifiers, which respectively correspond the pixels, provided on the logic chip (bottom chip), Photodiode PD can be provided per pixel on the top chip, and storage capacitive element C and a feedback amplifier can be provided per pixel on the bottom chip, whereby negative feedback can be applied per pixel to increase speed, so high frequency noise can be reduced and reset noise can be significantly reduced.

Figure 6D:
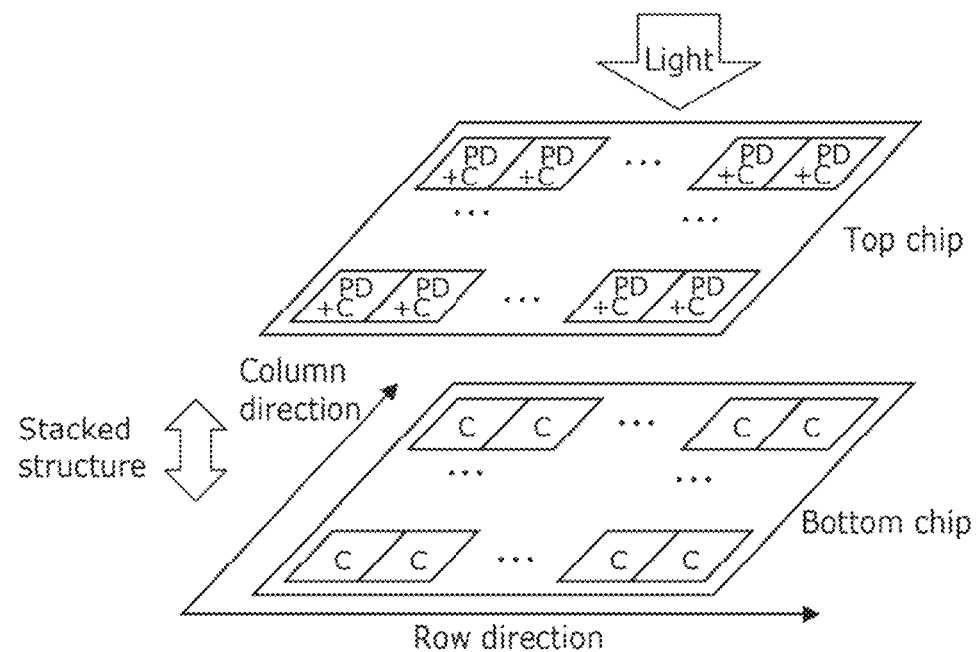
FIG. 6D illustrates an example of the solid-state imaging apparatus according to Embodiment 1A configured as a stacked-structure back-side illumination image sensor.

FIG. 6D illustrates an example of the solid-state imaging apparatus according to Embodiment 1A configured as a stacked-structure back-side illumination image sensor. This is a stacked structure BSI type CIS, with each pixel provided on the pixel chip (top chip) and the feedback amplifiers, which respectively correspond to the pixels, provided on the logic chip (bottom chip). Photodiode PD and storage capacitive element C can be provided per pixel on the top chip, and storage capacitive element C can be provided per pixel on the bottom chip, whereby the dynamic range can be greatly extended.

[1A.4 Improvement of Characteristics by Use of a Poly Plug]

Next, an example of a configuration of a pixel when solid-state imaging apparatus 100 is configured as a stacked-structure back-side illumination image sensor like in FIG. 6A through FIG. 6D will be described.

Typically, when a usual contact is used for the contact between wiring at one end of a metal insulator metal (MIM) capacitor or a metal oxide semiconductor (MOS) capacitor and the substrate, damage is incurred when forming the contact part, and dark characteristics (dark current, noise, fixed pattern noise) become problematic.

However, when a poly plug that employs polysilicon wiring rather than metal wiring is used for the wiring that connects one end of the MIM capacitor or the MOS capacitor to the substrate, damage to the connection part is reduced, and dark characteristics (dark current, noise, fixed pattern noise) can be inhibited.

Furthermore, when a poly plug (polysilicon contact (n)) that employs polysilicon wiring rather than metal wiring is used for the wiring that connects one end of the gate wiring of amplification transistor SF to the substrate, damage to the connection part is reduced, and dark characteristics (dark current, noise, fixed pattern noise) can be inhibited.

Moreover, when the potentials (A, B, C) of the plug parts that accumulate signal charge (negative charge) and form the capacitive element are high relative to GND, dark characteristics (dark current, noise, fixed pattern noise) increase. Accordingly, it is possible to improve dark characteristics by setting the potential (VC1) on the reverse side of storage capacitive element C1 to an intermediate potential during exposure. Here, the intermediate potential is a potential between GND and the pixel potential.

[1A.5 HCG Readout Operation Example]

Next, the high control gain (HCG) readout operation in solid-state imaging apparatus 100 illustrated in FIG. 5 will be described. The HCG readout operation is an imaging operation that does not use first storage capacitive element C1 by turning first transistor GC1 off, and uses only floating diffusion layer FD0 for signal charge accumulation to increase the conversion gain of amplification transistor SF. Hence, the HCG operation is a high-sensitivity imaging operation, suitable for imaging in low-illuminance environments. In correlated double sampling (CDS) in the HCG readout operation, the signal level is read out after the reset level of the analog pixel signal is read out. In CDS, the difference between the reset level and the signal level is taken.

Figure 7:
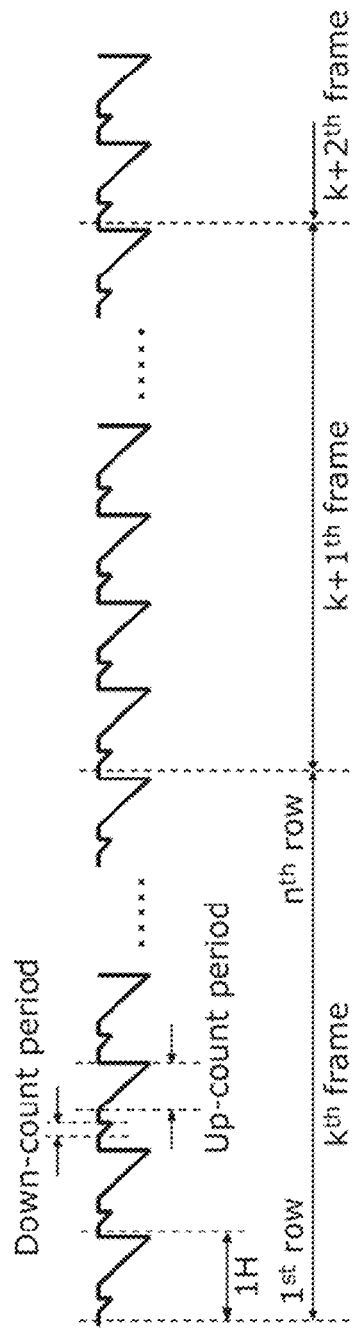
FIG. 7 is a time chart illustrating n exposure operations of the solid-state imaging apparatus by the HCG readout operation in Embodiment 1A.

FIG. 7 is a time chart illustrating n exposure operations of solid-state imaging apparatus 100 by the HCG readout operation in Embodiment 1A.

The down-count period is a period for AD converting the level of the reset component among the analog pixel signal output from amplification transistor SR The time from the start of the down-count period (start of the change in the triangular wave) until the output of voltage comparator 252 inverts is down-counted by counter 254. This count value is the result of the AD conversion of reset component Vrst of the analog pixel signal.

The up-count period is a period for AD converting the level of the data component among the analog pixel signal output from amplification transistor SF. The time from the start of the up-count period (start of the change in the triangular wave) until the output of voltage comparator 252 inverts is up-counted by the counter. This up-counting converts the data component of the analog pixel signal to a digital value.

Since this up-counting takes the down-count value indicating reset the component as an initial value, the count value at the end of the up-count period represents the result of correlated double sampling (CDS) that subtracts the reset component from the data component. In other words, the count value at the end of the up-count period is a digital value representing the signal component. In this way, column AD circuits 25 exclude variations which result in error, such as clock skew and counter delay between columns, and reads only the true signal component, that is, performs digital CDS.

[1A.6 LCG Readout Operation Example]

Next, the low control gain (LCG) readout operation in 100 in FIG. 5 will be described. The LCG readout operation is an imaging operation that uses first storage capacitive element C1 by turning first transistor GC1 on, and uses both floating diffusion layer FD0 and first storage capacitive element C1 for signal charge accumulation to lower the conversion gain of amplification transistor SF. Hence, the LCG operation is a low-sensitivity imaging operation, suitable for imaging in high-illuminance environments. In correlated double sampling (CDS) in LCG readout operation, the reset level of feedback amplifier FA is read out after reading out the signal level. Stated differently, in the LCG readout operation, the read order of the signal level and reset level is the opposite of that in the HCG readout operation.

Figures 8, 9:
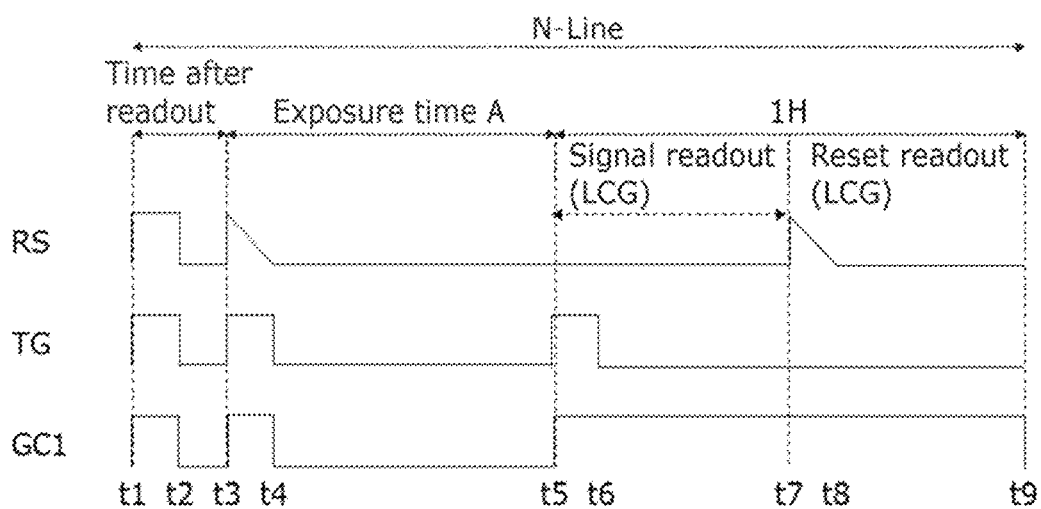
FIG. 8 illustrates a timing example for the LCG readout operation in Embodiment 1A.
FIG. 9 illustrates the readout sequence for CDS in the LCG readout operation.

FIG. 8 illustrates the readout order for one frame in the LCG readout operation in Embodiment 1A.

The gain that converts the signal charge at floating diffusion layer FD1 into voltage can be selectively switched between a high gain and a low gain according to the on/off state of gain control transistor GC1.

In the HCG readout operation, the normal CDS order in 1H is HCG (R: reset component) to HCG (S: signal component), as illustrated in FIG. 7. This transition results in the readout of signal charge from photodiode PD to floating diffusion layer FD0 with a high conversion gain in floating diffusion layer FD0. Since this transition is a normal CDS, the reset noise can be canceled to zero.

FIG. 9 illustrates the readout sequence of pixel signals for CDS in the LCG readout operation. In LCG, the sequence is LCG (S: signal component) to LCG (R: reset component). This transition results in the readout of signal charge from storage capacitive element C0 and storage capacitive element C1 to floating diffusion layer FD0 with a low conversion gain in floating diffusion layer FD1.

This transition can remove DC-like offsets (reset coupling), but pixel reset noise cannot be canceled and will remain as kTC noise.

Next, the terms long exposure, middle exposure, and short exposure will be defined. Conventionally, a long exposure has an extended exposure time for use in low-illuminance conditions, a middle exposure has a medium exposure time for use in medium-illuminance conditions, and a short exposure has a short exposure time for use in high-illuminance conditions. In the present specification, when the same exposure time is used for all frames, the terms long, middle, and short do not mean different lengths of exposure time, but are defined as follows: long exposure is for low illuminance, middle exposure is for medium illuminance, and short exposure is for high illuminance.

The kTC noise in this short exposure (high illuminance) appears on the low illuminance side. For example, this is illustrated in FIG. 18B. Here, kTC noise is expressed as $\sqrt{(kTC)}$ at charge amount. Settings must be configured so that this noise is sufficiently smaller than the signal level. Accordingly, at the boundary between the short exposure (high illuminance) and the long exposure (low illuminance), it is necessary to sufficiently improve the latter SN more than the former SN.

[1A.7 Configuration and Operation Examples of Negative Feedback Circuit]

For high illuminance, the maximum subject illuminance can be increased while reducing reset noise by turning on storage capacitive element C and using negative feedback circuit 21. In general, when the control voltage of the reset transistor and the control voltage of gain control element GC1 are turned off abruptly, reset noise (kTC noise) is generated in the storage capacitive element (C1) and capacitor C0.

A measure to address this generation of reset noise is to provide switching elements between photodiode PD and the storage capacitive element (C1), connect one end of the switching elements to the negative input terminal of the feedback amplifier through the vertical signal line via the SF element, and connect feedback line 20, which is the feedback output signal, to the other end of the switching elements, to form negative feedback. Here, the switching elements are the reset transistor and gain control element GC1. A DC reference voltage VREF is connected to the positive input terminal of the feedback amplifier.

A control signal input to at least first reset transistor RS among first transistor GC1, transfer transistor TG, and first reset transistor RS includes a sloped voltage waveform that gradually transitions from an on state to an off state. Hereinafter, signals with a sloped voltage waveform are referred to as sloped signals.

Figure 10A:
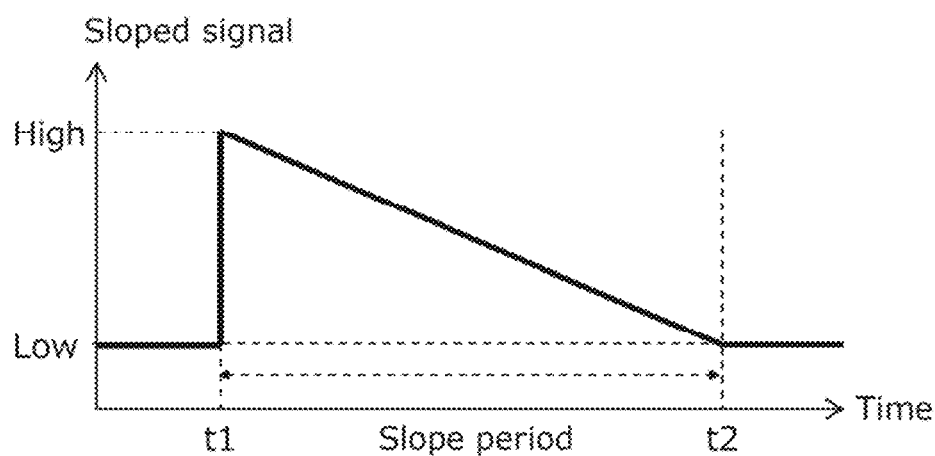
FIG. 10A illustrates the waveform of a sloped signal.
Figure 10B:
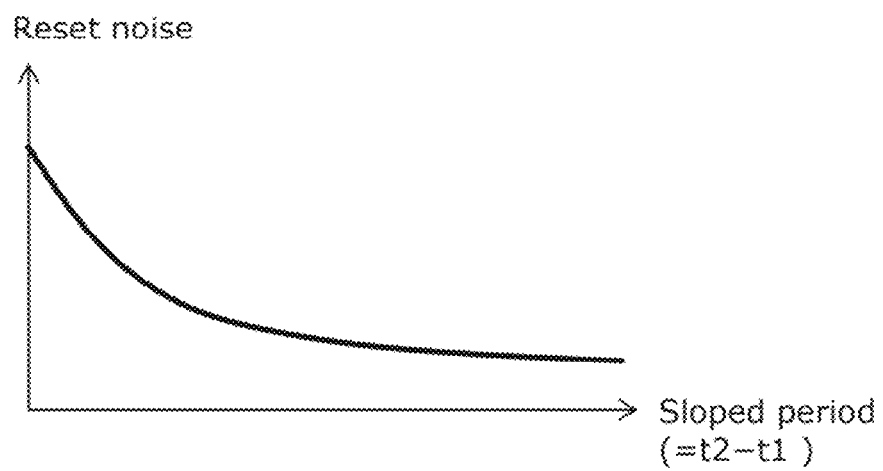
FIG. 10B illustrates the relationship between slope period and reset noise level.

FIG. 10A illustrates the waveform of the sloped signal. As illustrated in FIG. 10A, the control voltage of the reset transistor and the control voltage of gain control element GC1 change gradually as a sloped signal. FIG. 10B illustrates the relationship between the slope period and reset noise level. As illustrated in FIG. 10B, the reset noise is an asymptote while negative feedback is applied, as the input voltage at one end of the feedback amplifier asymptotically approaches reference voltage VREF. As both potentials come closer together, the rate of change of the voltage in the FD portion decreases. When both potentials are equal, the potential of the FD portion is fixed.

Lastly, the operation can be completed by disconnecting the feedback amplifier from negative feedback circuit 21.

Lastly, by subtracting the reset component from the signal component, the reset noise can be reduced and the signal can be extracted with good SN.

Here, the bandwidth of the feedback amplifier is preferably wider than the bandwidth of the pixel portion, in which case the high-frequency component of the reset noise can be canceled efficiently.

With this, in the present embodiment, it possible to achieve both dynamic range extension and SN improvement.

FIG. 11 illustrates timing related to the accumulating of charges of photodiode PD and storage capacitive element C1. Photodiode PD is continuously exposed during the 1V period (1 vertical synchronization period) and the charge amount is Q0. The signal of storage capacitive element C1 that receives this charge that overflows from photodiode PD is Q1. Q0 and Q1 are exposed at exactly the same time.

In the rolling shutter method, resetting is done row by row via row scanning. The exposure is then started and the exposure time is expressed as T_Q0=T_Q1. Next, the charge from the photodiode is read out row by row to storage capacitive element C1. The signal charge of storage capacitive element C1 is then read out using the rolling shutter method.

A timing example for the HCG readout operation in which storage capacitive element C1 is not connected is identical to FIG. 7.

A timing example for the LCD readout operation in which storage capacitive element C1 is connected is illustrated in FIG. 8.

First, photodiode PD, FD0, and FD1 are reset at time t1 to t2, and the process waits for the exposure to start. Then, from time t3 to t4, the shutter operates to start the exposure. The exposure time ends at time t5. From time t5 to t6, the signal charge stored in the photodiode is transferred to FD0 and FD1 by the transfer signal (TG). The signal components are read out between times t6 and t7. Next, a reset operation is performed between times t7 and t8. The reset components are read out between times t8 and t9.

Here, reset noise is generated during the shutter period at times t3 and t4, and during the reset period at times t7 and t8. Therefore, during this period, negative feedback circuit 21 works to gradually turn off reset control signal RS, thereby reducing the reset noise. This shows how a sloped signal is applied to the reset transistor (RS) at this time.

Conventionally, photodiode PD and storage capacitive element C were provided, but no transfer element Tr or switching element was provided, so it was not possible to selectively switch between low-illuminance and high-illuminance capturing.

In the present embodiment, in low-illuminance capturing, the signal charge stored in the photodiode is transferred by transfer element Tr, correlated double sampled (CDS), and read out, so reset noise can be completely eliminated. On the other hand, in high-illuminance capturing, the signal charge stored in the photodiode and the signal charge stored in the storage capacitive element are read out through the switching element, but since the reset noise is reduced by negative feedback circuit 21 during shutter and reset, the SN can be improved significantly. This makes it possible to selectively switch between low-illuminance and high-illuminance capturing.

[1A.8 Circuit Example of Sloped Signal as Control Signal for Switching Element]

The present embodiment includes photodiode PD, a transfer transistor (TG), and negative feedback circuit 21. Negative feedback circuit 21 includes a reset transistor, switching elements, storage capacitive elements (C1, C2), amplification transistor SF, and a feedback amplifier. The switching elements include gain control elements (GC1, GC2, GC) and a stored charge transfer element (TGC). An overflow element (OF) is also provided.

The control signals for the reset transistor and the switching elements are applied as gradually sloped signals during shutter and readout as described above to gradually turn the reset transistor and the switching elements off, which enables negative feedback circuit 21 to operate well and reduces reset noise. For example, FIG. 10A illustrates how this sloped signal gradually transitions to an off state during the slope period. FIG. 10B illustrates the relationship between this slope period and reset noise level. FIG. 10B shows that the noise level drops rapidly in the beginning of the slope period, but after some time, the noise level gradually decreases.

The issue here is variations arising from processing, supply voltage, and temperature of the switching elements. Variations due to processing can be fixed to the optimal value in outgoing inspection. On the other hand, variations due to supply voltage and temperature vary with actual operating conditions and must be compensated for during operation.

FIG. 2 illustrates a circuit as a measure to address this. Sloped signal generator 30 has a built-in DAC circuit, and first generates sloped signal using clock CK1 and control signal CN5 transmitted from timing controller 200. The sloped signal is configured so that when reading the noise components in the reset noise detection area (GB area A14 of FIG. 3 or pre-OB area A15 of FIG. 4), the signal is read every 1H by control signal CN5 and the incline of the slope is determined by clock CK1.

Figure 12A:
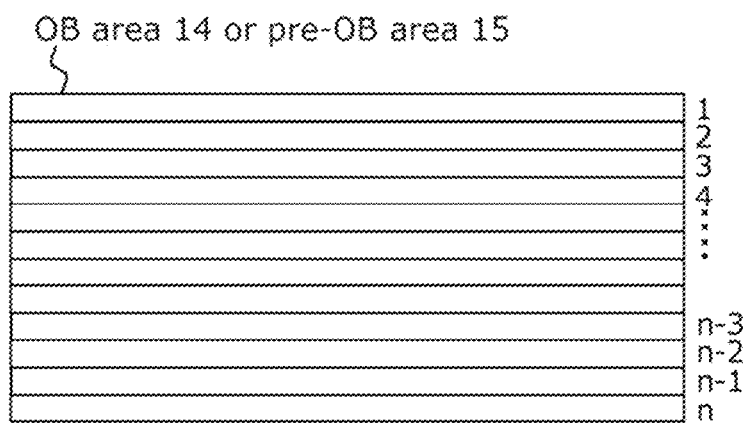
FIG. 12A illustrates horizontal scan lines, the units for calculating the reset noise variation.
Figure 12B:
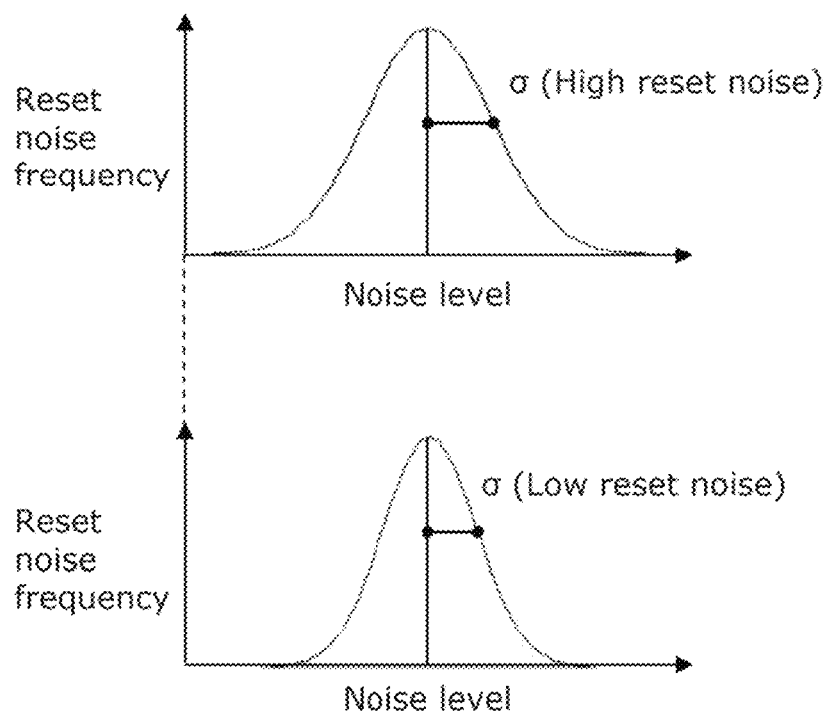
FIG. 12B illustrates the variation (standard deviation) in the reset noise per horizontal scan line.

FIG. 12A illustrates horizontal scan lines, the units for calculating the reset noise variation. FIG. 12B illustrates the variation (standard deviation) in the reset noise per horizontal scan line. The readout signal in the reset noise detection area is normally distributed in FIG. 12B for each 1H (i.e., one horizontal scan) illustrated in FIG. 12A by noise calculation circuit 86 in signal processor 80, the σ (standard deviation) of the noise signal is calculated, and the most optimal slope setting is held in optimal value holding circuit 87.

Here, the optimal value is the value when the signal readout in the reset noise detection area is at its minimum, or when the difference before and after the slope of the sloped voltage changes is less than or equal to a desired value.

The inclines of the slopes of the reset transistors functioning as switching elements, overflow element OF or gain control elements GC1 and GC2, and stored charge transfer element TGC, may be selected sequentially by operating each optimal value every 1H, or may be selected sequentially by operating all optimal values every 1H.

For each row of pixel circuits in the reset noise detection area as a predetermined area, signal processor 80 measures the reset level while varying the slope of the voltage waveform, calculates the variation σ (standard deviation), and determines the optimal incline for slope of the voltage waveform based on the variation per row of pixel circuits in the predetermined area.

[1A.9 Operation Example of Sloped Signal as Control Signal for Switching Element]

In the present embodiment, OB area A14 of FIG. 3 or the pre-OB area of FIG. 4 is used to generate the sloped signal.

Figure 13:
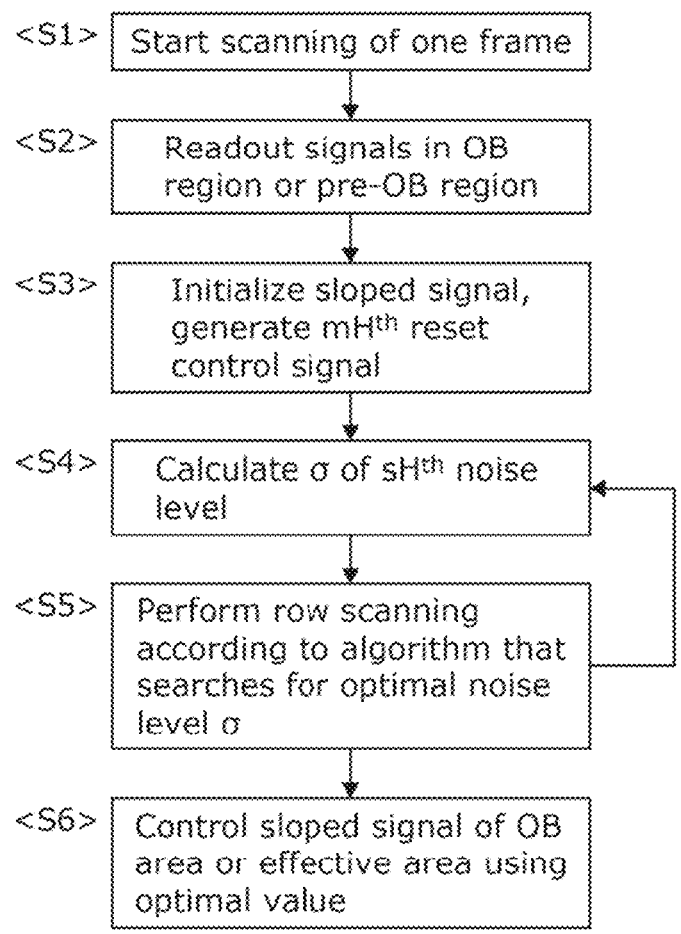
FIG. 13 is a flowchart showing an example of a process for generating a sloped signal.

FIG. 13 is a flowchart showing an example of a process for generating a sloped signal. First, scanning of the first line of one frame is started in <S1>, and the signals in OB area A14 or pre-OB area A15 are read out in <S2>. The sloped signal is initialized and the mH$^{th}$ reset control signal is generated in <S3>. Like illustrated in FIG. 12B, the standard deviation σ of the sH$^{th}$ reset noise is calculated in <S4>. In <S5>, row scanning is performed according to an algorithm that searches for the optimal noise level σ, and the operations in <S4> and <S5> are repeated to select the sloped signal with the optimal noise level σ. In <S6>, the signal of effective area A16 in FIG. 3 or pre-OB area A15 in FIG. 4 is controlled by the above selected signal. Here, mH$^{th}$ and sH$^{th}$ values are set by the algorithm.

Figure 14:
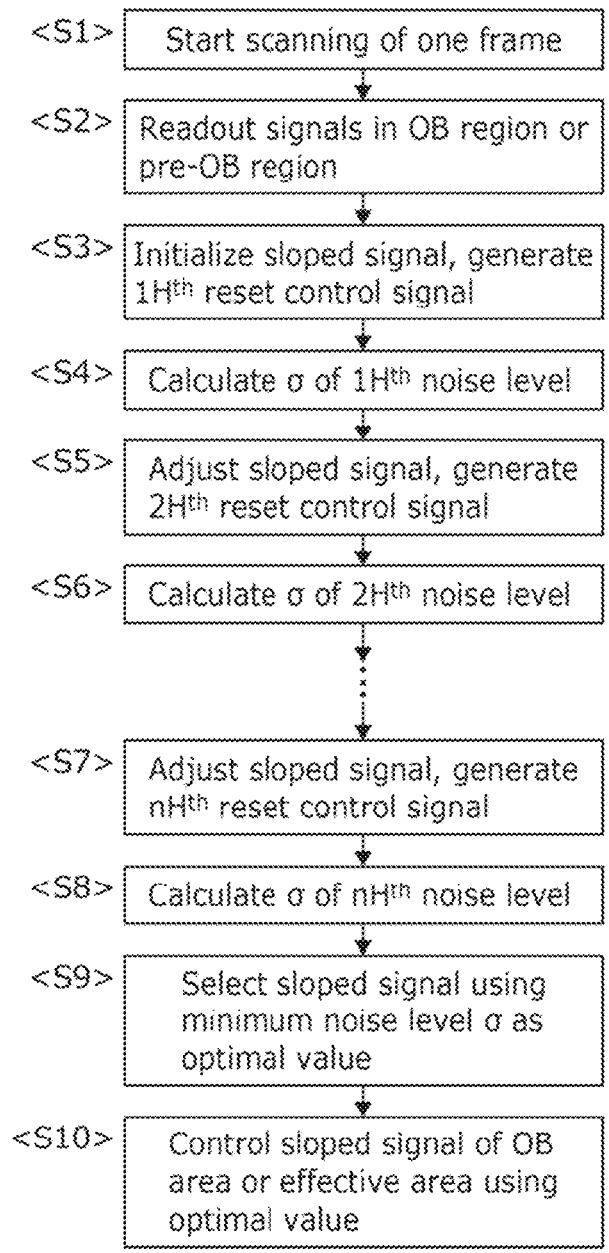
FIG. 14 is a flowchart showing another example of a process for generating a sloped signal.

FIG. 14 is a flowchart showing another example of a process for generating a sloped signal. First, scanning of the first line of one frame is started in <S1>, and the signals in OB area A14 or pre-OB area A15 are read out in <S2>. The sloped signal is initialized and the 1H$^{th}$ reset control signal is generated in <S3>. Like illustrated in FIG. 12B, the standard deviation σ of the 1H$^{th}$ reset noise is calculated in <S4>. The sloped signal is adjusted and the 2H$^{th}$ reset control signal is generated in <S5>. The sloped signal is initialized and the 1H$^{th}$ reset control signal is generated in <S6>. In this way, the standard deviation σ of the reset noise is calculated for each 1H. The sloped signal is adjusted and the nH$^{th}$ reset control signal is generated in <S7>. The sloped signal is initialized and the nH$^{th}$ reset control signal is generated in <S8>. Then, the slope at which the standard deviation σ of the reset noise is the optimal value is determined in <S9>. In <S10>, the signal of effective area A16 in FIG. 3 or pre-OB area A15 in FIG. 4 is controlled by the above selected signal.

Figure 15:
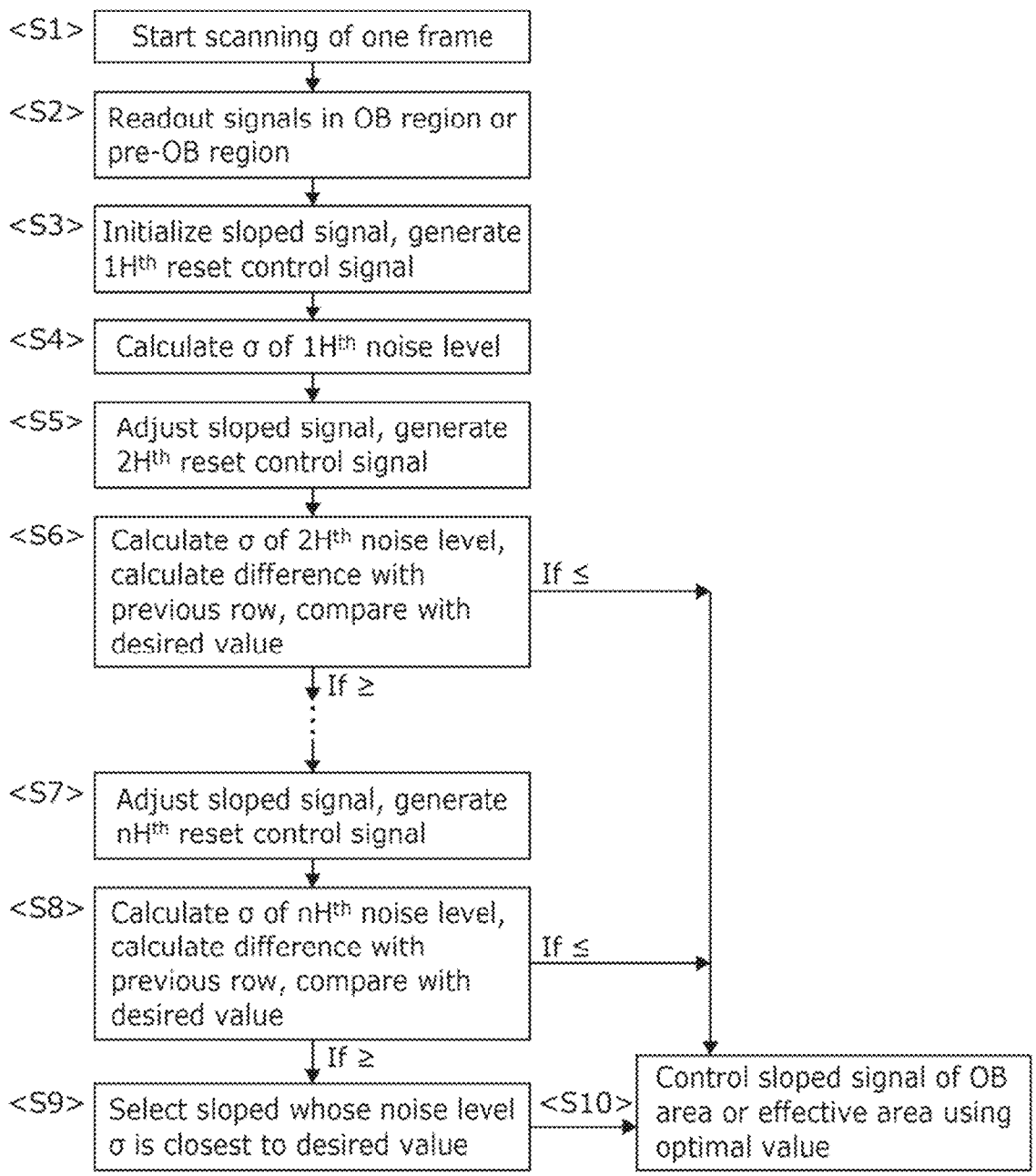
FIG. 15 is a flowchart showing yet another example of a process for generating a sloped signal.

FIG. 15 is a flowchart showing yet another example of a process for generating a sloped signal. First, scanning of the first line of one frame is started in <S1>, and the signals in OB area A14 or pre-OB area A15 are read out in <S2>. The sloped signal is initialized and the 1H$^{th}$ reset control signal is generated in <S3>. Like illustrated in FIG. 12B, the standard deviation σ of the 1H$^{th}$ reset noise is calculated in <S4>. The sloped signal is adjusted and the 2H$^{th}$ reset control signal is generated in <S5>.

In <S6>, the σ of the 2H$^{th}$ noise level is calculated, the difference with the previous row is calculated and compared with a desired value. When the difference is less than or equal to the desired value, that value is considered to be the optimal value, and in <S10>, the signal of the effective area in FIG. 3 or the OB area in FIG. 4 is controlled by the above selected signal.

Conversely, when the difference is greater than or equal to the desired value, this operation is repeated until nH thereafter.

The sloped signal is adjusted and the nH$^{th}$ reset control signal is generated in <S7>.

In <S8>, the σ of the nH$^{th}$ noise level is calculated, the difference with the previous row is calculated and compared with a desired value. When the difference is less than or equal to the desired value, that value is considered to be the optimal value, and in <S10>, the signal of the effective area in FIG. 3 or the OB area in FIG. 4 is controlled by the above selected signal.

Conversely, when the difference is greater or equal to than the desired value, the sloped signal whose noise level σ is closest to the desired value is selected in <S9>. In <S10>, the signal of effective area A16 in FIG. 3 or pre-OB area A15 in FIG. 4 is controlled by the above selected signal.

In FIG. 3, OB area A14 is the reset noise detection area. The advantage is that it is possible to inhibit an increase in chip surface area. However, the gain of OB area A14 is set to the same value as the gain of effective area A16, so when the gain is low, the accuracy detection is inferior. A great amount of reset noise may also be superimposed in the OB area.

In FIG. 4, pre-OB area A15 is the reset noise detection area. The advantage is that the reset noise can always be detected with a constant measurement gain, so if the gain is increased, the accuracy will increase and the detection will be more stable.

[1A.10 Dynamic Range Extension]

The feature of the present embodiment is that frames are not combined to achieve a WDR; instead the dynamic range is extended by selecting low-illuminance regions or high-illuminance regions depending on the illuminance conditions.

For example, using low-illuminance frames at night and using high-illuminance frames during the day is conceivable. Alternatively, a low-illuminance frame or a high-illuminance frame may be selected depending on the illuminance at that moment while driving.

Here, two frames—the long and short frames—are exposed at exactly the same timing and the exact same pixels are used, which inhibits false colors, coloring, and blurring.

Figure 16:
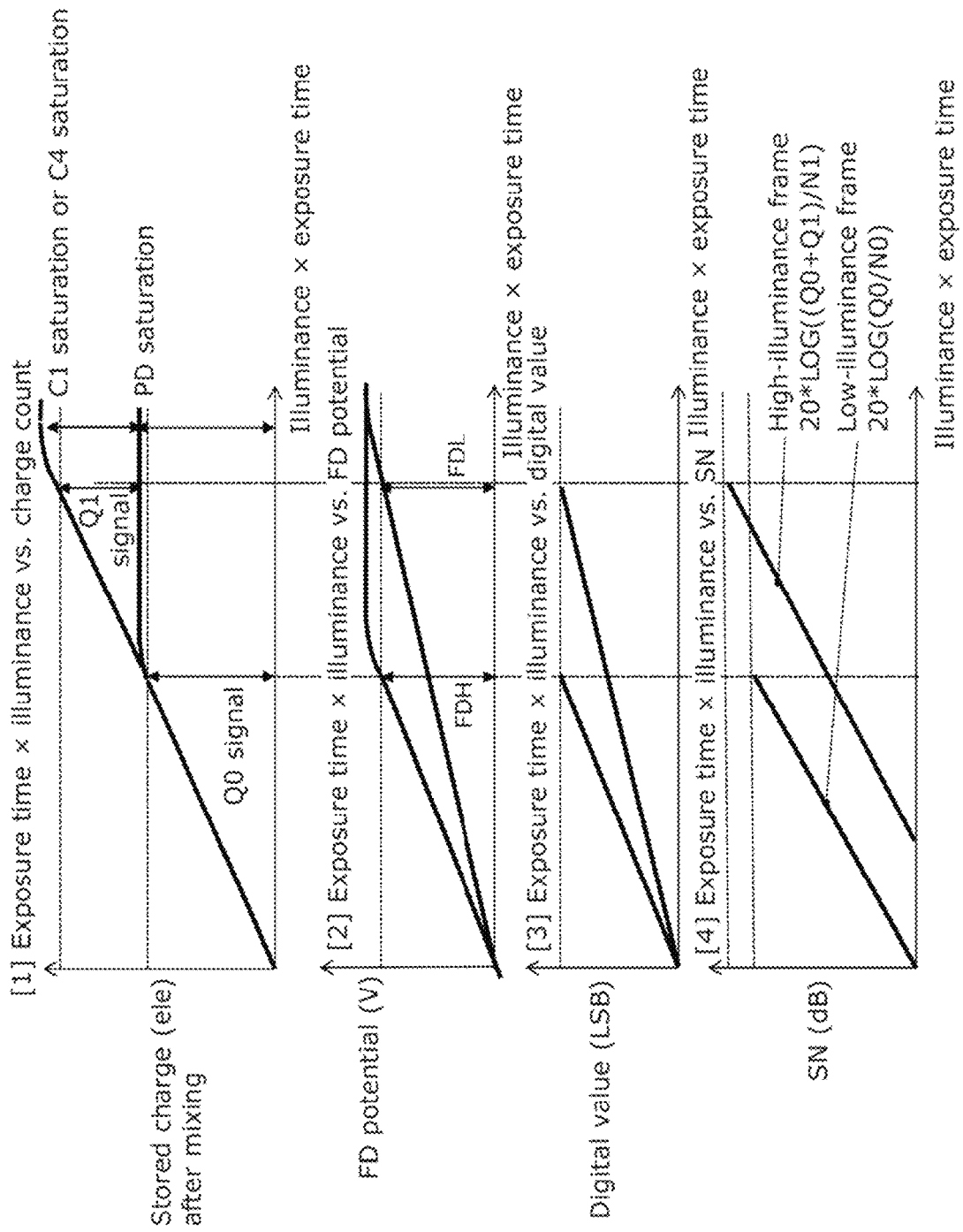
FIG. 16 is an overview of how WDR is implemented within a pixel.
Figure 29:
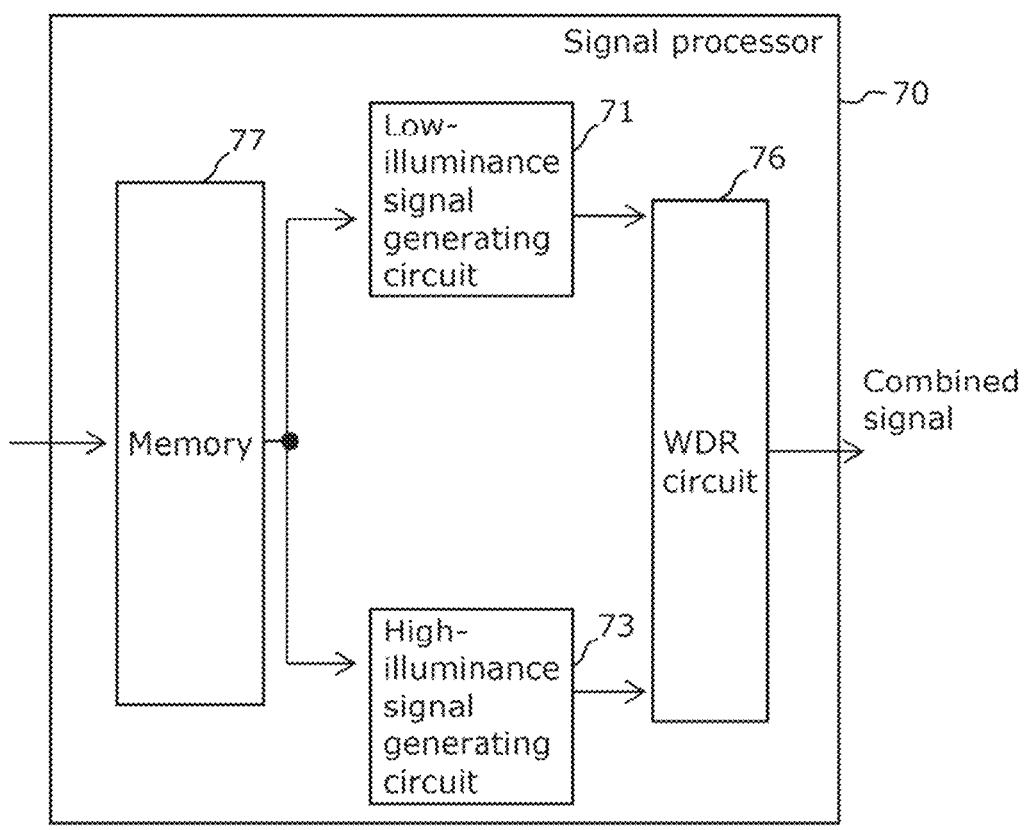
FIG. 29 illustrates an example of a configuration of a signal processor that combines two frames to achieve a WDR.

FIG. 16 is an overview of how WDR is implemented within a pixel. FIG. 29 illustrates an example of a configuration of signal processor 70 that combines two frames to achieve a WDR. However, since such frame combining is not performed in the present embodiment, WDR circuit 76 is not necessary. WDR is implemented using the signal charge of Q0 for long exposure (low-illuminance conditions) and the signal charge of (Q0+Q1) for short exposure (high-illuminance conditions).

The product of illuminance and exposure time, illuminance at a certain time, or exposure time at a certain illuminance is represented on the horizontal axes of [1], [2], [3], and [4] in FIG. 16. In [1], charge accumulation level is represented on the vertical axis. In [2], FD potential is represented on the vertical axis. In [3], the value after AD conversion is represented on the vertical axis. In [4], SN is represented on the vertical axis.

FIG. 17 illustrates the FD potentials in the HCG readout operation for a low-illuminance frame and the LCG readout operation for a high-illuminance frame. Hereinafter, the HCG readout is referred to as Read1 and the LCG readout is referred to as Read2.

Figure 18A:
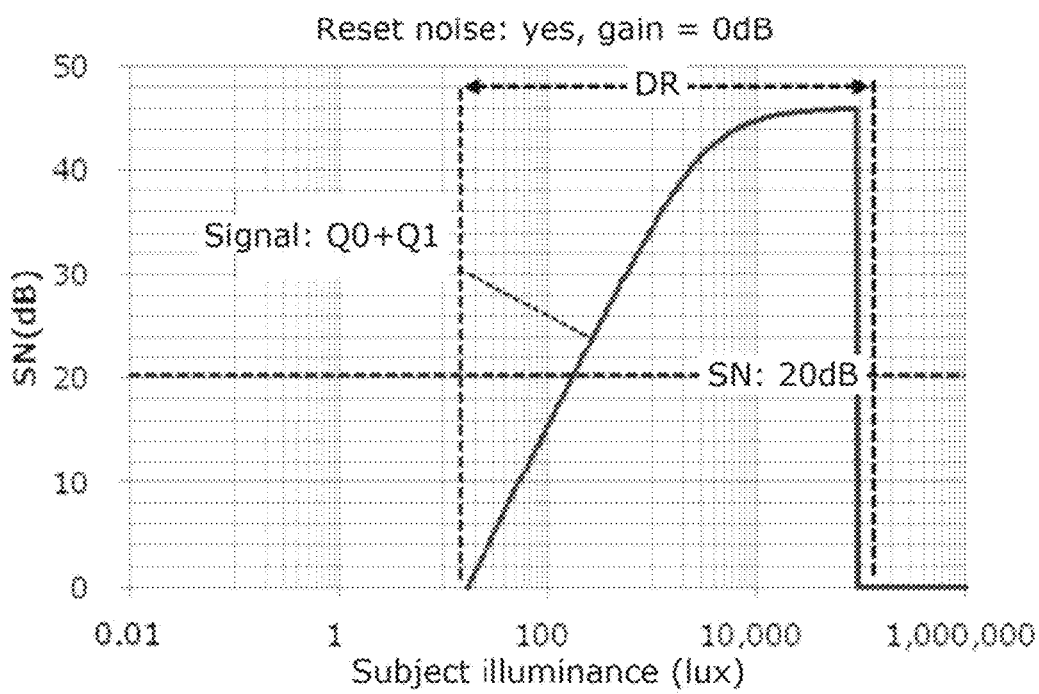
FIG. 18A illustrates the relationship between subject illuminance and gain (SN ratio) in LCG readout when a negative feedback circuit is not provided, as a comparative example.
Figure 18B:
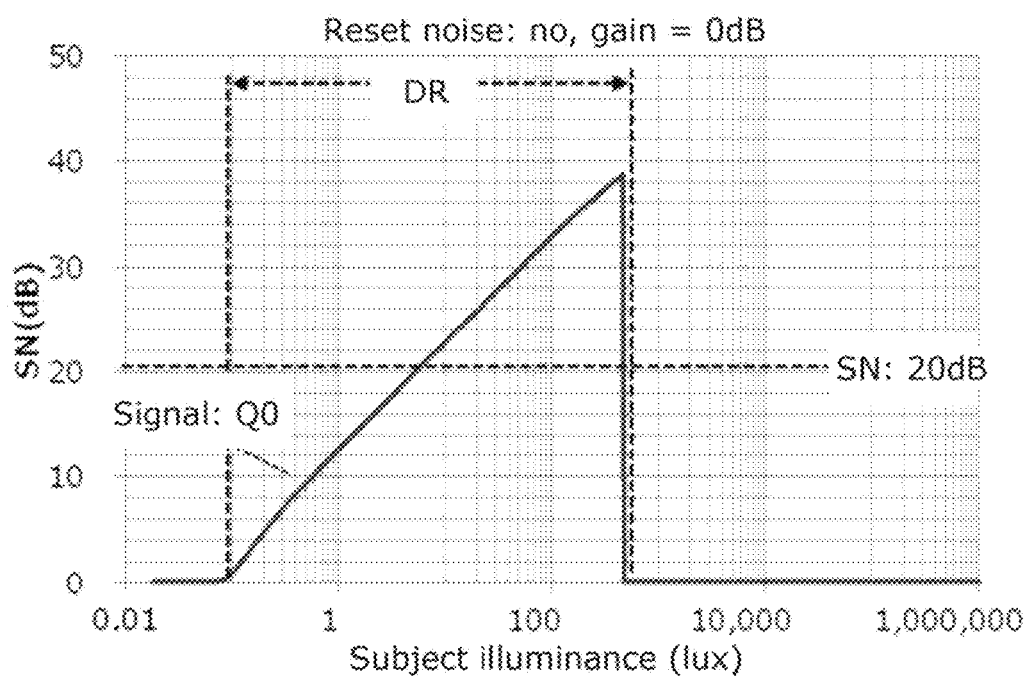
FIG. 18B illustrates the relationship between subject illuminance and gain (SN ratio) in HCG readout according to Embodiment 1A.

FIG. 18A through FIG. 18D illustrate the relationship between subject illuminance and gain (SN ratio) according to Embodiment 1A. FIG. 18A illustrates the relationship between subject illuminance and gain (SN ratio) in LCG readout when negative feedback circuit 21 is not provided, as a comparative example. FIG. 18B illustrates the relationship between subject illuminance and gain (SN ratio) in LCG readout according to Embodiment 1A.

Figure 18C:
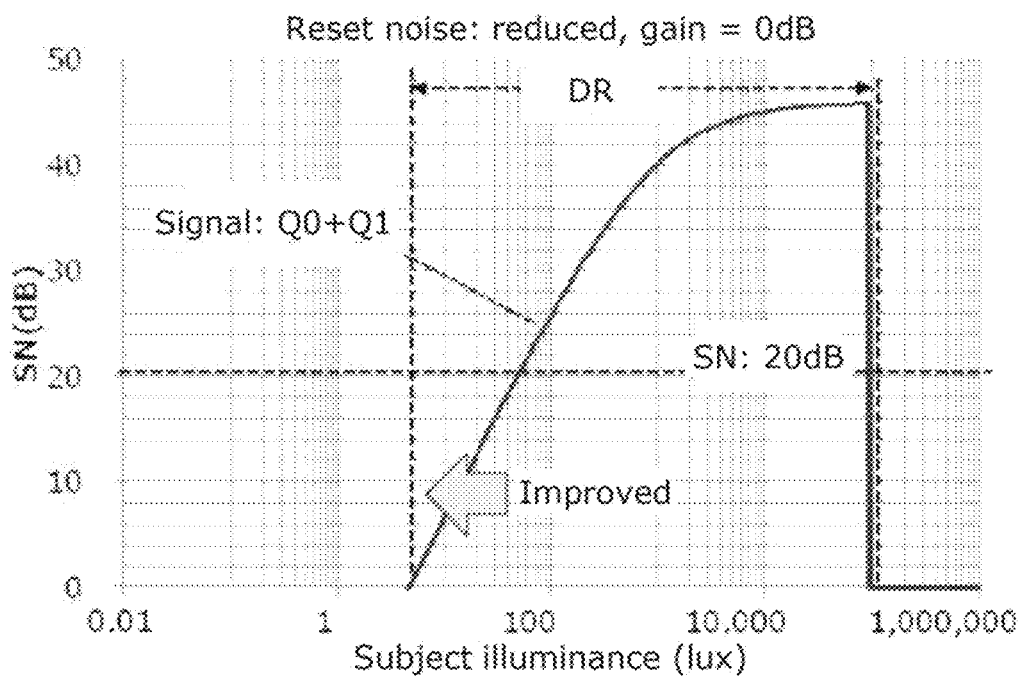
FIG. 18C illustrates the relationship between subject illuminance and gain (SN ratio) in HCG readout when a negative feedback circuit is not provided, as a comparative example.
Figure 18D:
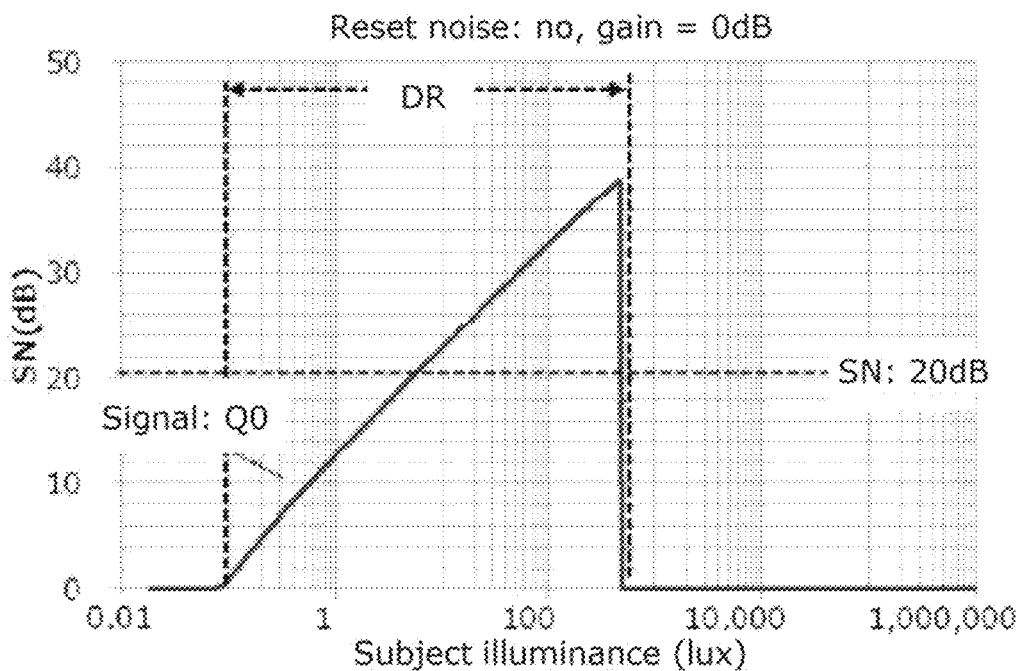
FIG. 18D illustrates the relationship between subject illuminance and gain (SN ratio) in HCG readout according to Embodiment 1A.

FIG. 18C illustrates the relationship between subject illuminance and gain (SN ratio) in HCG readout when negative feedback circuit 21 is not provided, as a comparative example. FIG. 18D illustrates the relationship between subject illuminance and gain (SN ratio) in HCG readout according to Embodiment 1A.

FIG. 18B and FIG. 18D are equivalent because they correspond to a Read1 long frame (i.e., the HCG readout for a low-illuminance frame) and do not generate reset noise.

FIG. 18A and FIG. 18C correspond to a Read2 short frame (i.e., the LCG readout for a high-illuminance frame), and although reset noise is generated like in FIG. 18A, the SN in the low-illuminance side is improved by reducing reset noise like in FIG. 18C. The dynamic range is extended from very dark illuminance (0.1 Lux) to very bright illuminance (100,000 Lux: equivalent to sunlight) due to the storage capacity, and the dynamic range is 120 dB or higher, and the SN at the connecting part of the frames is 20 dB or higher.

Without combining frames to achieve a WDR, the dynamic range is extended by selecting low-illuminance regions or high-illuminance regions depending on the illuminance conditions, and furthermore, noise can be improved in low-illuminance conditions and dynamic range can be extended in high-illuminance conditions.

Thus, the present embodiment makes it possible to improve both dynamic range and SN while reducing the reset noise of the storage capacitive element.

Embodiment 1B

While Embodiment 1A describes readout via the rolling shutter method, Embodiment 1B also supports readout via the global shutter method.

Compared to the rolling shutter method, the global shutter method can inhibit distortion when capturing images of objects moving at high speed.

Solid-state imaging apparatus 100 according to Embodiment 1B may be the same as Embodiment 1A, but differs mainly in that the drive of vertical scanning circuit 14 also supports the global shutter method. The following description will focus on this point of difference.

[1B.1 Configuration and Operation Examples of Negative Feedback Circuit]

Figure 19:
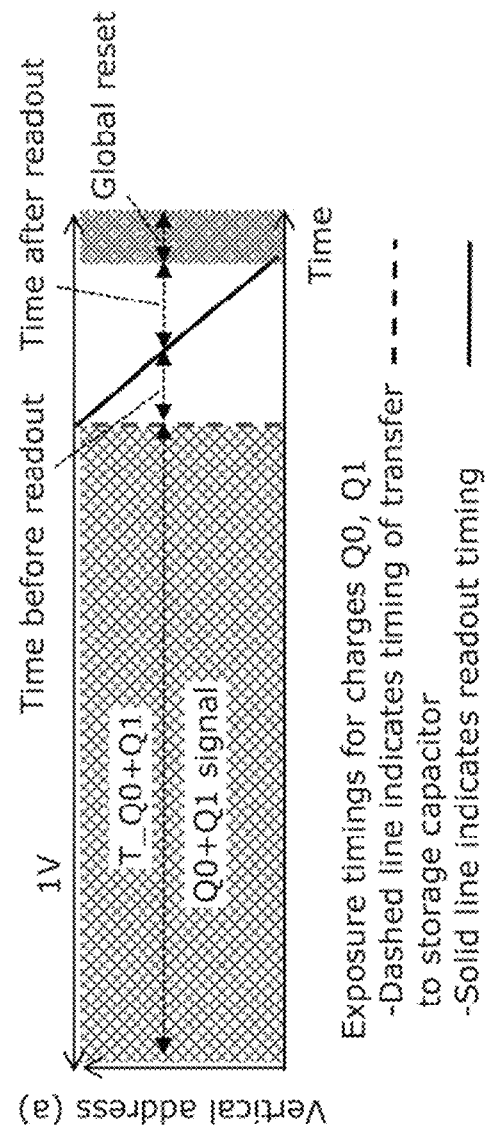
FIG. 19 illustrates timing related to the accumulating of charges of a photodiode and a storage capacitive element.

FIG. 19 illustrates timing related to the accumulating of charges of photodiode PD and storage capacitive element C1. Photodiode PD is continuously exposed during the 1V period (1 vertical synchronization period) and the charge amount is Q0. The signal of storage capacitive element C1 that receives this charge that overflows from photodiode PD is Q1. Q0 and Q1 are exposed at exactly the same time.

In the global shutter method, global reset is performed for all pixels at once. The exposure is then started and the exposure time is expressed as T_Q0+Q1. Next, the charge from the photodiode is read out in a batch to storage capacitive element C1. The signal charge of storage capacitive element C1 is then read out using the rolling shutter method.

Figures 20A, 20B:
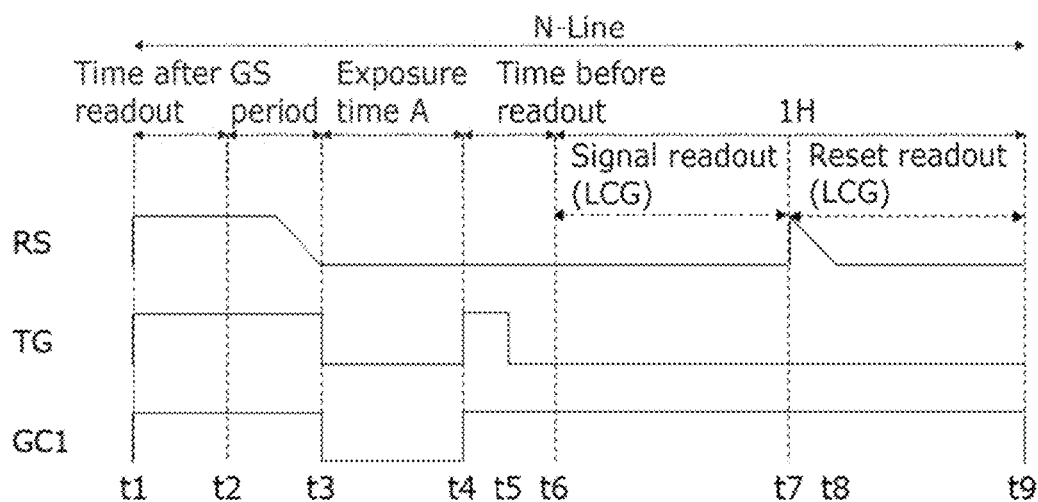
FIG. 20A illustrates an example of readout timing while a storage capacitive element is connected (i.e., in the LCG readout operation).
FIG. 20B illustrates the readout sequence of a reset component and a signal component in the LCG readout operation of FIG. 20A.

An example of readout timing while storage capacitive element C1 is connected (i.e., in the LCG readout operation) is illustrated in FIG. 20A.

Next, the timing will be described with reference to FIG. 20A.

First, photodiode PD, FD0, and FD1 are reset at time t1 to t2, and the process waits for the exposure to start. Then, from time t2 to t3, the global shutter operates to start the exposure. The exposure time ends at time t4. From time t4 to t5, the signal charge stored in the photodiode is transferred to FD0 and FD1 by the transfer signal (TG). At time t5, gain control transistor GC1 is turned on, allowing the conversion gain to be set lower to receive more signal charge. Time t5 to t6 is the time to wait for readout up to the corresponding row in the rolling shutter method. When the corresponding row is reached, the signal components are read out between times t6 and t7. Next, a reset operation is performed between times t7 and t8. The reset components are read out between times t8 and t9.

Here, reset noise is generated during the global shutter period at times t2 and t3, and during the reset period at times t7 and t8. Therefore, during this period, negative feedback circuit 21 works to gradually turn off reset control signal RS, thereby reducing the reset noise. This shows how a sloped signal is applied to the reset transistor (RS).

FIG. 20B illustrates the readout sequence of the reset component and the signal component in the LCG readout operation of FIG. 20A. As illustrated in FIG. 20B, in the LCG readout operation, the signal component and the reset component are read out in the stated order.

Embodiment 2A

Embodiment 2A describes in detail an example of a configuration including one stage of the storage circuits in the horizontal direction in the second configuration example illustrated in FIG. 1B. The following description will focus on the point of difference with Embodiment 1A.

[2A.1 Configuration Example of Pixel Circuit]

Next, an example of a configuration of pixel circuit 3 will be described.

Figure 21:
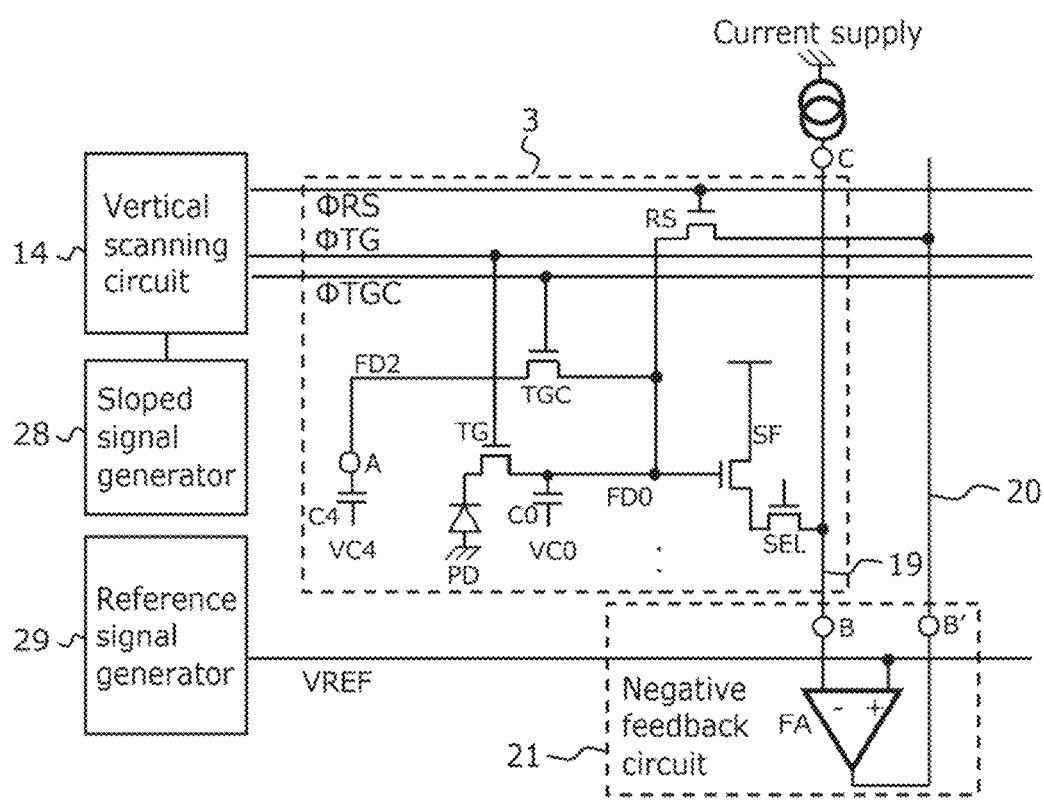
FIG. 21 illustrates a circuit example of a pixel circuit and a negative feedback circuit according to Embodiment 2A.

FIG. 21 illustrates a circuit example of pixel circuit 3 and negative feedback circuit 21 according to Embodiment 2A. Pixel circuit 3 in FIG. 21 includes photodiode PD, transfer transistor TG, storage capacitive element C2, storage transfer transistor TGC, floating diffusion layer FD0, parasitic capacitor C0, floating diffusion layer FD2, reset transistor RS, amplification transistor SF, and selection transistor SEL.

Horizontal scan line group 15 includes reset control line φRS, readout control line φTG, storage transfer transistor control line φTGC, and selection control line φSEL.

Photodiode PD is a photoelectric conversion element, such as a photodiode, that performs photoelectric conversion at a given sensitivity, that is to say, generates a charge according to the amount of light received.

Moreover, capacitor C0 connected to floating diffusion layer FD0 holds a signal charge (for example, electrons) transferred from photodiode PD, converts the held signal charge into voltage, and supplies the voltage resulting from the conversion to the gate of amplification transistor SF. Practically speaking, the capacitance of floating diffusion layer FD0 is not only the capacitance of floating diffusion layer FD0 itself, but also includes the gate capacitance of amplification transistor SF, and the gate-drain capacitance of amplification transistor SF.

Transfer transistor TG is a switching transistor that turns on and off according to readout control signal φTG. When readout control signal φTG is high-level, transfer transistor TG transfers the signal charge resulting from photoelectric conversion by photodiode PD to floating diffusion layer FD.

Storage transfer transistor TGC is a switching transistor that turns on and off according to readout control signal φTGC. Storage transfer transistor TGC transfers the signal charge stored in storage capacitive element C4 to floating diffusion layer FD0 when readout control signal φTGC is high-level.

When the signal charge resulting from photoelectric conversion by photodiode PD overflows, the signal charge is transferred to storage capacitive element C4 by adjusting control voltage φTGC of storage transfer transistor TGC. Alternatively, the signal charge is transferred when the signal charge exceeds a preset potential.

Storage capacitive element C0 changes the conversion gain at which the signal charge in floating diffusion layer FD0 is converted into voltage. In other words, in the transferring of the signal charge from photodiode PD to floating diffusion layer FD0, if storage transfer transistor TGC is turned off, the conversion gain of floating diffusion layer FD0 can be increased further, equal to C0. Conversely, if storage transfer transistor TGC is turned on, floating diffusion layers FD0 and FD1 are connected, and the conversion gain can be lowered to allow more signal charge to be stored, equal to C0+C4.

Reset transistor RS is a switching transistor that turns on and off according to reset control signal φRS. When reset control signal φRS is high-level, reset transistor RS sets the power supply voltage applied to the drain as the reset level in floating diffusion layer FD0. In other words, when reset control signal φRS is high-level, reset transistor RS resets floating diffusion layer FD0 to the reset level.

Amplification transistor SF forms a source follower paired together with load current supply 30 connected to vertical signal line 19, and outputs the voltage of the gate, that is to say, the voltage of floating diffusion layer FD0 to vertical signal line 19 as an analog pixel signal.

Selection transistor SEL is a switching transistor that turns on and off according to selection control signal φSEL. Selection transistor SEL electrically connects the source of amplification transistor SF and vertical signal line 19 when selection control signal φSEL is high-level.

[2A.2 Configuration and Operation Examples of Negative Feedback Circuit]

The timing related to the accumulating of charges of photodiode PD and storage capacitive element C2 illustrated in FIG. 11 is the same as in Embodiment 1A.

A timing example for the HCG readout operation in which storage capacitive element C4 according to Embodiment 2A is not connected is identical to FIG. 7.

Figure 22:
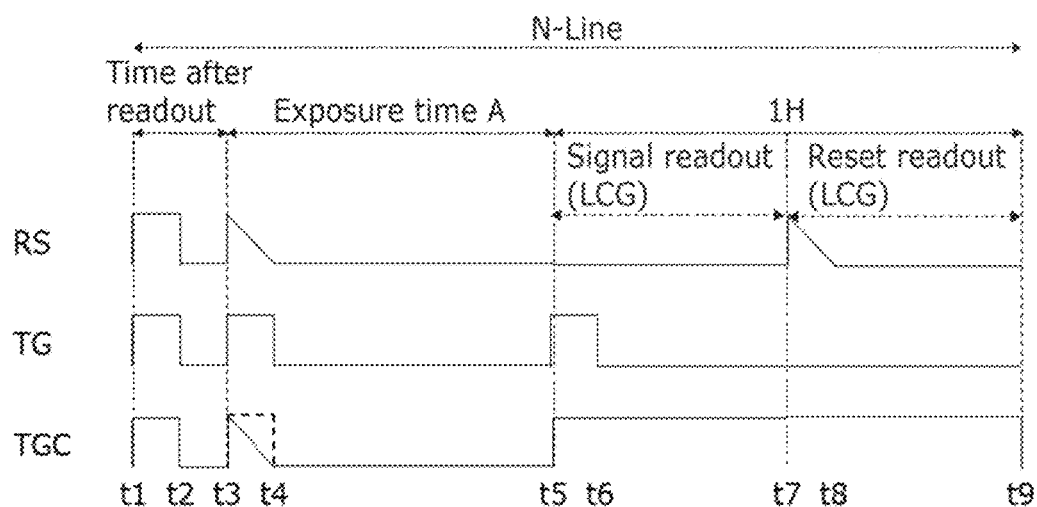
FIG. 22 illustrates a timing example according to Embodiment 2A for the LCG readout operation in which a storage capacitive element is connected.

A timing example for the LCG readout operation in which storage capacitive element C4 is connected is illustrated in FIG. 22.

First, photodiode PD, FD0, and FD1 are reset at time t1 to t2, and the process waits for the exposure to start. Then, from time t3 to t4, the shutter operates to start the exposure. The exposure time ends at time t5. At time t5, storage transfer transistor TGC is turned on, allowing the conversion gain to be set lower to receive more signal charge. From time t5 to t6, the signal charge stored in the photodiode is transferred to FD0 and FD1 by transfer signal TG. The signal components are read out between times t6 and t7. Next, a reset operation is performed between times t7 and t8. The reset components are read out between times t8 and t9.

Here, reset noise is generated during the shutter period at times t3 and t4, and during the reset period at times t7 and t8. Therefore, during this period, negative feedback circuit 21 works to gradually turn off reset control signal RS and stored charge transfer element TGC, thereby reducing the reset noise. This shows how a sloped signal is applied to the reset transistor (RS) and the stored charge transfer element (TGC). Alternatively, as another method, negative feedback circuit 21 is activated in the shutter period at times t3 and t4, reset control signal RS is turned off gradually, and stored charge transfer element TGC is turned off abruptly, as shown by the dashed line. In this case, due to the law of charge storage, the reset noise of storage capacitive element C4 is not reduced, but the reset noise in the positive and negative reverse directions is generated in FD0. Since the FD portion is not reset until signal readout (LCG), the reset noise of storage capacitive element C4 and the FD portion can be canceled to zero at this time.

Embodiment 2B

While Embodiment 2A describes readout via the rolling shutter method, Embodiment 2B also supports readout via the global shutter method.

Compared to the rolling shutter method, the global shutter method can inhibit distortion when capturing images of objects moving at high speed.

Solid-state imaging apparatus 100 according to Embodiment 2B may be the same as Embodiment 2A, but differs mainly in that the drive of vertical scanning circuit 14 also supports the global shutter method. The following description will focus on this point of difference.

[2B.1 Configuration and Operation Examples of Negative Feedback Circuit]

The timing related to the accumulating of charges of photodiode PD and storage capacitive element C1 illustrated in FIG. 19 is the same as in Embodiment 1B.

Figure 23:
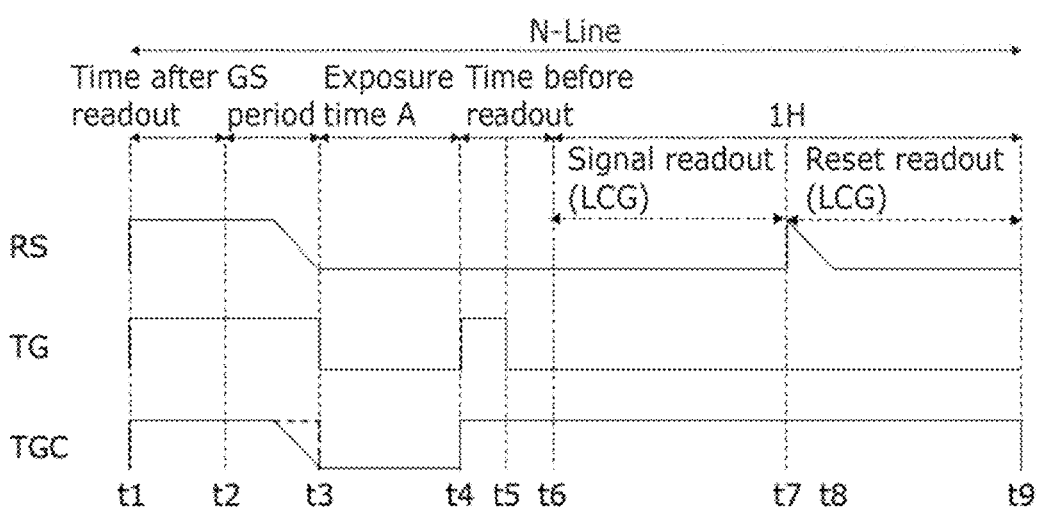
FIG. 23 illustrates an example according to Embodiment 2B of the readout timing when a storage capacitive element is connected.

An example of the readout timing according to Embodiment 2B when storage capacitive element C4 is connected is illustrated in FIG. 23.

Next, the timing will be described with reference to FIG. 23.

First, photodiode PD, FD0, and FD1 are reset at time t1 to t2, and the process waits for the exposure to start. Then, from time t2 to t3, the global shutter operates to start the exposure. The exposure time ends at time t4. From time t4 to t5, the signal charge stored in the photodiode is transferred to FD0 and FD2 by transfer signal TG. At time t4, storage transfer transistor TGC is turned on, allowing the conversion gain to be set lower to receive more signal charge. Time t5 to t6 is the time to wait for readout up to the corresponding row in the rolling shutter method. When the corresponding row is reached, the signal components are read out between times t6 and t7. Next, a reset operation is performed between times t7 and t8. The reset components are read out between times t8 and t9.

Here, reset noise is generated during the global shutter period at times t2 and t3, and during the reset period at times t7 and t8. Therefore, during this period, negative feedback circuit 21 works to gradually turn off reset control signal RS and stored charge transfer element TGC, thereby reducing the reset noise. This shows how a sloped signal is applied to the reset transistor (RS) and the stored charge transfer element (TGC). Alternatively, as another method, negative feedback circuit 21 is activated in the shutter period at times t2 and t3, reset control signal RS is turned off gradually, and stored charge transfer element TGC is turned off abruptly, as shown by the dashed line. In this case, due to the law of charge storage, the reset noise of storage capacitive element C4 is not reduced, but the reset noise in the positive and negative reverse directions is generated in FD0. Since the FD portion is not reset until signal readout (LCG), the reset noise of storage capacitive element C4 and the FD portion can be canceled to zero at this time.

Embodiment 3A

Embodiment 3A describes in detail an example of a configuration including one stage of the storage circuits in the horizontal direction in the third configuration example illustrated in FIG. 1C. The following description will focus on the point of difference with Embodiment 1A.

Solid-state imaging apparatus 100 according to Embodiment 3A will be described with a focus on the differences from Embodiment 1. In one example of a configuration of solid-state imaging apparatus 100, the number of controls for horizontal scan line groups 15 differ from Embodiment 1, but all other aspects are the same as Embodiment 1.

In the present embodiment, the charge that overflows from photodiode PD is stored directly in storage capacitive element C4 without passing through the FD portion or near the surface, thus reducing the dark current component.

[3A.1 Configuration Example of Pixel Circuit]

Next, an example of a configuration of pixel circuit 3 will be described.

Figure 24:
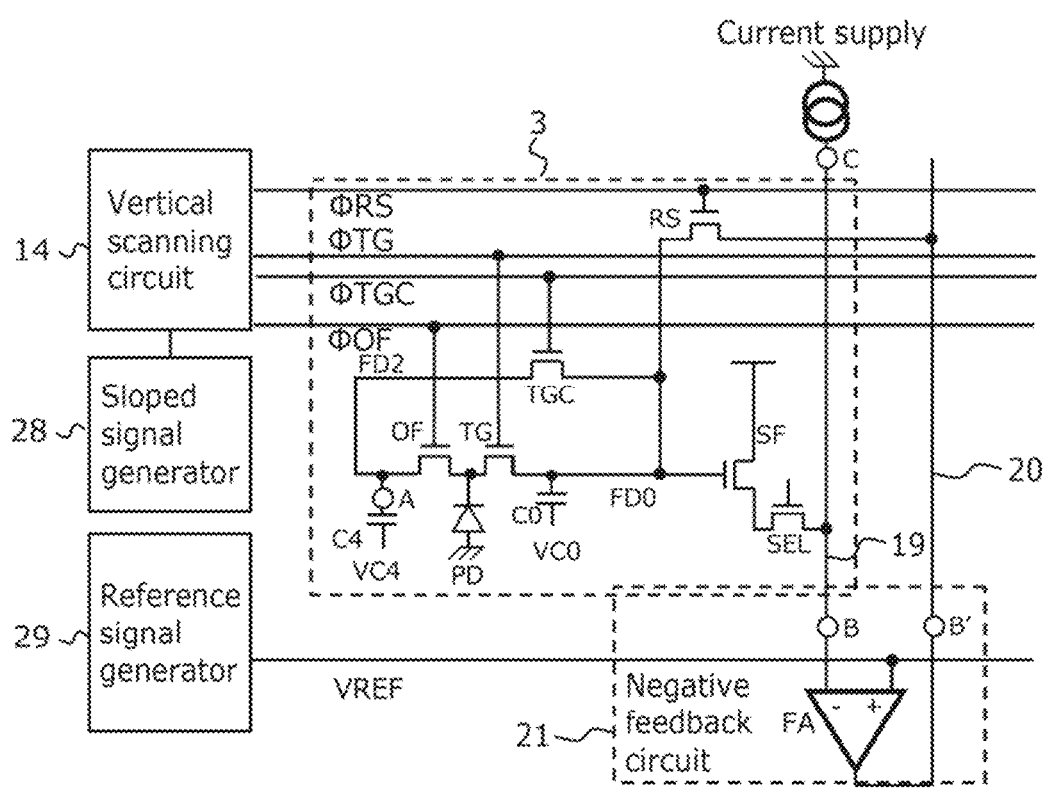
FIG. 24 illustrates a circuit example of a pixel circuit and a negative feedback circuit according to Embodiment 3A.

FIG. 24 illustrates a circuit example of pixel circuit 3 and negative feedback circuit 21 according to Embodiment 3A. Pixel circuit 3 in FIG. 21 includes a photodiode (PD), transfer transistor TG, overflow gate OF1, storage capacitive element C4, storage transfer transistor TGC, floating diffusion layer FD0, parasitic capacitor C0, floating diffusion layer FD2, reset transistor RS, amplification transistor SF, and selection transistor SEL.

Horizontal scan line group 15 includes reset control line φRS, readout control line φTG, overflow control line φOF1, and selection control line φSEL.

Photodiode PD is a photoelectric conversion element, such as a photodiode, that performs photoelectric conversion at a given sensitivity, that is to say, generates a charge according to the amount of light received.

Moreover, capacitor C0 connected to floating diffusion layer FD0 holds a signal charge (for example, electrons)

transferred from photodiode PD, converts the held signal charge into voltage, and supplies the voltage resulting from the conversion to the gate of amplification transistor SF. Practically speaking, the capacitance of floating diffusion layer FD0 is not only the capacitance of floating diffusion layer FD0 itself, but also includes the gate capacitance of amplification transistor SF, the gate-drain capacitance of amplification transistor SF, and the floating capacitance of the source wiring of gain control transistor GC1 when gain control transistor GC1 is off.

Transfer transistor TG is a switching transistor that turns on and off according to readout control signal φTG. When readout control signal φTG is high-level, transfer transistor TG transfers the signal charge resulting from photoelectric conversion by photodiode PD to floating diffusion layer FD.

Storage transfer transistor TGC is a switching transistor that turns on and off according to readout control signal φTGC. Transfer transistor TGC transfers the signal charge stored in storage capacitive element C4 to floating diffusion layer FD when readout control signal φTGC is high-level.

Overflow gate OF is used both as an overflow gate and a switching transistor that turns on and off according to readout control signal φOF. When readout control signal φOF is high-level, the signal charge resulting from photoelectric conversion by photodiode PD is transferred to storage capacitive element C4 via overflow gate OF.

When the signal charge resulting from photoelectric conversion by photodiode PD overflows, the signal charge is transferred to storage capacitive element C4 by adjusting control voltage φTGC of storage transfer transistor TGC. Alternatively, the signal charge is transferred when the signal charge exceeds a preset potential.

Storage capacitive element C4 changes the conversion gain at which the signal charge in floating diffusion layer FD0 is converted into voltage. In other words, in the transferring of the signal charge from photodiode PD to floating diffusion layer FD0, if storage transfer transistor TGC is turned off, the conversion gain of floating diffusion layer FD0 can be increased further, equal to C0. Conversely, if storage transfer transistor TGC is turned on, floating diffusion layers FD0 and FD1 are connected, and the conversion gain can be lowered to allow more signal charge to be stored, equal to C0+C4.

Reset transistor RS is a switching transistor that turns on and off according to reset control signal φRS. When reset control signal φRS is high-level, reset transistor RS sets the power supply voltage applied to the drain as the reset level in floating diffusion layer FD0. In other words, when reset control signal φRS is high-level, reset transistor RS resets floating diffusion layer FD0 to the reset level.

Amplification transistor SF forms a source follower paired together with load current supply 30 connected to vertical signal line 19, and outputs the voltage of the gate, that is to say, the voltage of floating diffusion layer FD0 to vertical signal line 19 as an analog pixel signal.

Selection transistor SEL is a switching transistor that turns on and off according to selection control signal φSEL. Selection transistor SEL electrically connects the source of amplification transistor SF and vertical signal line 19 when selection control signal φSEL is high-level.

[3A.2 Configuration and Operation Examples of Negative Feedback Circuit]

The timing related to the accumulating of charges of photodiode PD and storage capacitive element C1 illustrated in FIG. 11 is the same as in Embodiment 1A.

A timing example for the HCG readout operation in which storage capacitive element C4 is not connected is identical to FIG. 7.

Figure 25:
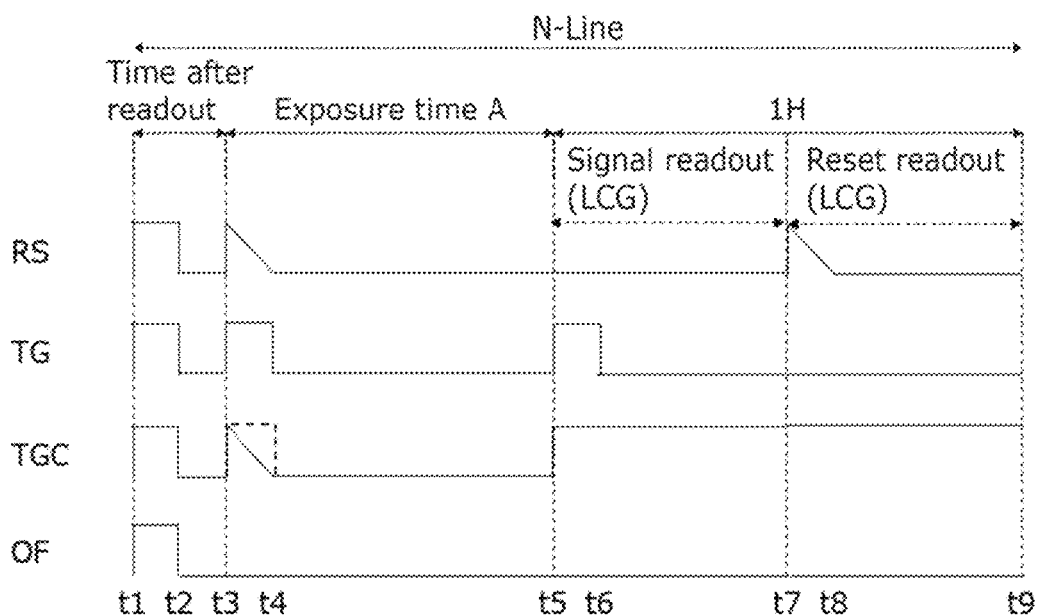
FIG. 25 illustrates a timing example according to Embodiment 3A for the LCG readout operation in which a storage capacitive element is connected.

A timing example for the LCG readout operation in which storage capacitive element C4 is connected is illustrated in FIG. 25.

First, photodiode PD, FD0, and FD2 are reset at time t1 to t2, and the process waits for the exposure to start. Then, from time t3 to t4, the shutter operates to start the exposure. The exposure time ends at time t5. At time t5, storage transfer transistor TGC is turned on, allowing the conversion gain to be set lower to receive more signal charge. From time t5 to t6, the signal charge stored in the photodiode is transferred to FD0 and FD1 by transfer signal TG. The signal components are read out between times t6 and t7. Next, a reset operation is performed between times t7 and t8. The reset components are read out between times t8 and t9.

Here, reset noise is generated during the shutter period at times t3 and t4, and during the reset period at times t7 and t8. Therefore, during this period, negative feedback circuit 21 works to gradually turn off reset control signal RS and stored charge transfer element TGC, thereby reducing the reset noise. This shows how a sloped signal is applied to the reset transistor (RS) and the stored charge transfer element (TGC). Alternatively, as another method, negative feedback circuit 21 is activated in the shutter period at times t3 and t4, reset control signal RS is turned off gradually, and stored charge transfer element TGC is turned off abruptly, as shown by the dashed line. In this case, due to the law of charge storage, the reset noise of storage capacitive element C4 is not reduced, but the reset noise in the positive and negative reverse directions is generated in FD0. Since the FD portion is not reset until signal readout (LCG), the reset noise of storage capacitive element C4 and the FD portion can be canceled to zero at this time.

Embodiment 3B

Solid-state imaging apparatus 100 according to Embodiment 1B may be the same as Embodiment 1A, but differs mainly in that the drive of vertical scanning circuit 14 also supports the global shutter method. The following description will focus on this point of difference.

[3B.1 Configuration and Operation Examples of Negative Feedback Circuit]

The timing related to the accumulating of charges of photodiode PD and storage capacitive element C1 illustrated in FIG. 19 is the same as in Embodiment 1B. However, photodiode PD is continuously exposed during the 1 V period (1 vertical synchronization period) and the charge amount is Q0. The signal of storage capacitive element C that receives, via overflow gate OF1, this charge that overflows from photodiode PD is Q1. Q0 and Q1 are exposed at exactly the same time.

In the global shutter method, global reset is performed for all pixels at once. The exposure is then started and the exposure time is expressed as T_Q0+Q1. Next, the transfer of the charge from the photodiode is performed in a batch to storage capacitive element C4 by adjusting the control voltage of overflow gate OF1. The signal charge of storage capacitive element C2 is then read out using the rolling shutter method, by turning the storage transfer transistor TGC on.

Figure 26:
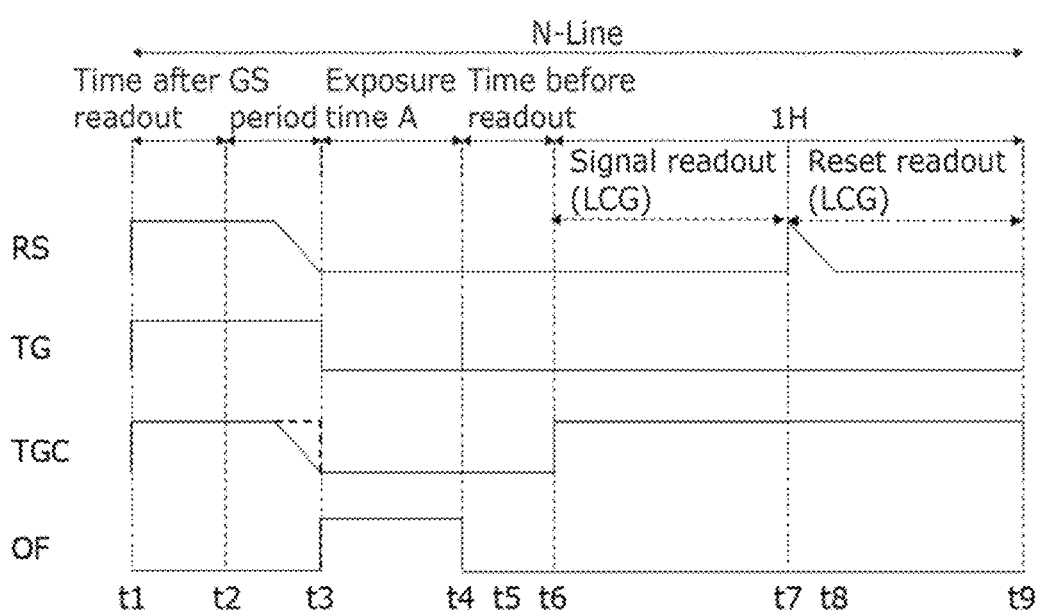
FIG. 26 illustrates a timing example according to Embodiment 3B for the LCG readout operation in which a storage capacitive element is connected.

A timing example for the LCG readout operation in which storage capacitive element C4 according to Embodiment 3B is connected is illustrated in FIG. 26.

Next, the timing will be described with reference to FIG. 26.

First, photodiode PD, FD0, and FD1 are reset at time t1 to t2, and the process waits for the exposure to start. Then, from time t2 to t3, the global shutter operates to start the exposure. Then, the overflow gate is turned on so that all photoelectrically converted charges are stored in storage capacitive element C4 from time t3 to t4. Since the exposure time ends at time t4, the overflow gate is turned off. At time t6, storage transfer transistor TGC is turned on, allowing the conversion gain to be set lower to receive more signal charge. Time t5 to t6 is the time to wait for readout up to the corresponding row in the rolling shutter method. When the corresponding row is reached, the signal components are read out between times t6 and t7. Next, a reset operation is performed between times t7 and t8. The reset components are read out between times t8 and t9.

Here, reset noise is generated during the global shutter period at times t2 and t3, and during the reset period at times t7 and t8. Therefore, during this period, negative feedback circuit 21 works to gradually turn off reset control signal RS and stored charge transfer element TGC, thereby reducing the reset noise. This shows how a sloped signal is applied to the reset transistor (RS) and the stored charge transfer element (TGC). Alternatively, as another method, negative feedback circuit 21 is activated in the shutter period at times t2 and t3, reset control signal RS is turned off gradually, and stored charge transfer element TGC is turned off abruptly, as shown by the dashed line. In this case, due to the law of charge storage, the reset noise of storage capacitive element C4 is not reduced, but the reset noise in the positive and negative reverse directions is generated in FD0. Since the FD portion is not reset until signal readout (LCG), the reset noise of storage capacitive element C4 and the FD portion can be canceled to zero at this time.

Embodiment 4

Solid-state imaging apparatus 100 according to Embodiment 4 will be described with a focus on the differences from Embodiment 1A. In one example of a configuration of solid-state imaging apparatus 100, the number of controls for horizontal scan line groups 15 differ from Embodiment 1A, but all other aspects are the same as Embodiment 1A.

While Embodiment 1A included a means for selecting a high-illuminance region signal and a low-illuminance region signal, Embodiment 4 reads out and combines two types of pixel signals in one frame period, namely a pixel signal for the high-illuminance frame and a pixel signal for the low-illuminance frame. This extends the dynamic range.

[4.1 Pixel Circuit Configuration Example]

Next, an example of a configuration of pixel circuit 3 will be described.

Figure 27:
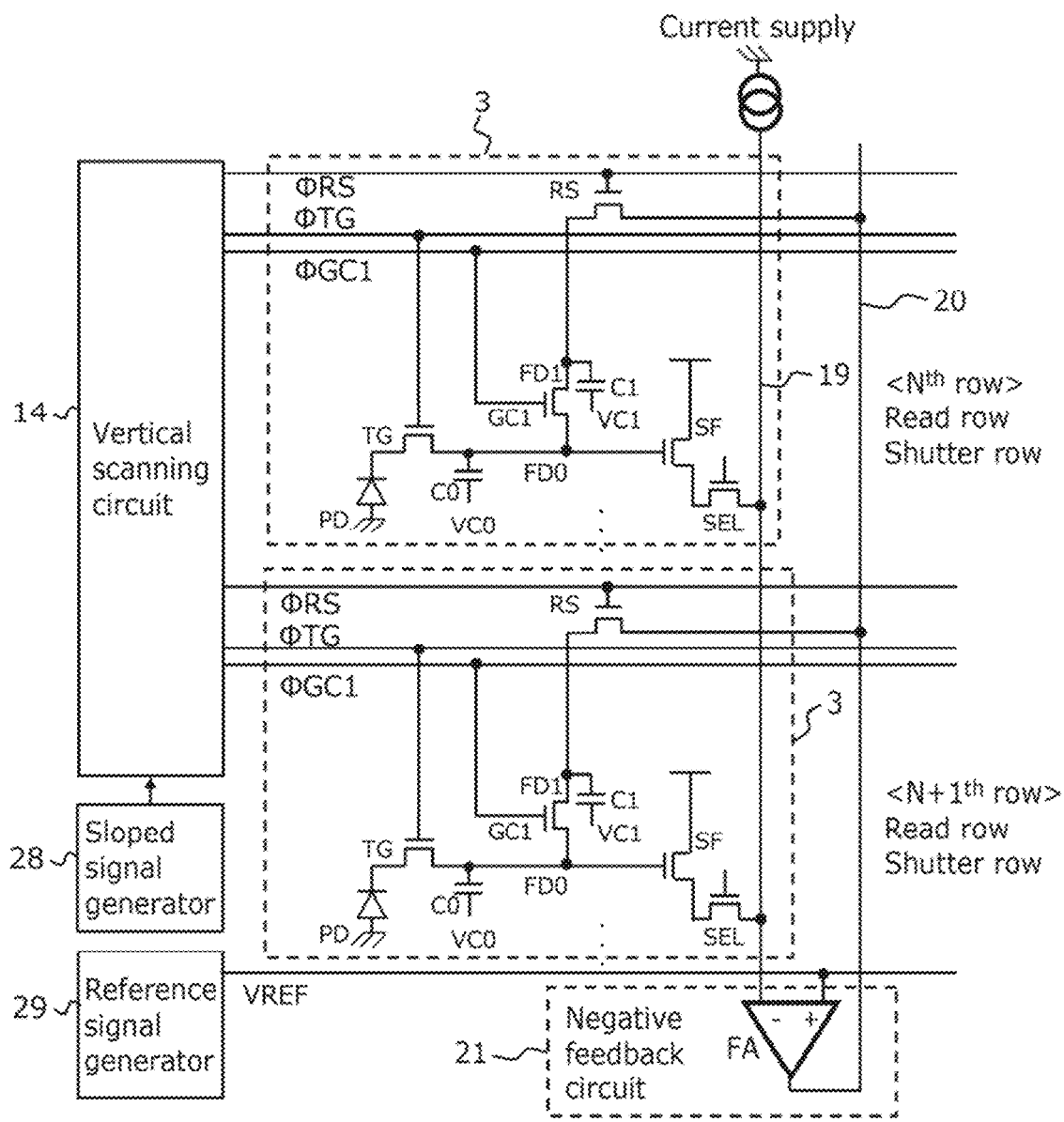
FIG. 27 illustrates a circuit example of a pixel circuit and a negative feedback circuit according to Embodiment 4.

FIG. 27 illustrates a circuit example of pixel circuit 3 and negative feedback circuit 21 according to Embodiment 4. FIG. 27 is equivalent to FIG. 24 of Embodiment 3A, and is also equivalent to a configuration example including one stage in the horizontal direction of the storage circuits in the third configuration example in FIG. 1C. The following description will focus on this point of difference.

[4.2 Readout Operation Example According to Present Embodiment]

Figure 28A:
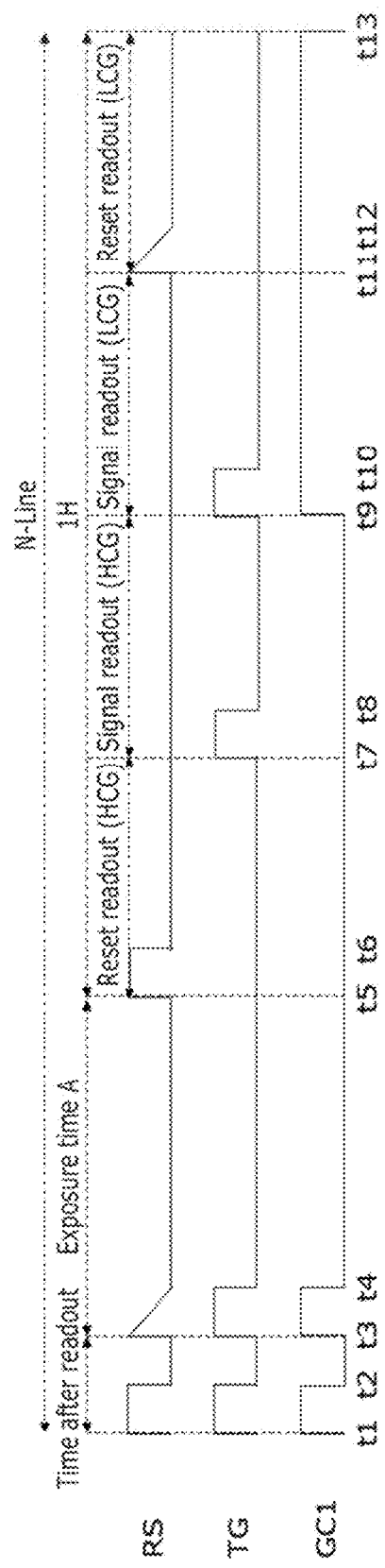
FIG. 28A is a time chart illustrating the readout order of one frame in Embodiment 4.

FIG. 28A is a time chart illustrating the readout order of one frame in Embodiment 4.

The gain that converts the signal charge at floating diffusion layer FD1 into voltage can be selectively switched between a high gain and a low gain according to the on/off state of gain control transistor GC1.

In HCG, the normal CDS order in 1H is HCG (R: reset component) to HCG (S: signal component). This transition results in the readout of signal charge from photodiode PD to floating diffusion layer FD0 with a high conversion gain in floating diffusion layer FD0.

Since this transition is a normal CDS, the reset noise can be canceled to zero.

FIG. 28B illustrates the readout sequence of the reset component and the signal component in the HCG readout and the LCG readout of FIG. 28A. FIG. 28B illustrates CDS order in 1H. In LCG, the sequence is LCG (S: signal component) to LCG (R: reset component). This transition results in the readout of signal charge from storage capacitive element C0 and storage capacitive element C1 to floating diffusion layer FD0 with a low conversion gain in floating diffusion layer FD1.

In LCG, this transition can remove DC-like offsets (reset coupling), but pixel reset noise cannot be canceled and will remain as kTC noise.

The kTC noise in this short exposure (high illuminance) appears on the low illuminance side. For example, this is illustrated in FIG. 30C. Here, kTC noise is expressed as √(kTC) at charge amount. Settings must be configured so that this noise is sufficiently smaller than the signal level. Accordingly, at the boundary between the short exposure (high illuminance) and the long exposure (low illuminance), it is necessary to sufficiently improve the latter SN more than the former SN.

[4.3 Configuration and Operation Examples of Negative Feedback Circuit]

The timing related to the accumulating of charges of photodiode PD and storage capacitive element C1 illustrated in FIG. 11 is the same as in Embodiment 1A.

Next, the timing will be described with reference to FIG. 28A.

First, photodiode PD, FD0, and FD1 are reset at time t1 to t2, and the process waits for the exposure to start. Then, from time t3 to t4, the shutter operates to start the exposure. The exposure time ends at time t5.

In HCG, a reset operation is performed between times t5 and t6. The reset components are read out between times t8 and t9. Next, from time t7 to t8, the signal charge stored in the photodiode is transferred to FD0 by transfer signal TG. The signal components are read out between times t8 and t9.

In LCG, from time t9 to t10, the signal charge stored in the photodiode is transferred to FD0 by transfer signal TG. The signal components are read out between times t10 and t11. Next, a reset operation is performed between times t11 and t12. The reset components are read out between times t12 and t13.

Here, reset noise is generated during the shutter period at times t3 and t4, and during the reset period at times t11 and t12. Therefore, during this period, negative feedback circuit 21 works to gradually turn off reset control signal RS, thereby reducing the reset noise. This shows how a sloped signal is applied to the reset transistor (RS).

[4.4 Dynamic Range Extension]

A feature of the present embodiment is that the two frames—the long and short frames—combined to achieve a WDR are exposed at exactly the same timing and the exact same pixels are used, which inhibits false colors, coloring, and blur.

FIG. 16 is an overview of the combining method used within a pixel to achieve a WDR. FIG. 29 illustrates an example of a configuration of a signal processor that combines two frames to achieve a WDR. Combining is carried out to achieve a WDR using the signal charge of Q0 for long exposure (low-illuminance conditions) and the signal charge of (Q0+Q1) for short exposure (high-illuminance conditions).

The product of illuminance and exposure time, illuminance at a certain time, or exposure time at a certain illuminance is represented on the horizontal axes of [1], [2], [3], and [4] in FIG. 16. In [1], charge accumulation level is represented on the vertical axis. In [2], FD potential is represented on the vertical axis. In [3], the value after AD conversion is represented on the vertical axis. In [4], SN is represented on the vertical axis.

FIG. 17 illustrates the signal charge amounts and FD potentials at the first readout, Read1, of the low-illuminance frame, and the second readout, Read2, of the high-illuminance frame.

FIG. 30A through FIG. 30D illustrate the relationship between subject illuminance and gain (SN ratio) according to Embodiment 4.

Figure 30A:
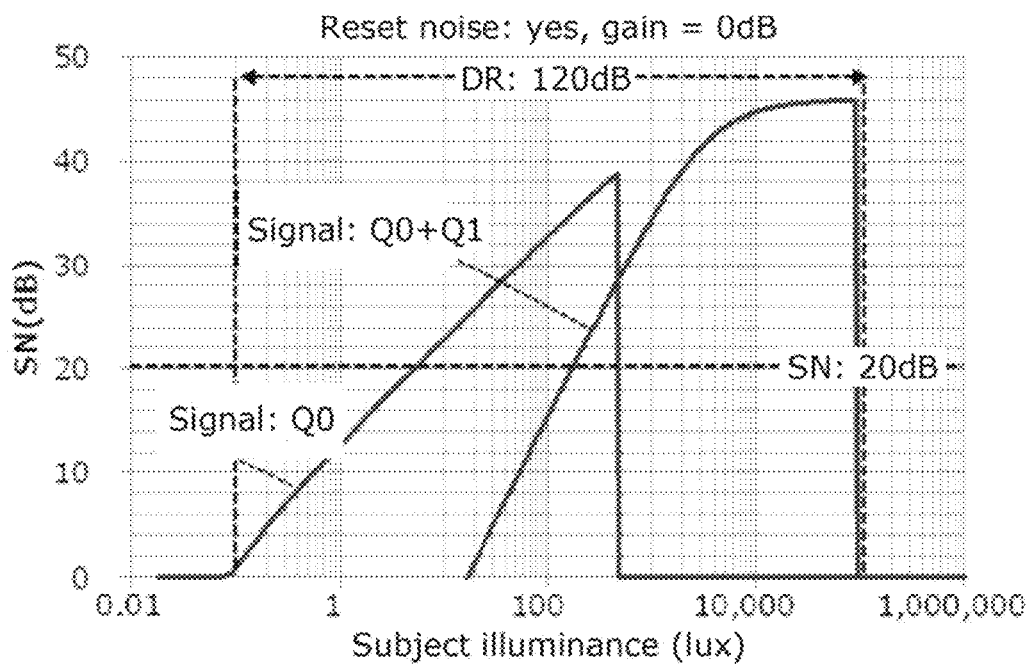
FIG. 30A illustrates the relationship between subject illuminance and gain (SN ratio) in LCG readout when a negative feedback circuit is not provided, as a comparative example.
Figure 30B:
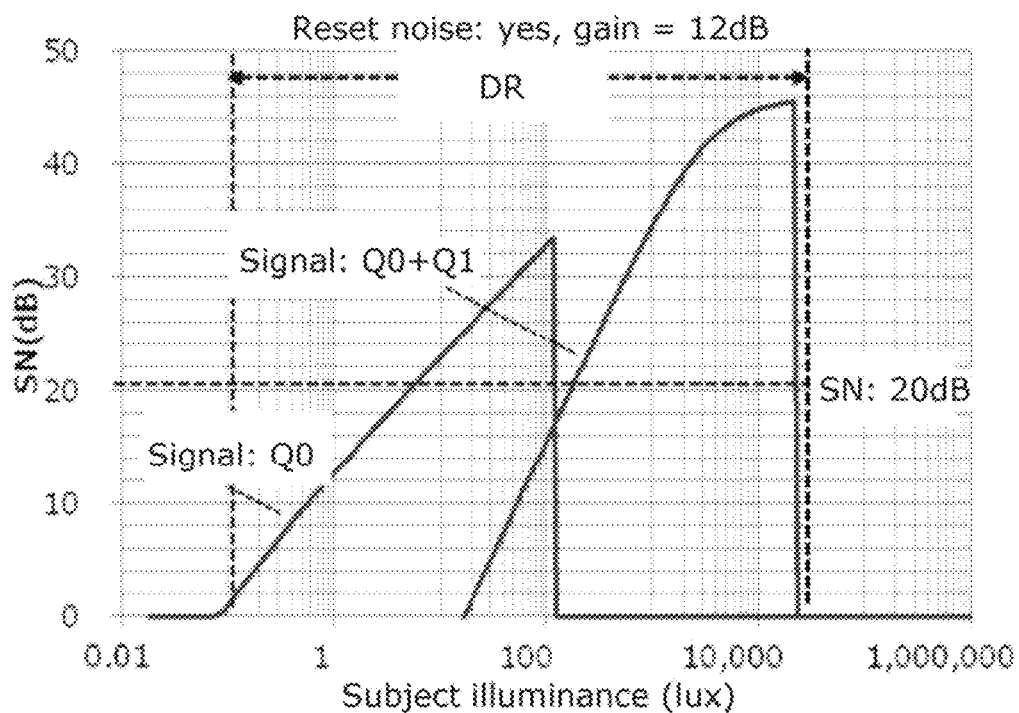
FIG. 30B illustrates the relationship between subject illuminance and gain (SN ratio) in LCG readout when a negative feedback circuit is not provided, as a comparative example.
Figure 30C:
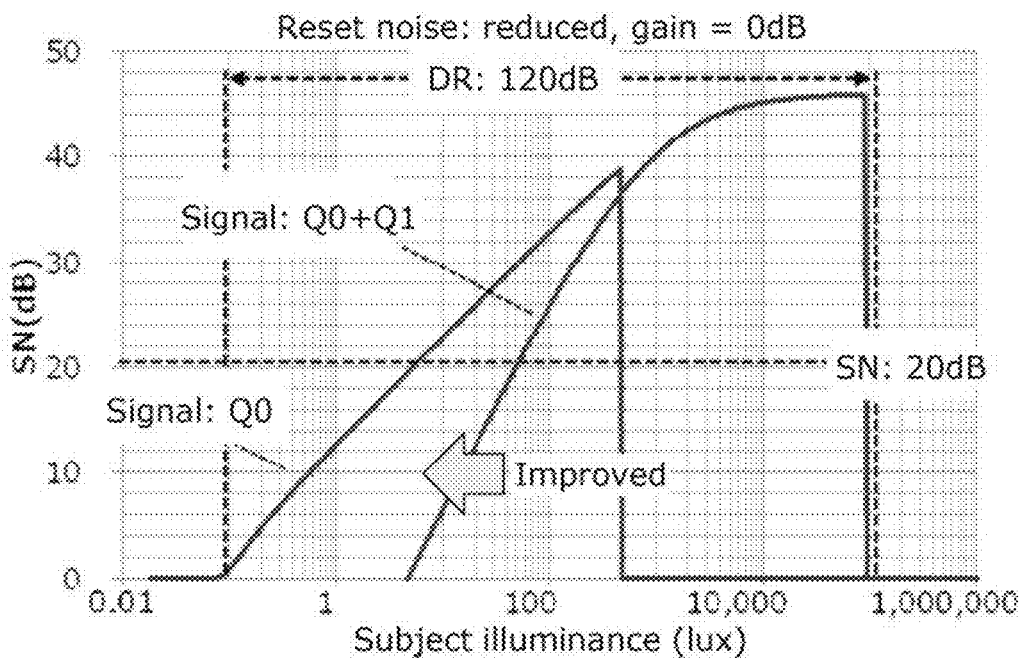
FIG. 30C illustrates the relationship between subject illuminance and gain (SN ratio) in LCG readout according to Embodiment 4.

FIG. 30A and FIG. 30B illustrate the relationship between subject illuminance and gain (SN ratio) in LCG readout when negative feedback circuit 21 is not provided, as a comparative example. The analog gain is 0 dB in FIG. 30A and 12 dB in FIG. 30B.

Figure 30D:
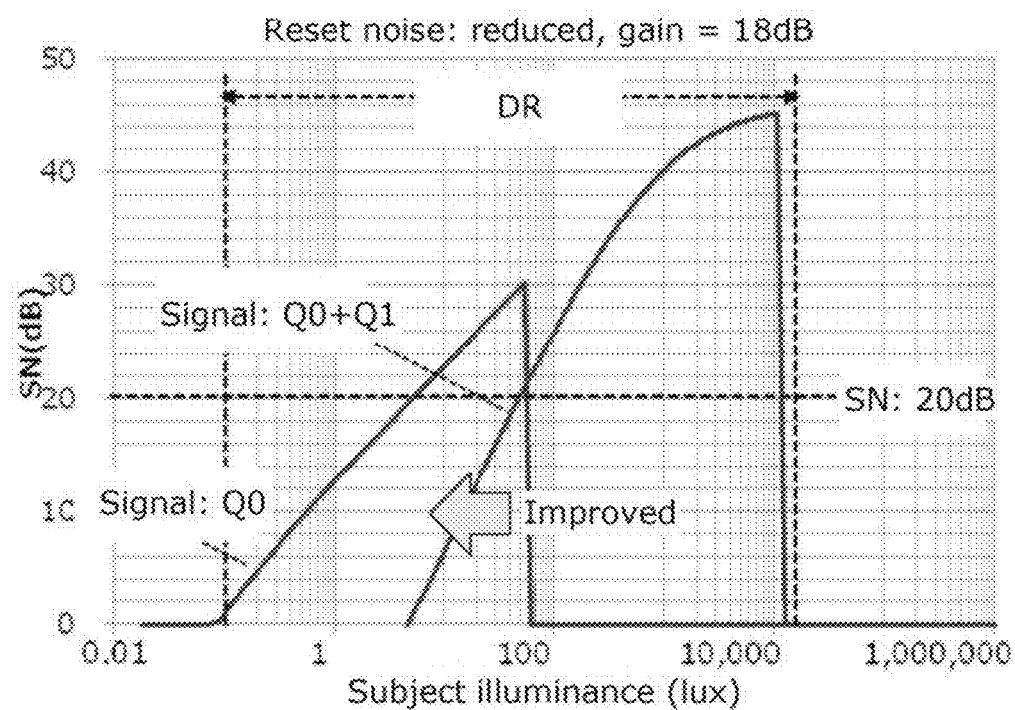
FIG. 30D illustrates the relationship between subject illuminance and gain (SN ratio) in LCG readout according to Embodiment 4.

FIG. 30C and FIG. 30D illustrate the relationship between subject illuminance and gain (SN ratio) in LCG readout according to Embodiment 4. The analog gain is C dB in FIG. 30C and 18 dB in FIG. 30D.

FIG. 30A is an actual result of combination wherein the first Read1 is the long frame (low-illuminance frame) of the WDR and the second Read2 is the short frame (high-illuminance frame) of the WDR. The SN at the connecting part of the frames is at least 20 dB and the dynamic range is at least 120 dB. The dynamic range extends from an extremely dark illuminance (0.1 lux) to an extremely bright illuminance (100,000 lux (equivalent to sunlight)) due to the storage capacity.

WDR circuit 76 included in signal processor 70 is illustrated in greater detail in FIG. 29. The pixel signal (long exposure) of the first low-illuminance frame and the pixel signal (short exposure) of the second high-illuminance frame are combined. This combining achieves a wide dynamic range function (WDR function), or stated differently, functions to extend the dynamic range.

The intra-pixel gain is set high for pixel signals in the frame for the low-illuminance region (i.e., for long exposures) and set low for pixel signals in the frame for the high-illuminance region (i.e., for short exposures), which can also improve noise in low-illuminance conditions and extend the dynamic range in high-illuminance conditions.

Thus, the present embodiment makes it possible to improve both dynamic range and SN while reducing the reset noise of the storage capacitive element.

The correspondence between SN and signal output level is illustrated in FIG. 30A and FIG. 31A, FIG. 30B and FIG. 31B, FIG. 30C and FIG. 31C, and FIG. 30D and FIG. 31D.

Figure 31A:
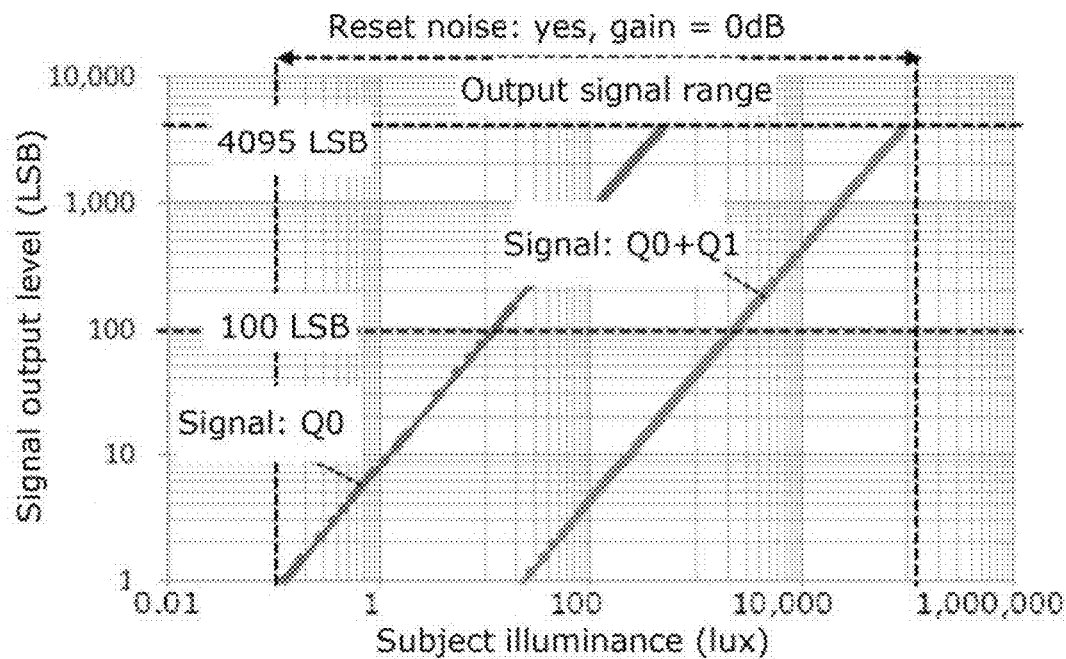
FIG. 31A illustrates the relationship between subject illuminance and signal output level (LSB) in LCG readout when a negative feedback circuit is not provided, as a comparative example.
Figure 31B:
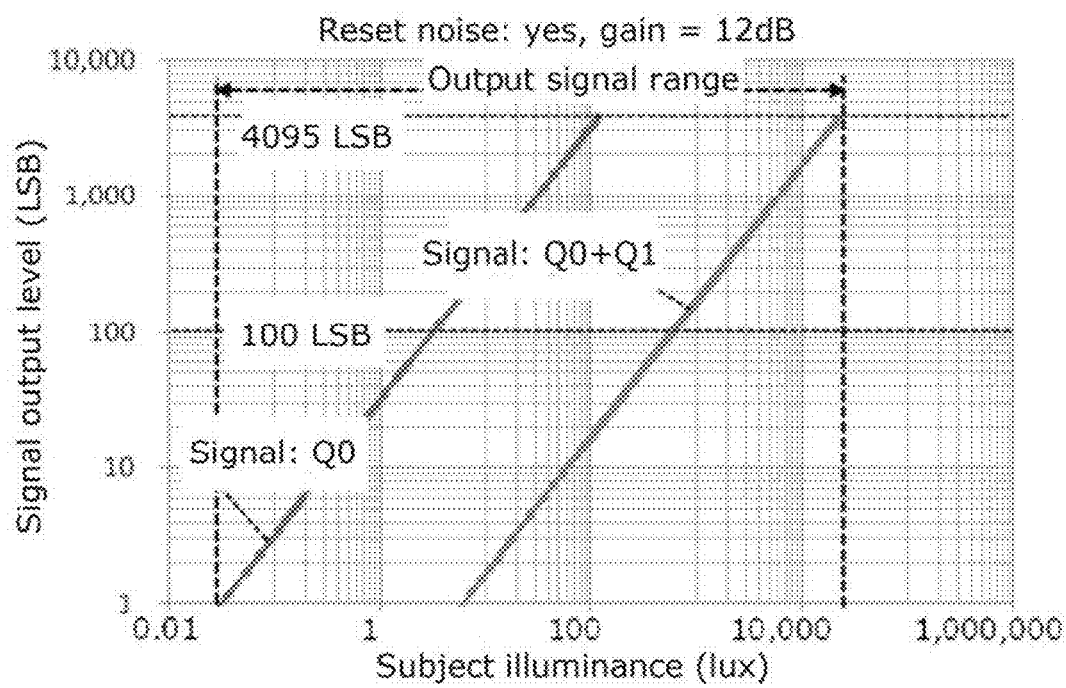
FIG. 31B illustrates the relationship between subject illuminance and signal output level (LSB) in LCG readout when negative feedback circuit 21 is not provided, as a comparative example.

FIG. 31A and FIG. 31B illustrate the relationship between subject illuminance and signal output level (LSB) in LCG readout when negative feedback circuit 21 is not provided, as a comparative example. The analog gain is 0 dB in FIG. 31A and 12 dB in FIG. 31B.

Figure 31C:
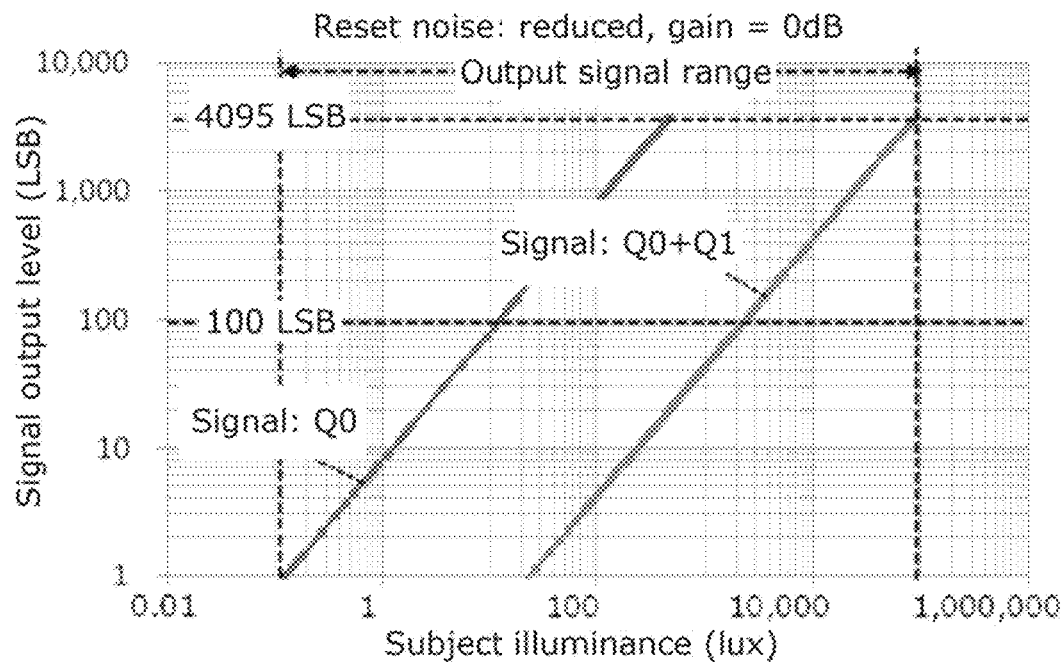
FIG. 31C illustrates the relationship between subject illuminance and signal output level (LSB) in LCG readout according to Embodiment 4.
Figure 31D:
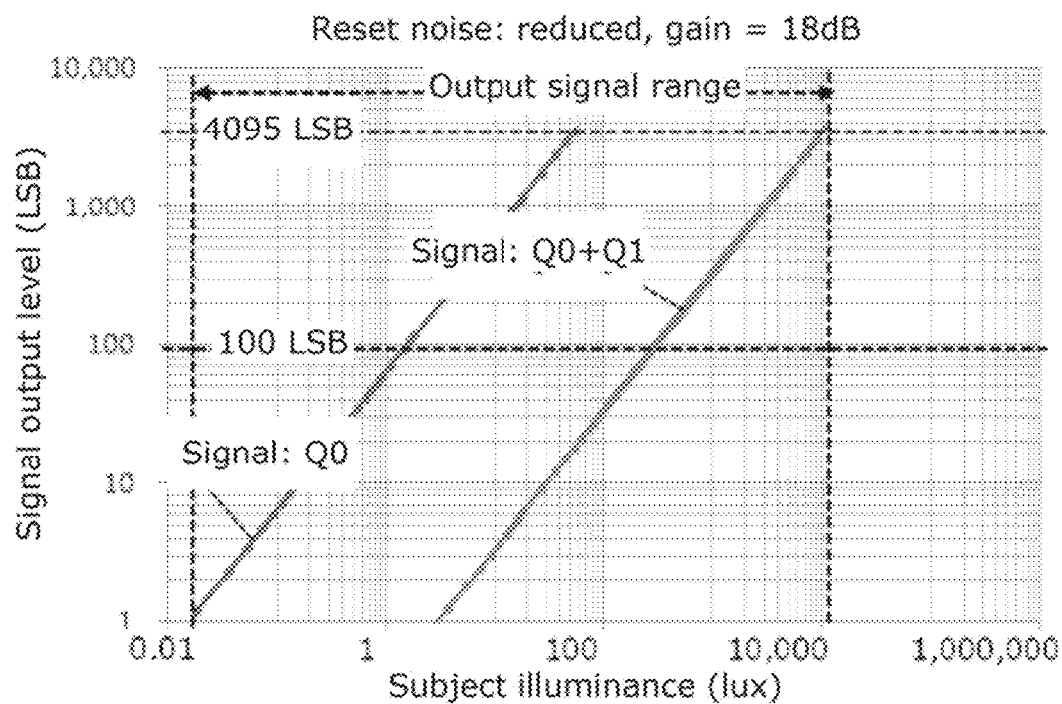
FIG. 31D illustrates the relationship between subject illuminance and signal output level (LSB) in LCG readout according to Embodiment 4.

FIG. 31C and FIG. 31D illustrate the relationship between subject illuminance and signal output level (LSB) in LCG readout according to Embodiment 4. The analog gain is 0 dB in FIG. 31C and 18 dB in FIG. 31D.

In this example, the ADC is a 12-bit ADC, and the signal output level is restricted to 4095 LSB (MSB). First, the low-illuminance frame is used for the low-illuminance region signal, and the low-illuminance region signal increases in proportion to the illuminance and is restricted to 4095 LSB (MSB). Next, the high-illuminance frame is used for the high-illuminance region signal, the high-illuminance region signal increases in proportion to the illuminance and is restricted to 4095 LSB (MSB), and the maximum subject illuminance is determined by this value.

Here, the dynamic range is expressed as maximum subject illuminance-minimum subject illuminance, where the minimum subject illuminance is often defined by SN=1 dB.

Stated differently, the range in which low-illuminance frames are used is a range where the signal level is less than or equal to the MSB when the analog gain is increased. The range in which high-illuminance frames are used is a range where the signal level is less than or equal to the MSB when the analog gain is increased.

Therefore, when the gain is increased, the signal level increases, so the maximum subject illuminance corresponding to this MSB decreases on the low-illuminance side. The issue at this time is the SN degradation at the boundary between the low-illuminance frame and the high-illuminance frame, which is caused by the reset noise in the high-illuminance frame.

In the present embodiment, since this reset noise is reduced by negative feedback circuit 21, usage at a higher gain compared to conventional technology is possible. For example, in the absence of any measures in place, the analog gain could only be extended to 12 dB as illustrated in FIG. 30B. In contrast, when there are measures to reduce reset noise in place, an analog gain of up to 18 dB can be used as illustrated in FIG. 30D. Note that the allowable value for use is SN 20 dB or better.

Embodiment 5

Solid-state imaging apparatus 100 according to Embodiment 5 will be described with a focus on the differences from Embodiment 1C. In one example of a configuration of solid-state imaging apparatus 100, the number of controls for horizontal scan line groups 15 differ from Embodiment 1C, but all other aspects are the same as Embodiment 1C.

While Embodiment 2A and Embodiment 3A included a means for selecting a high-illuminance region signal and a low-illuminance region signal, Embodiment 5 includes a means for combining two frames, one for the high-illuminance region signal and one for the low-illuminance region signal, so the dynamic range can be extended.

[5.1 Pixel Circuit Configuration Example]

Next, an example of a configuration of pixel circuit 3 will be described.

Figure 32:
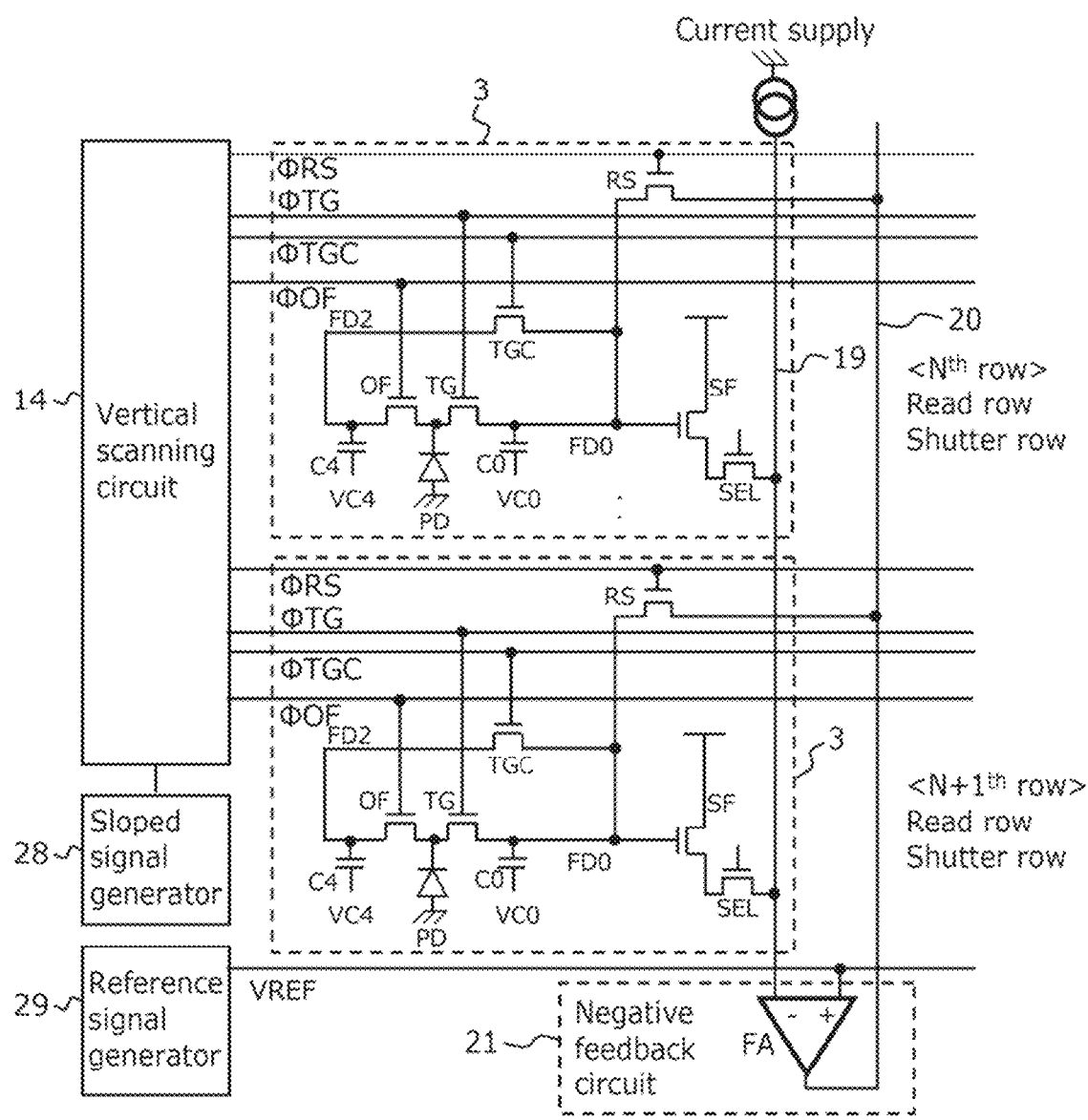
FIG. 32 illustrates a circuit example of a pixel circuit and a negative feedback circuit according to Embodiment 5.

FIG. 32 illustrates a circuit example of pixel circuit 3 and negative feedback circuit 21 according to Embodiment 5. FIG. 27 is equivalent to FIG. 5 of Embodiment 1A, and FIG. 27 is equivalent to FIG. 24 of Embodiment 3A, and is also equivalent to a configuration example including one stage in the vertical direction of the storage circuits in the third configuration example in FIG. 1A. The following description will focus on this point of difference.

[5.2 Readout Operation Example According to Present Embodiment]

Figure 33A:
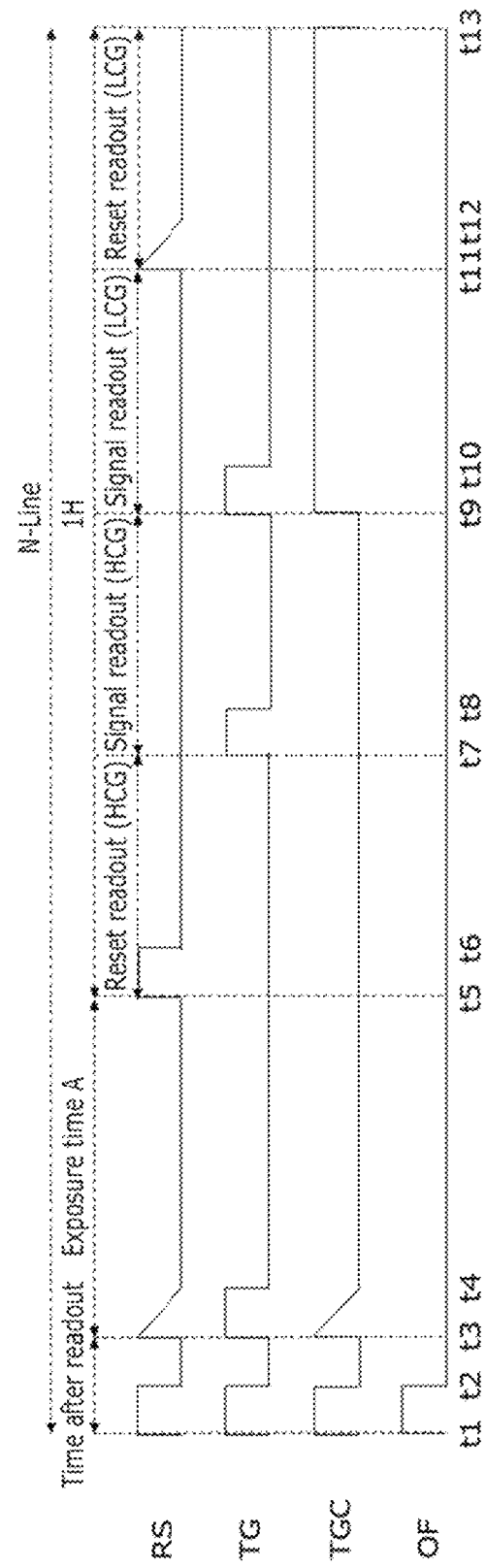
FIG. 33A is a time chart illustrating the readout order of one frame in Embodiment 5.

FIG. 33A is a time chart illustrating the readout order of one frame in Embodiment 5.

The gain that converts the signal charge at floating diffusion layer FD1 into voltage can be selectively switched between a high gain and a low gain according to the on/off state of gain control transistor GC1.

In HCG, the normal CDS order in 1H is HCG (R: reset component) to HCG (S: signal component). This transition results in the readout of signal charge from the photodiode (PD) to floating diffusion layer FD0 with a high conversion gain in floating diffusion layer FD0.

Since this transition is a normal CDS, the reset noise can be canceled to zero.

FIG. 33B illustrates the readout sequence of the reset component and the signal component in the HCG readout and the LCG readout of FIG. 33A. FIG. 33B illustrates CDS order in 1H. In LCG, the sequence is LCG (S: signal component) to LCG (R: reset component). This transition results in the readout of signal charge from storage capacitive element C0 and storage capacitive element C4 to floating diffusion layer FD0 with a low conversion gain in floating diffusion layer FD1.

In LCG, this transition can remove DC-like offsets (reset coupling), but pixel reset noise cannot be canceled and will remain as kTC noise.

The kTC noise in this short exposure (high illuminance) appears on the low illuminance side. For example, this is illustrated in FIG. 30C. Here, kTC noise is expressed as √(kTC) at charge amount. Settings must be configured so that this noise is sufficiently smaller than the signal level. Accordingly, at the boundary between the short exposure (high illuminance) and the long exposure (low illuminance), it is necessary to sufficiently improve the latter SN more than the former SN.

[5.3 Configuration and Operation Examples of Negative Feedback Circuit]

The timing related to the accumulating of charges of photodiode PD and storage capacitive element C1 illustrated in FIG. 11 is the same as in Embodiment 4.

Next, the timing will be described with reference to FIG. 33A.

First, photodiode PD, FD0, and FD1 are reset at time t1 to t2, and the process waits for the exposure to start. Then, from time t3 to t4, the shutter operates to start the exposure. The exposure time ends at time t5.

In HCG, a reset operation is performed between times t5 and t6. The reset components are read out between times t8 and t9. Next, from time t7 to t8, the signal charge stored in the photodiode is transferred to FD0 by transfer signal TG. The signal components are read out between times t8 and t9.

In LCG, from time t9 to t10, the signal charge stored in the photodiode is transferred to FD0 by transfer signal TG. The signal components are read out between times t10 and t11. Next, a reset operation is performed between times t11 and t12. The reset components are read out between times t12 and t13.

Here, reset noise is generated during the shutter period at times t3 and t4, and during the reset period at times t11 and t12. Therefore, during this period, negative feedback circuit 21 works to gradually turn off reset control signal RS and stored charge transfer element TGC, thereby reducing the reset noise. This shows how a sloped signal is applied to the reset transistor (RS) and the stored charge transfer element (TGC).

[5.4 Dynamic Range Extension]

A feature of the present embodiment is that the two frames—the long and short frames—combined to achieve a WDR are exposed at exactly the same timing and the exact same pixels are used, which inhibits false colors, coloring, and blur.

FIG. 16 is an overview of the combining method used within a pixel to achieve a WDR. FIG. 29 illustrates an example of a configuration of a signal processor that combines two frames to achieve a WDR. Combining is carried out to achieve a WDR using the signal charge of Q0 for long exposure (low-illuminance conditions) and the signal charge of (Q0+Q1) for short exposure (high-illuminance conditions).

The product of illuminance and exposure time, illuminance at a certain time, or exposure time at a certain illuminance is represented on the horizontal axes of [1], [2], [3], and [4] in FIG. 16. In [1], charge accumulation level is represented on the vertical axis. In [2], FD potential is represented on the vertical axis. In [3], the value after AD conversion is represented on the vertical axis. In [4], SN is represented on the vertical axis.

FIG. 16 illustrates the signal charge amounts and FD potentials at the first readout, Read1, of the low-illuminance frame, and the second readout, Read2, of the high-illuminance frame.

FIG. 30A through FIG. 30D illustrate the relationship between subject illuminance and gain (SN ratio) according to Embodiment 5.

FIG. 30A is an actual result of combination wherein the first Read1 is the long frame (low-illuminance frame) of the WDR and the second Read2 is the short frame (high-illuminance frame) of the WDR. The SN at the connecting part of the frames is at least 20 dB and the dynamic range is at least 120 dB. The dynamic range extends from an extremely dark illuminance (0.1 lux) to an extremely bright illuminance (100,000 lux (equivalent to sunlight)) due to the storage capacity.

WDR circuit 76 included in signal processor 70 is illustrated in greater detail in FIG. 29. The pixel signal (long exposure) of the first low-illuminance frame and the pixel signal (short exposure) of the second high-illuminance frame are combined. This combining achieves a wide dynamic range function (WDR function), or stated differently, functions to extend the dynamic range.

The intra-pixel gain is set high for pixel signals in the frame for the low-illuminance region (i.e., for long exposures) and set low for pixel signals in the frame for the high-illuminance region (i.e., for short exposures), which can also improve noise in low-illuminance conditions and extend the dynamic range in high-illuminance conditions.

Thus, the present embodiment makes it possible to improve both dynamic range and SN while reducing the reset noise of the storage capacitive element.

In the present embodiment, since this reset noise is reduced by negative feedback circuit 21, usage at a higher gain compared to conventional technology is possible. For example, in the absence of any measure in place, the analog gain could only be extended to 12 dB as illustrated in FIG. 30B. In contrast, when there are measures to reduce reset noise in place, an analog gain of up to 18 dB can be used as illustrated in FIG. 30D. Note that the allowable value for use is SN 20 dB or better.

Embodiment 6

Solid-state imaging apparatus 100 according to Embodiment 6 will be described with a focus on the differences from Embodiment 1A. In one example of a configuration of solid-state imaging apparatus 100, gain control transistor MCG for the pixel has been added to the configuration of Embodiment 1A, and the number of controls for horizontal scan line groups 15 differ from Embodiment 1A, but all other aspects are the same as Embodiment 1A.

While Embodiment 1A included a means for selecting a high-illuminance region signal and a low-illuminance region signal, Embodiment 6 includes a means for combining three frames, one for the high-illuminance region signal, one for the medium-illuminance signal, and one for the low-illuminance region signal. This allows for better SN at the boundaries of the frames, and the reduced reset noise allows for a higher analog gain to be used, resulting in better low-illuminance characteristics.

[6.1 Pixel Circuit Configuration Example]

Next, an example of a configuration of pixel circuit 3 will be described.

Figure 34A:
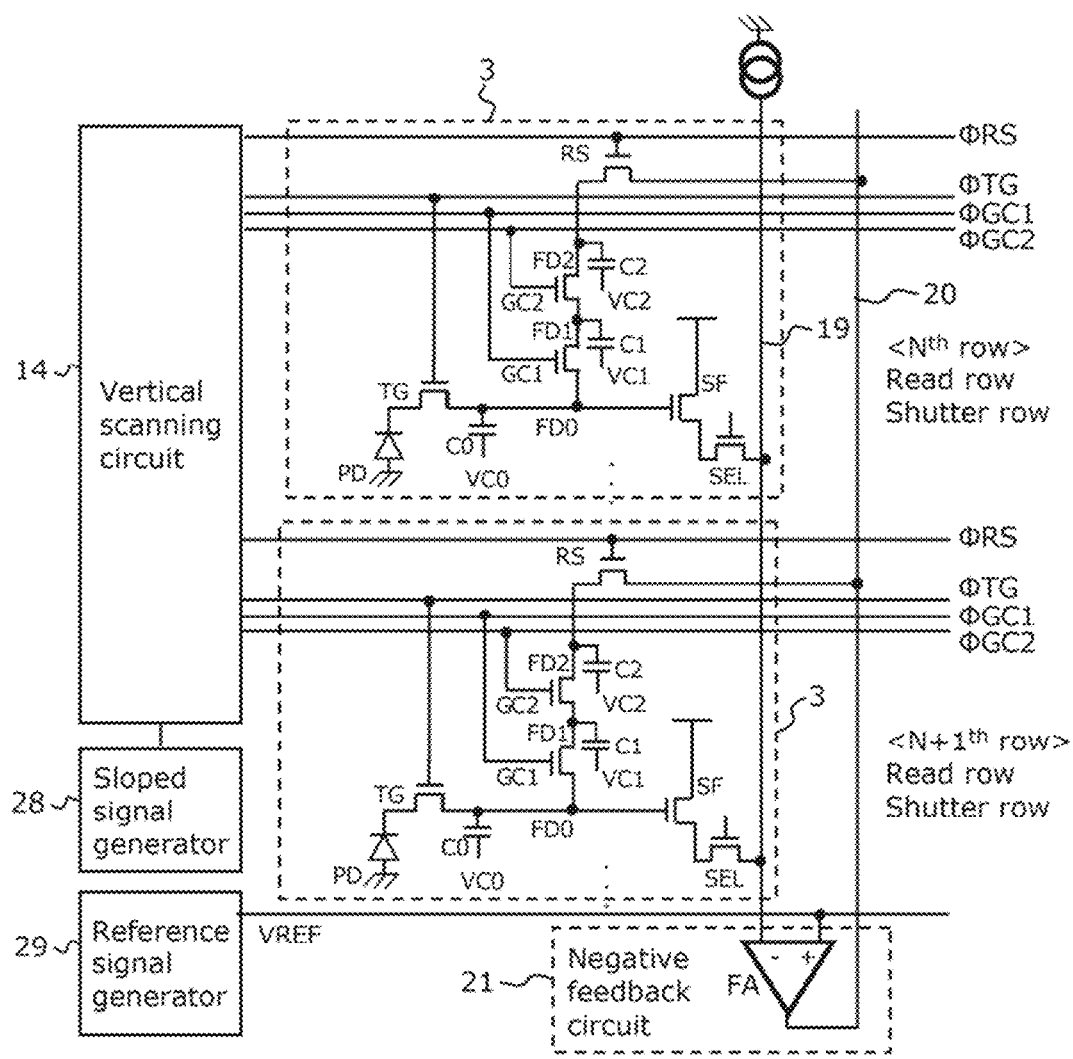
FIG. 34A illustrates a circuit example of a pixel circuit and a negative feedback circuit according to Embodiment 6.

FIG. 34A illustrates a circuit example of pixel circuit 3 and negative feedback circuit 21 according to Embodiment 6. FIG. 34A is equivalent to the first configuration example of FIG. 1A, i.e., the configuration example with two stages of storage circuits in the vertical direction. The following description will focus on this point of difference.

[6.2 Readout Operation Example According to Present Embodiment]

Figure 35A:
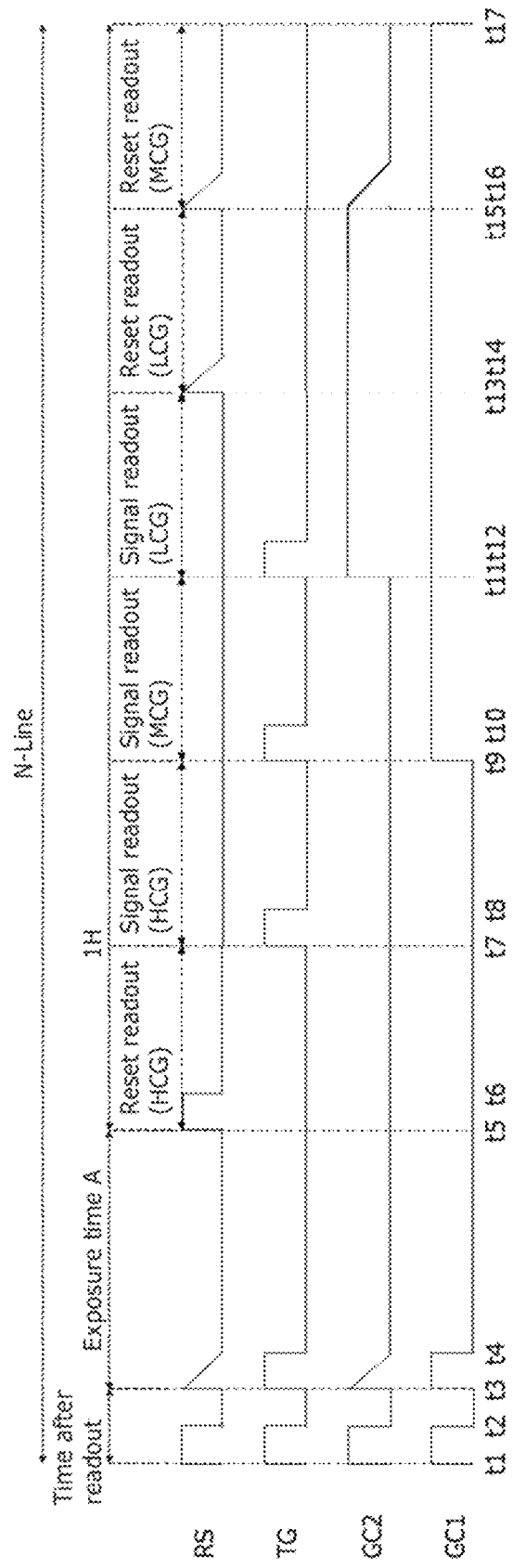
FIG. 35A is a time chart illustrating the readout order of one frame in Embodiment 6.

FIG. 35A illustrates the readout order of one frame in Embodiment 6.

The gain that converts the signal charge at floating diffusion layer FD1 into voltage can be selectively switched between a high gain, a mid gain (MCG) and a low gain according to the on/off state of gain control transistors GC1 and GC2.

In HCG, the normal CDS order in 1H is HCG (R: reset component) to HCG (S: signal component). This transition results in the readout of signal charge from the photodiode (PD) to floating diffusion layer FD0 with a high conversion gain in floating diffusion layer FD0.

Since this transition is a normal CDS, the reset noise can be canceled to zero.

FIG. 35B illustrates the readout sequence of the reset component and the signal component in the HCG readout, the MCG readout, and the LCG readout of FIG. 35A. FIG. 35B illustrates CDS order in 1H. After HCG readout, next is MCG (S: signal component), and in the case of LCG, next is LCG (S: signal component), then LCG (R: reset component), then MCG (R: reset component).

In mid gain (MCG), this transition results in the readout of signal charge from storage capacitive element C0 and storage capacitive element C1 to floating diffusion layer FD0 with a low conversion gain in floating diffusion layer FD1.

In low gain (LCG), this transition results in the readout of signal charge from storage capacitive element C0, storage capacitive element C1, and storage capacitive element C2 to floating diffusion layer FD0 with a low conversion gain in floating diffusion layer FD2.

In MCG and LCG, this transition can remove DC-like offsets (reset coupling), but pixel reset noise cannot be canceled and will remain as kTC noise.

Figure 39A:
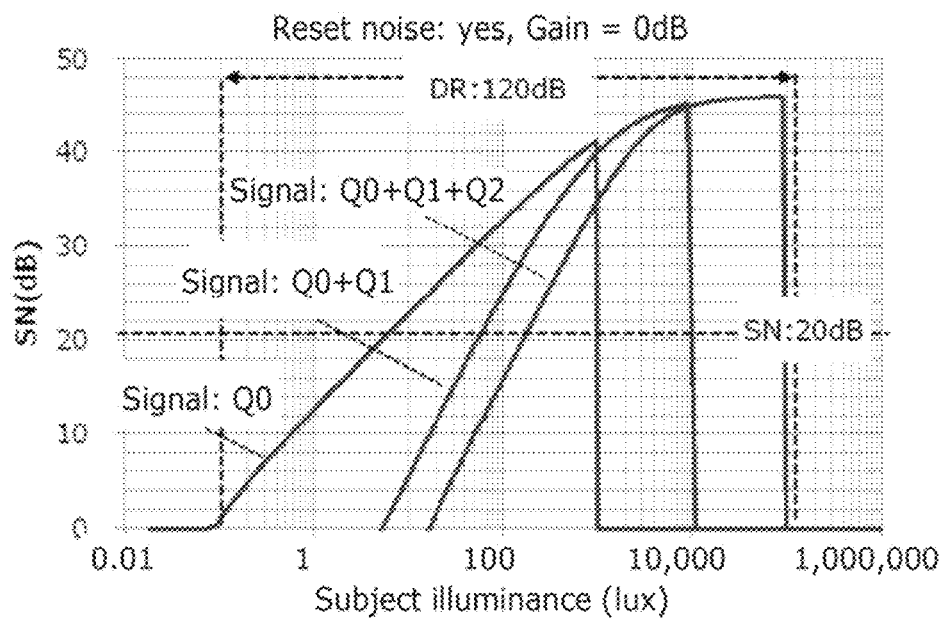
FIG. 39A illustrates the relationship between subject illuminance and gain (SN ratio) in LCG readout when a negative feedback circuit is not provided, as a comparative example.

The kTC noise in this middle exposure (medium illuminance) appears on the medium illuminance side. For example, this is illustrated in FIG. 39A. Here, kTC noise is expressed as $\sqrt{(kTC)}$ at charge amount. Settings must be configured so that this noise is sufficiently smaller than the signal level. Accordingly, at the boundary between the middle exposure (medium illuminance) and the long exposure (low illuminance), it is necessary to sufficiently improve the latter SN more than the former SN.

The kTC noise in this short exposure (high illuminance) appears on the low illuminance side. For example, this is illustrated in FIG. 39A. Here, kTC noise is expressed as $\sqrt{(kTC)}$ at charge amount. Settings must be configured so that this noise is sufficiently smaller than the signal level. Accordingly, at the boundary between the middle exposure (medium illuminance) and the long exposure (low illuminance), it is necessary to sufficiently improve the latter SN more than the former SN.

[6.3 Configuration and Operation Examples of Negative Feedback Circuit]

Figure 36:
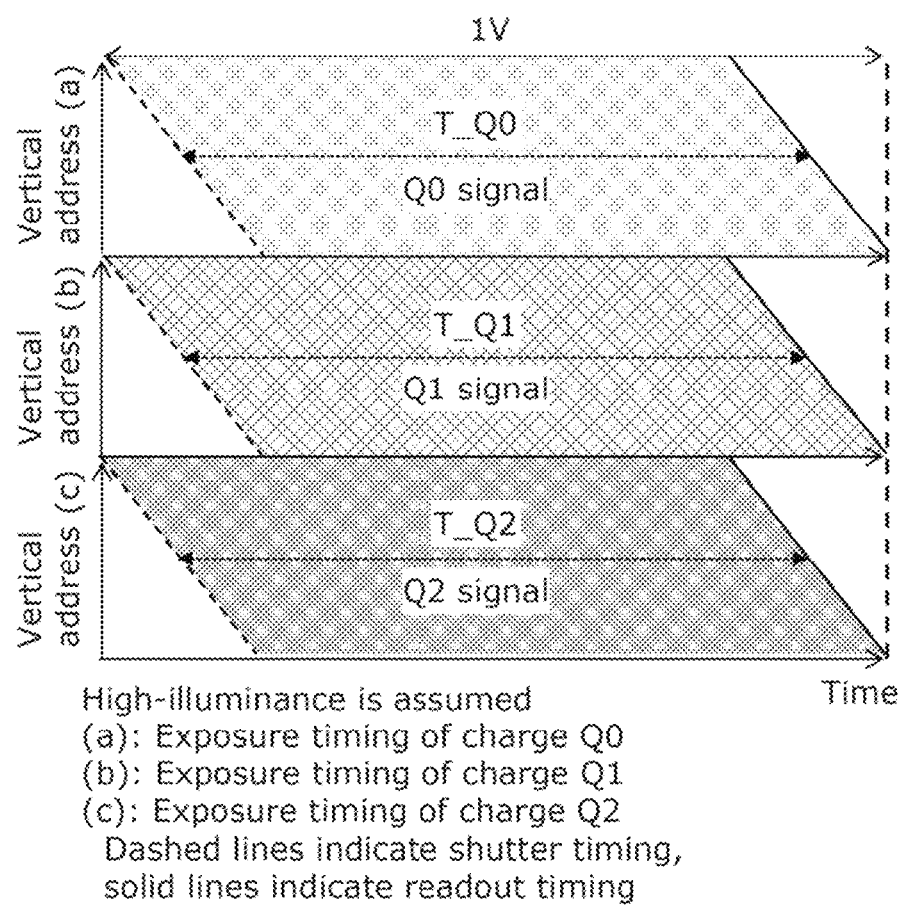
FIG. 36 illustrates one example of timing related to the accumulating of charges of a photodiode and two storage capacitive elements.

FIG. 36 illustrates one example of timing related to the accumulating of charges of photodiode PD and storage capacitive element C1. Photodiode PD is continuously exposed during the 1V period (1 vertical synchronization period) and the charge amount is Q0. The signal of storage capacitive element C1 that receives this charge that overflows from photodiode PD is Q1. The signal of storage capacitive element C2 that receives the charge that further overflows from storage capacitive element C1 is Q2, and Q0, Q1, and Q2 are exposed at exactly the same time.

In the rolling shutter method, resetting is done row by row via row scanning. The exposure is then started and the exposure time is expressed as T_Q0=T_Q1=T_Q2.

Next, one example of the timing will be described with reference to FIG. 35A.

First, photodiode PD and FD0, FD1, and FD2 are reset at time t1 to t2, and the process waits for the exposure to start. Then, from time t3 to t4, the shutter operates to start the exposure. The exposure time ends at time t5.

A reset operation is performed between times t5 and t6. The HCG reset component is read out between times t6 and t7. Next, from time t7 to t8, the signal charge stored in the photodiode is transferred to FD0 by transfer signal TG. The HCG signal component is read out between times t8 and t9.

The signal charge stored in the photodiode at time t9 is transferred to FD1 by turning on transfer signal GC1. From time t9 to t10, the signal charge stored in the photodiode is transferred to FD1 by transfer signal TG. The LCG signal component is read out between times t10 and t11.

The signal charge stored in the photodiode at time t11 is transferred to FD2 by turning on transfer signal GC2. From time t11 to t12, the signal charge stored in the photodiode is transferred to FD1 by transfer signal TG. The LCG signal component is read out between times t12 and t13.

An LCG reset operation is performed between times t13 and t14. The LCG reset component is read out between times t14 and t15.

GC2 is turned off at time t15. An MCG reset operation is performed between times t15 and t16. The MCG reset component is read out between times t16 and t17.

Here, reset noise is generated during the shutter period at times t3 and t4, during the reset period at times t13 and t14, and during the reset period at times t15 and t16. Therefore, during this period, negative feedback circuit 21 works to gradually turn off reset control signal RS and gain control signal GC2, thereby reducing the reset noise. This shows how a sloped signal is applied to the reset transistor (RS) and the gain control signal (GC2).

[6.4 Dynamic Range Extension]

A feature of the present embodiment is that the three frames—the long, middle, and short frames—combined to achieve a WDR are exposed at exactly the same timing and the exact same pixels are used, which inhibits false colors, coloring, and blur.

Figure 34B:
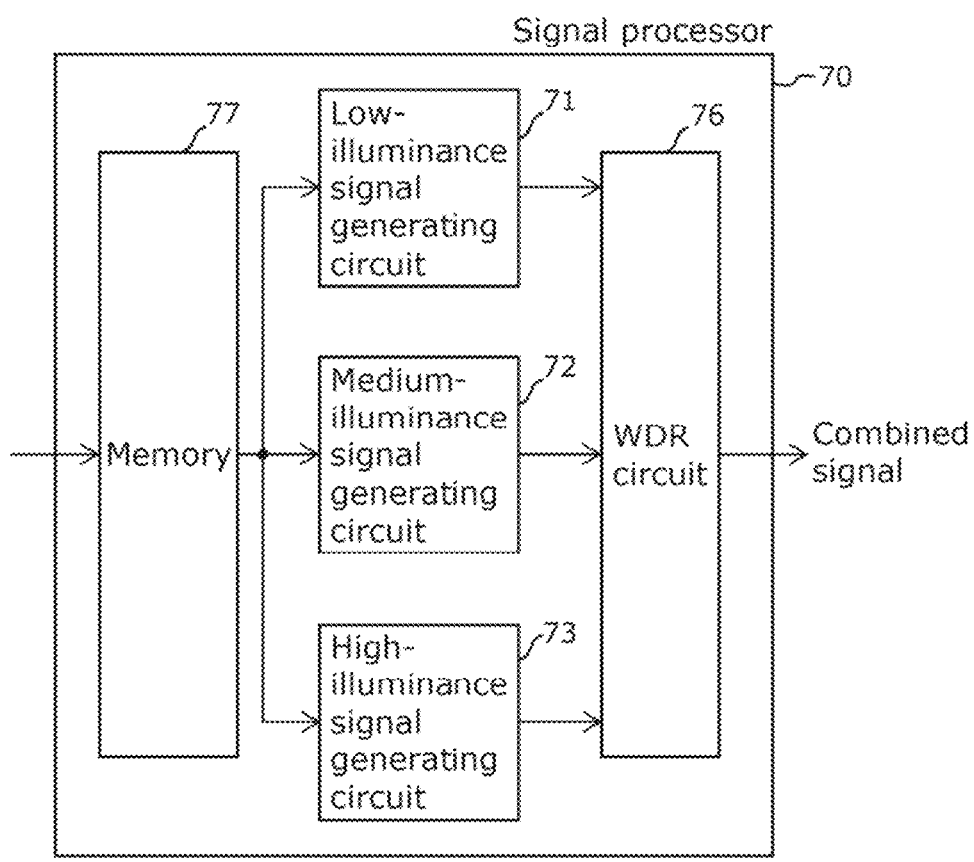
FIG. 34B illustrates an example of a configuration of a signal processor that combines three frames to achieve a WDR.
Figure 37:
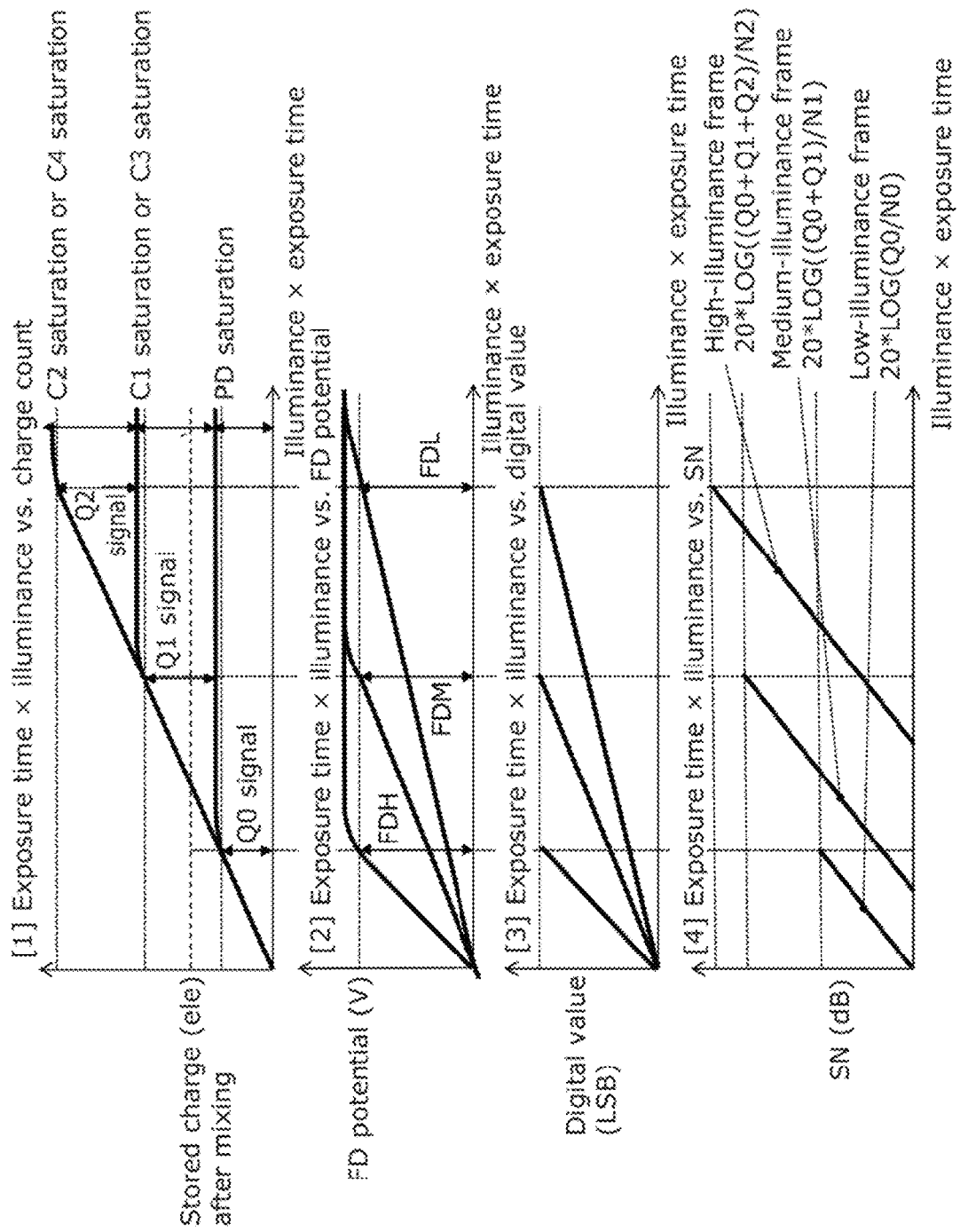
FIG. 37 is an overview of the combining method used within a pixel to achieve a WDR.

FIG. 37 is an overview of the combining method used within a pixel to achieve a WDR. FIG. 34B illustrates an example of a configuration of a signal processor that combines three frames to achieve a WDR. Combining is carried out to achieve a WDR using the signal charge of Q0 for long exposure (low-illuminance conditions), the signal charge of (Q0+Q1) for middle exposure (medium-illuminance conditions) and the signal charge of (Q0+Q1+Q2) for short exposure (high-illuminance conditions).

The product of illuminance and exposure time, illuminance at a certain time, or exposure time at a certain illuminance is represented on the horizontal axes of [1], [2], [3], and [4] in FIG. 37. In [1], charge accumulation level is represented on the vertical axis. In [2], FD potential is represented on the vertical axis. In [3], the value after AD conversion is represented on the vertical axis. In [4], SN is represented on the vertical axis.

FIG. 38 illustrates the FD potentials in the HCG readout, the MCG readout, and the LCG readout in FIG. 37. In other words, FIG. 38 illustrates the signal charge amounts and FD potentials at the first readout, Read1, of the low-illuminance frame, the second readout, Read2, of the medium-illuminance frame, and the third readout, Read3, of the high-illuminance frame.

FIG. 39A through FIG. 39D illustrate the relationship between subject illuminance and gain (SN ratio) according to Embodiment 6.

Figure 39B:
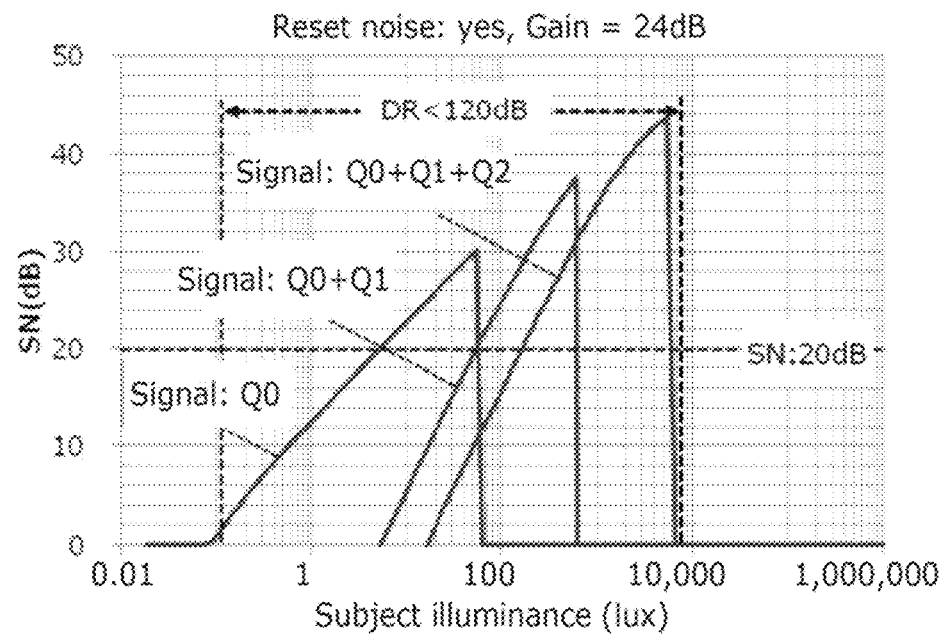
FIG. 39B illustrates the relationship between subject illuminance and gain (SN ratio) in LCG readout when a negative feedback circuit is not provided, as a comparative example.

FIG. 39A and FIG. 39B illustrate the relationship between subject illuminance and gain (SN ratio) in LCG readout when negative feedback circuit 21 is not provided, as a comparative example. The analog gain is 0 dB in FIG. 39A and 24 dB in FIG. 39B.

Figure 39C:
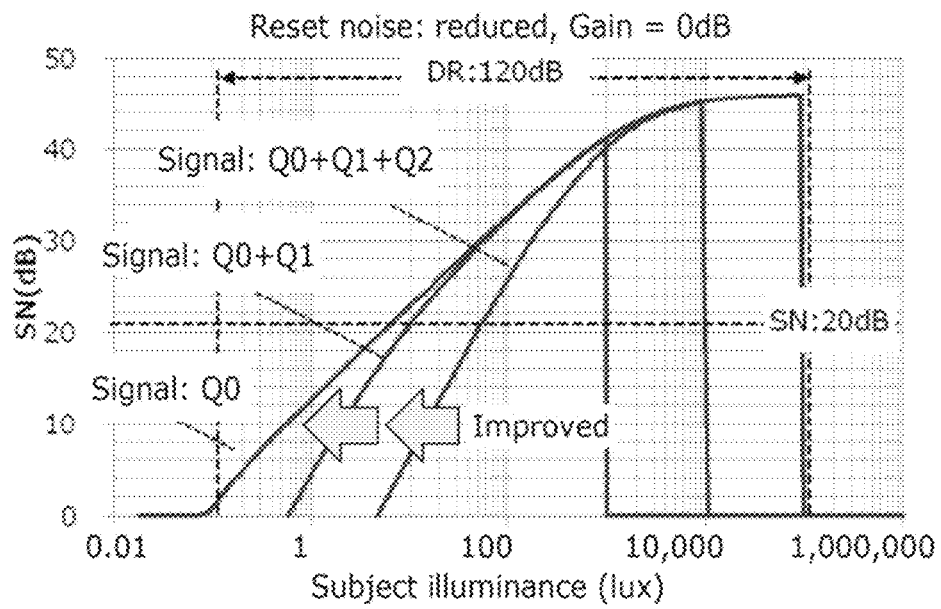
FIG. 39C illustrates the relationship between subject illuminance and gain (SN ratio) in LCG readout according to Embodiment 6.
Figure 39D:
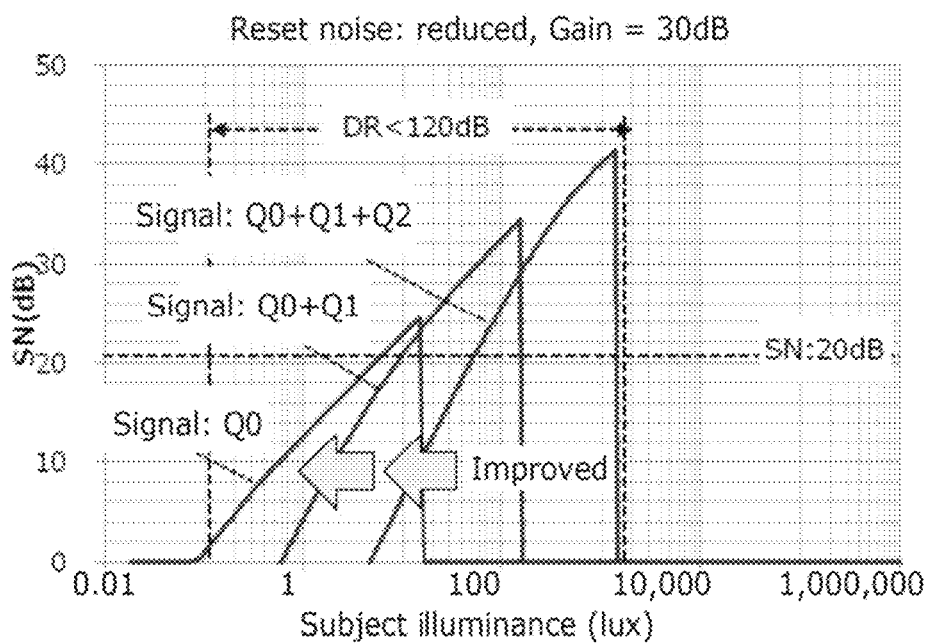
FIG. 39D illustrates the relationship between subject illuminance and gain (SN ratio) in LCG readout according to Embodiment 6.

FIG. 39C and FIG. 39D illustrate the relationship between subject illuminance and gain (SN ratio) in LCG readout according to Embodiment 6. The analog gain is 0 dB in FIG. 39C and 30 dB in FIG. 39D.

FIG. 39A is an actual result of combination wherein the first Read1 is the long frame (low-illuminance frame) of the WDR, the second Read2 is the middle frame (medium-illuminance frame) of the WDR, and the third Read3 is the short frame (high-illuminance frame) of the WDR. The SN at the connecting part of the frames is at least 20 dB and the dynamic range is at least 120 dB. The dynamic range extends from an extremely dark illuminance (0.1 lux) to an extremely bright illuminance (100,000 lux (equivalent to sunlight)) due to the storage capacity.

WDR circuit 76 included in signal processor 70 is illustrated in greater detail in FIG. 34B. The pixel signal (long exposure) of the first low-illuminance frame, the pixel signal (middle exposure) of the second medium-illuminance frame, and the pixel signal (short exposure) of the third high-illuminance frame are combined. This combining achieves a wide dynamic range function (WDR function), or stated differently, functions to extend the dynamic range.

The intra-pixel gain is set high for pixel signals in the frame for the low-illuminance region (i.e., for long exposures), set medium for pixel signals in the frame for the medium-illuminance region (i.e., for middle exposures), and set low for pixel signals in the frame for the high-illuminance region (i.e., for short exposures), which can also improve noise in low-illuminance conditions and extend the dynamic range in high-illuminance conditions.

Thus, the present embodiment makes it possible to improve both dynamic range and SN while reducing the reset noise of the storage capacitive element.

In the present embodiment, since this reset noise is reduced by negative feedback circuit 21, usage at a higher gain compared to conventional technology is possible. For example, in the absence of any measure in place, the analog gain could only be extended to 24 dB as illustrated in FIG. 39B. In contrast, when there are measures to reduce reset noise in place, an analog gain of up to 30 dB can be used as illustrated in FIG. 39D. Note that the allowable value for use is SN 20 dB or better.

Embodiment 7

Solid-state imaging apparatus 100 according to Embodiment 7 will be described with a focus on the differences from Embodiment 3. In one example of a configuration of solid-state imaging apparatus 100, gain control transistor MCG for the pixel has been added to the configuration of Embodiment 3, and the number of controls for horizontal scan line groups 15 differ from Embodiment 3, but all other aspects are the same as Embodiment 3.

While Embodiment 3A included a means for selecting a high-illuminance region signal and a low-illuminance region signal, Embodiment 7 includes a means for combining three frames, one for the high-illuminance region signal, one for the medium-illuminance signal, and one for the low-illuminance region signal. This allows for better SN at the boundaries of the frames, and the reduced reset noise allows for a higher analog gain to be used, resulting in better low-illuminance characteristics.

[7.1 Pixel Circuit Configuration Example]

Next, an example of a configuration of pixel circuit 3 will be described.

Figure 40:
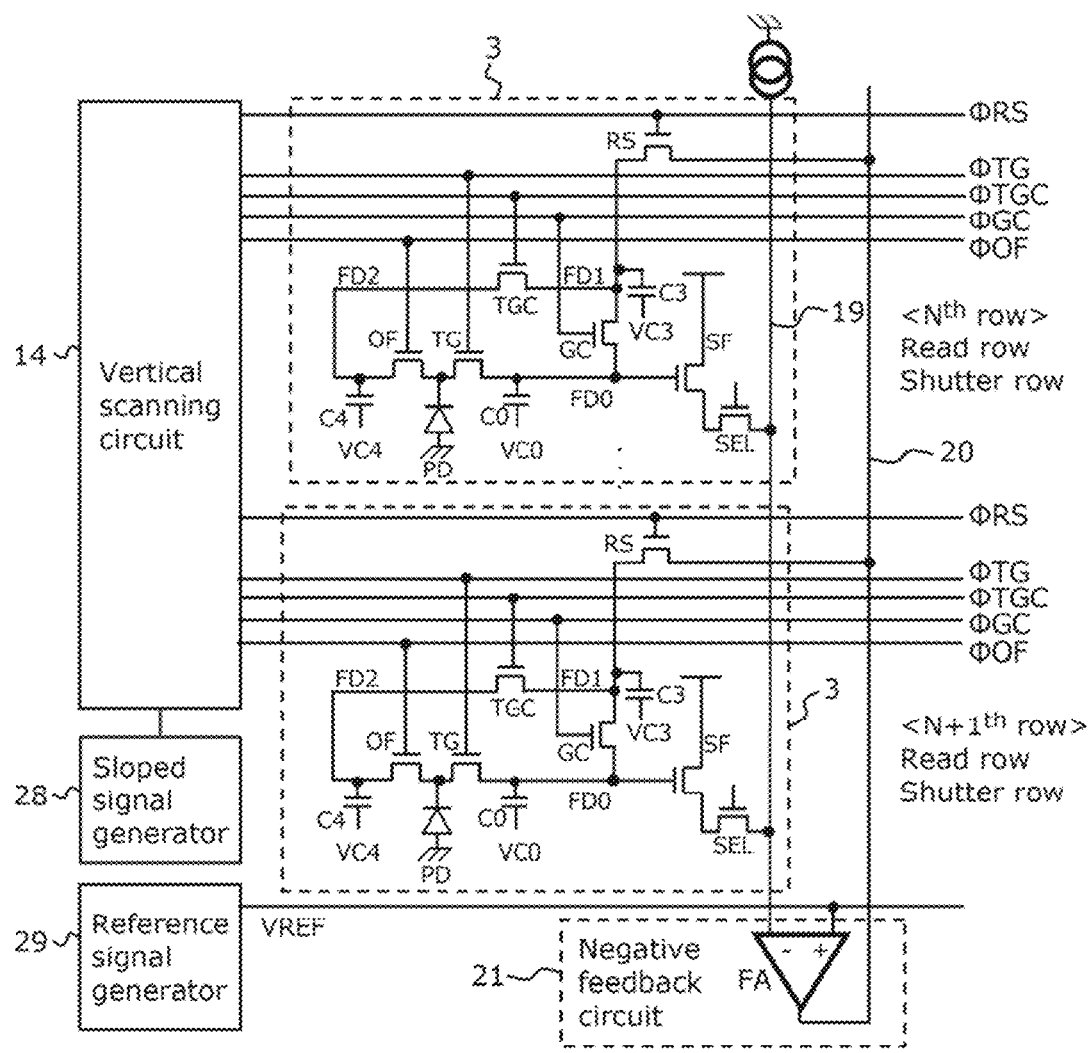
FIG. 40 illustrates a circuit example of a pixel circuit and a negative feedback circuit according to Embodiment 7.

FIG. 40 illustrates a circuit example of pixel circuit 3 and negative feedback circuit 21 according to Embodiment 7. FIG. 40 is equivalent to the third configuration example of FIG. 1C, i.e., the configuration example with two stages of storage circuits in the horizontal direction. The following description will focus on this point of difference.

[7.2 Readout Operation Example According to Present Embodiment]

Figure 41A:
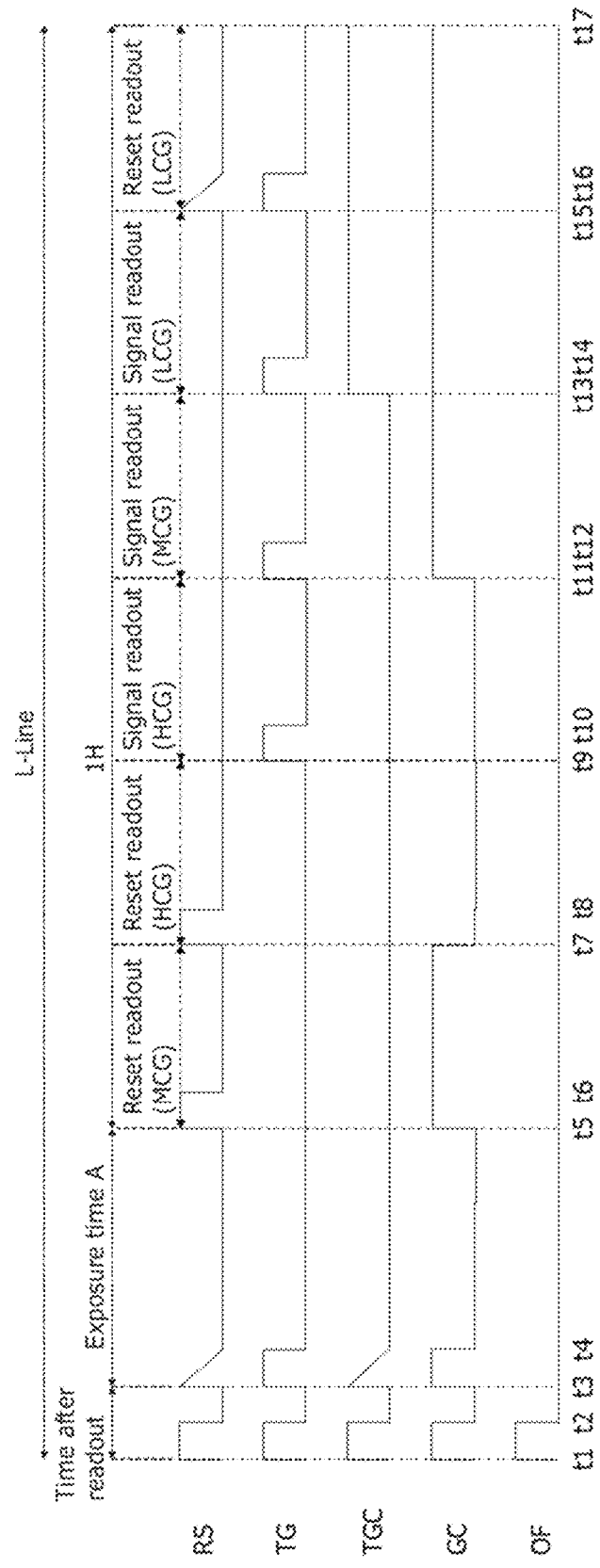
FIG. 41A is a time chart illustrating the readout order of one frame in Embodiment 7.

FIG. 41A is a time chart illustrating the readout order of one frame in Embodiment 7.

The gain that converts the signal charge at floating diffusion layer FD1 into voltage can be selectively switched between a high gain, a mid gain (MCG) and a low gain according to the on/off state of gain control transistor GC and storage transfer transistor TGC1.

In HCG, the normal CDS order in 1H is HCG (R: reset component) to HCG (S: signal component). This transition results in the readout of signal charge from the photodiode (PD) to floating diffusion layer FD0 with a high conversion gain in floating diffusion layer FD0.

Since this transition is a normal CDS, the reset noise can be canceled to zero.

FIG. 41B illustrates the readout sequence of the reset component and the signal component in the HCG readout, the MCG readout, and the LCG readout of FIG. 41A. FIG. 41B illustrates CDS order in 1H. The readout sequence is MCG (R: reset component) to HCG (R: reset component) to HCG (S: signal component) to MCG (S: signal component) to LCG (S: signal component) to LCG (R: reset component).

In mid gain (MCG), this transition results in the readout of signal charge from storage capacitive element C0 and storage capacitive element C3 to floating diffusion layer FD0 with a low conversion gain in floating diffusion layer FD1.

In low gain (LCG), this transition results in the readout of signal charge from storage capacitive element C0, storage capacitive element C3, and storage capacitive element C4 to floating diffusion layer FD0 with a low conversion gain in floating diffusion layer FD2.

In LCG, this transition can remove DC-like offsets (reset coupling), but pixel reset noise cannot be canceled and will remain as kTC noise.

The kTC noise in this short exposure (high illuminance) appears on the low illuminance side. For example, this is illustrated in FIG. 18B. Here, kTC noise is expressed as √(kTC) at charge amount. Settings must be configured so that this noise is sufficiently smaller than the signal level. Accordingly, at the boundary between the middle exposure (medium illuminance) and the long exposure (low illuminance), it is necessary to sufficiently improve the latter SN more than the former SN.

[7.3 Configuration and Operation Examples of Negative Feedback Circuit]

FIG. 36 illustrates one example of timing related to the accumulating of charges of photodiode PD and the two storage capacitive elements C1 and C2, Photodiode PD is continuously exposed during the 1V period (1 vertical synchronization period) and the charge amount is Q0. The signal of storage capacitive element C1 that receives this charge that overflows from photodiode PD is Q1. The signal of storage capacitive element C4 that receives the charge that further overflows from storage capacitive element C1 is Q2, and Q0, Q1, and Q2 are exposed at exactly the same time.

In the rolling shutter method, resetting is done row by row via row scanning. The exposure is then started and the exposure time is expressed as T_Q0=T_Q1=T_Q2.

Next, one example of the timing will be described with reference to FIG. 41A.

First, photodiode PD and FD0, FD1, and FD2 are reset at time t1 to t2, and the process waits for the exposure to start. Then, from time t3 to t4, the shutter operates to start the exposure. The exposure time ends at time t5.

First, at time t5, gain control signal GC1 is turned on to transfer the charge to FD1. A reset operation is performed between times t5 and t6. The HCG reset component is read out between times t6 and t7.

Next, a reset operation is performed between times t7 and t8. The HCG reset component is read out between times t8 and t9.

Next, from time t9 to t10, the signal charge stored in the photodiode is transferred to FD0 by transfer signal TG. The HCG signal component is read out between times t10 and t11.

The signal charge stored in the photodiode at time t11 is transferred to FD1 by turning on transfer signal GC1. From time t11 to t12, the signal charge stored in the photodiode is transferred to FD1 by transfer signal TG. The HCG signal component is read out between times t12 and t13.

The signal charge stored in the photodiode at time t13 is transferred to FD2 by turning on storage transfer transistor TGC. From time t13 to t14, the signal charge stored in storage capacitive element C2 is transferred to FD2 by transfer signal TGC. The LCG signal component is read out between times t14 and t15.

A reset operation is performed between times t15 and t16. The MCG reset component is read out between times t16 and t17.

Each transistor is turned off at time t16.

Here, reset noise is generated during the shutter period at times t3 and t4, and during the reset period at times t15 and t16. Therefore, during this period, negative feedback circuit 21 works to gradually turn off reset control signal RS and stored charge transfer element TGC, thereby reducing the reset noise. This shows how a sloped signal is applied to the reset transistor (RS) and the stored charge transfer element (TGC).

[7.4 Dynamic Range Extension]

A feature of the present embodiment is that the three frames—the long, middle, and short frames—combined to achieve a WDR are exposed at exactly the same timing and the exact same pixels are used, which inhibits false colors, coloring, and blur.

FIG. 37 is an overview of the combining method used within a pixel to achieve a WDR. FIG. 34B illustrates an example of a configuration of a signal processor that combines three frames to achieve a WDR. Combining is carried out to achieve a WDR using the signal charge of Q0 for long exposure (low-illuminance conditions), the signal charge of (Q0+Q1) for middle exposure (medium-illuminance conditions) and the signal charge of (Q0+Q1+Q2) for short exposure (high-illuminance conditions).

The product of illuminance and exposure time, illuminance at a certain time, or exposure time at a certain illuminance is represented on the horizontal axes of [1], [2], [3], and [4] in FIG. 37. In [1], charge accumulation level is represented on the vertical axis. In [2], FD potential is represented on the vertical axis. In [3], the value after AD conversion is represented on the vertical axis. In [4], SN is represented on the vertical axis.

FIG. 37 illustrates the signal charge amount and FD potential at the first readout, Read1, of the low-illuminance frame, the second readout, Read2, of the medium-illuminance frame, and the third readout, Read3, of the high-illuminance frame.

FIG. 39A through FIG. 39D illustrate the relationship between subject illuminance and gain (SN ratio) according to Embodiment 7.

FIG. 39A and FIG. 39B illustrate the relationship between subject illuminance and gain (SN ratio) in LCG readout when negative feedback circuit 21 is not provided, as a comparative example. The analog gain is 0 dB in FIG. 39A and 24 dB in FIG. 39B.

FIG. 39C and FIG. 39D illustrate the relationship between subject illuminance and gain (SN ratio) in LCG readout according to Embodiment 6. The analog gain is 0 dB in FIG. 39C and 30 dB in FIG. 39D.

FIG. 39A is an actual result of combination wherein the first Read1 is the long frame (low-illuminance frame) of the WDR, the second Read2 is the middle frame (medium-illuminance frame) of the WDR, and the third Read3 is the short frame (high-illuminance frame) of the WDR. The SN at the connecting part of the frames is at least 20 dB and the dynamic range is at least 120 dB. The dynamic range extends from an extremely dark illuminance (0.1 lux) to an extremely bright illuminance (100,000 lux (equivalent to sunlight)) due to the storage capacity.

WDR circuit 76 included in signal processor 70 is illustrated in greater detail in FIG. 34B. The pixel signal (long exposure) of the first low-illuminance frame, the pixel signal (middle exposure) of the second medium-illuminance frame, and the pixel signal (short exposure) of the third high-illuminance frame are combined. This combining achieves a wide dynamic range function (WDR function), or stated differently, functions to extend the dynamic range.

The intra-pixel gain is set high for pixel signals in the frame for the low-illuminance region (i.e., for long exposures), set medium for pixel signals in the frame for the medium-illuminance region (i.e., for middle exposures), and set low for pixel signals in the frame for the high-illuminance region (i.e., for short exposures), which can also improve noise in low-illuminance conditions and extend the dynamic range in high-illuminance conditions.

Thus, the present embodiment makes it possible to improve both dynamic range and SN while reducing the reset noise of the storage capacitive element.

Embodiment 8

Embodiment 6 includes one feedback amplifier because the read and shutter rows have the same readout due to 1V exposure, while Embodiment 8 is directed to readout when there are two feedback amplifiers because the read and shutter rows are not the same. Each can independently produce negative feedback, allowing the exposure time to be set freely and multiple times within one frame period.

[8.1 Pixel Circuit Configuration Example]

Next, an example of a configuration of pixel circuit 3 will be described.

Figure 42:
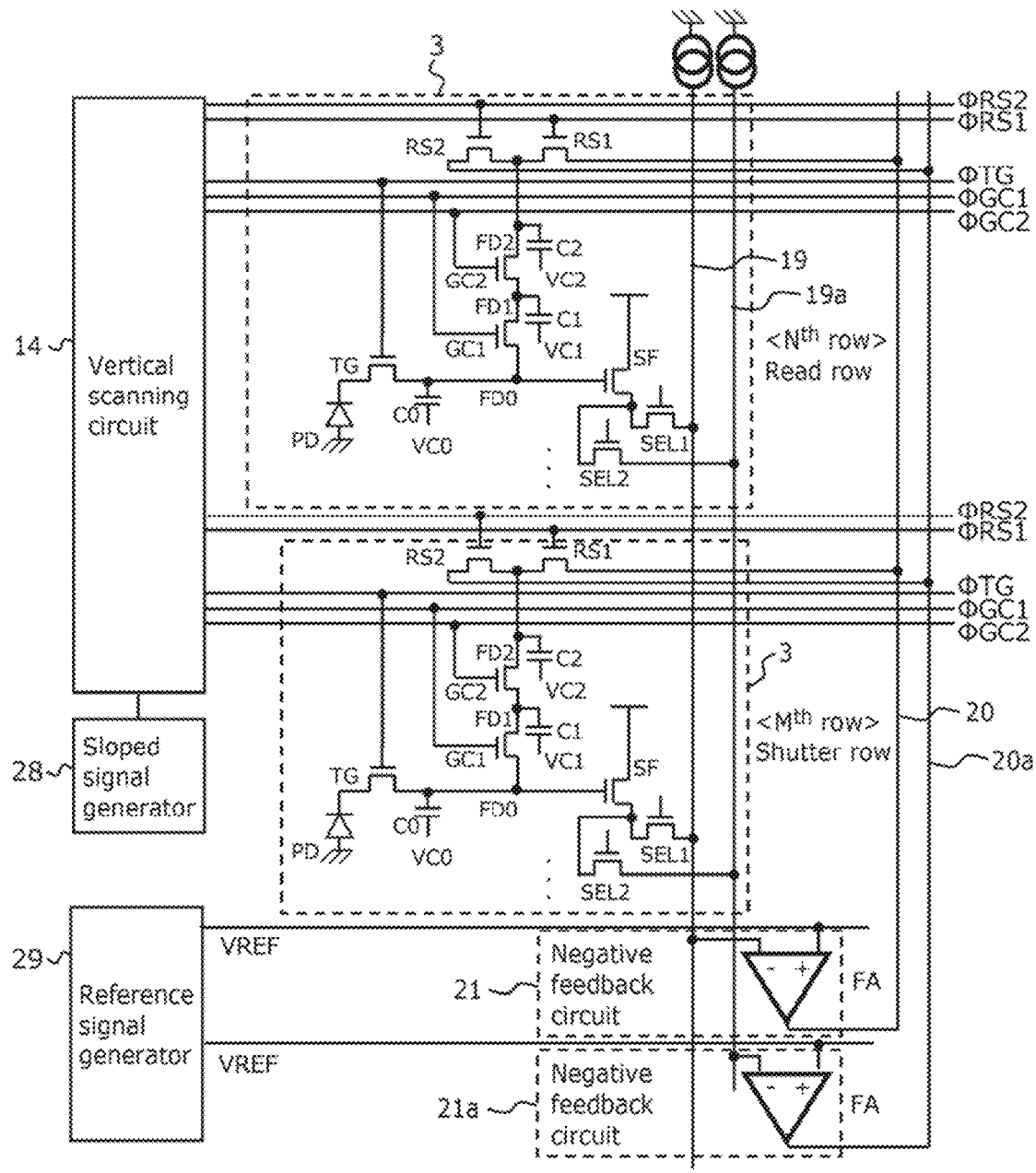
FIG. 42 illustrates a circuit example of a pixel circuit and a negative feedback circuit according to Embodiment 8.

FIG. 42 illustrates a circuit example of pixel circuit 3 and negative feedback circuit 21 according to Embodiment 8. FIG. 42 differs from the first configuration example of FIG. 1A and the configuration example of FIG. 32 according to Embodiment 5 in regard to the addition of second reset transistor RS2, selection transistor SEL2, a current supply, and negative feedback circuit 21a.

This configuration allows for resetting of two different pixel rows via negative feedback by negative feedback circuits 21 and 21a. For example, a reset can be performed on one row at the start of exposure and a reset can be performed on another row at readout.

The following will focus on this difference.

[8.2 Readout Operation Example According to Present Embodiment]

Figure 43A:
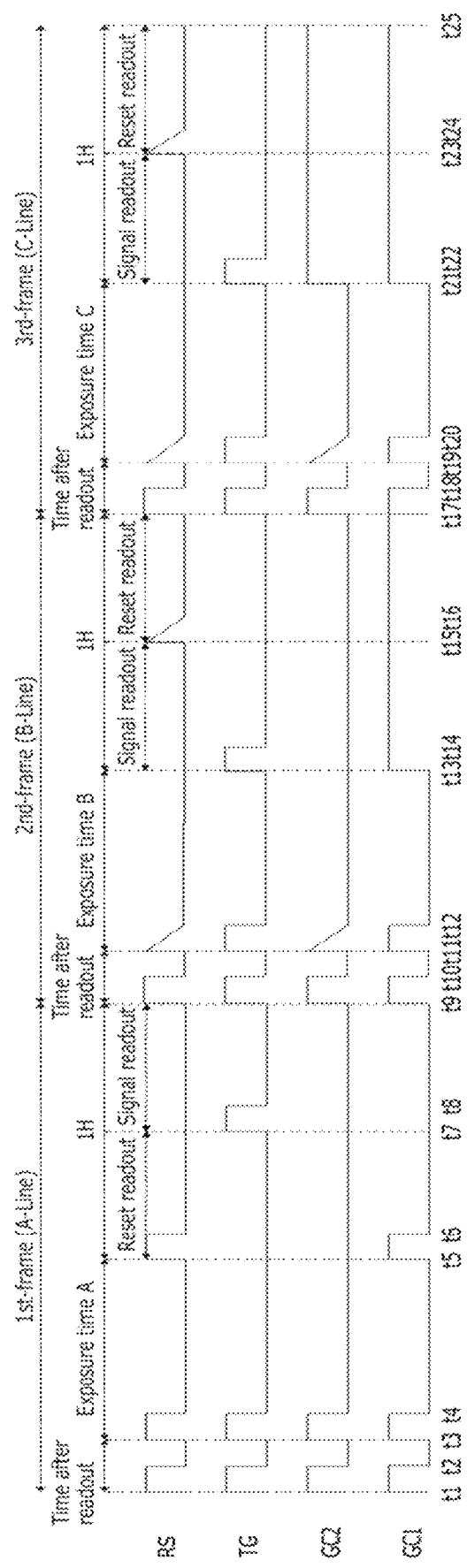
FIG. 43A is a time chart illustrating the readout order of one frame in Embodiment 8.

FIG. 43A is a time chart illustrating the readout order of one frame in Embodiment 8A.

The gain that converts the signal charge at floating diffusion layer FD1 into voltage can be selectively switched between a high gain, a mid gain (MCG) and a low gain (LCG) according to the on/off state of gain control transistors GC1 and GC2.

In HCG, the normal CDS order in 1H is HCG (R: reset component) to HCG (S: signal component). This transition results in the readout of signal charge from photodiode PD to floating diffusion layer FD0 with a high conversion gain in floating diffusion layer FD0. Since this transition is a normal CDS, the reset noise can be canceled to zero.

In MCG, the sequence is MCG (R: reset component) to MCG (S: signal component). This transition results in the readout of signal charge from photodiode PD to floating diffusion layers FD0 and FD1 with a medium conversion gain in floating diffusion layer FD0.

In LCG, the sequence is LCG (R: reset component) to LCG (S: signal component). This transition results in the readout of signal charge from photodiode PD to floating diffusion layers FD0, FD1, and FD2 with a medium conversion gain in floating diffusion layer FD0. Since this transition is not a normal CDS, the reset noise cannot be canceled, but is reduced using negative feedback circuit 21.

FIG. 43B illustrates the readout sequence of the reset component and the signal component in the HCG readout, the MCG readout, and the LCG readout of FIG. 43A. FIG. 43B illustrates CDS order in 1H. The readout sequence is HCG (R: reset component) to HCG (S: signal component) to MCG (S: signal component) to MCG (R: reset component) to LCG (S: signal component) to LCG (R: reset component).

This MCG and LCG transition can remove DC-like offsets (reset coupling), but pixel reset noise cannot be canceled and will remain as kTC noise.

The kTC noise in this middle exposure (medium illuminance) appears on at medium illuminance. Here, kTC noise is expressed as $\sqrt{(kTC)}$ at charge amount. Settings must be configured so that this noise is sufficiently smaller than the signal level. Accordingly, at the boundary between the middle exposure (medium illuminance) and the long exposure (low illuminance), it is necessary to sufficiently improve the latter SN more than the former SN.

The kTC noise in this short exposure (high illuminance) appears on the low illuminance side. Here, kTC noise is expressed as $\sqrt{(kTC)}$ at charge amount. Settings must be configured so that this noise is sufficiently smaller than the signal level. Accordingly, at the boundary between the middle exposure (medium illuminance) and the long exposure (low illuminance), it is necessary to sufficiently improve the latter SN more than the former SN.

[8.3 Configuration and Operation Examples of Negative Feedback Circuit]

Figure 44:
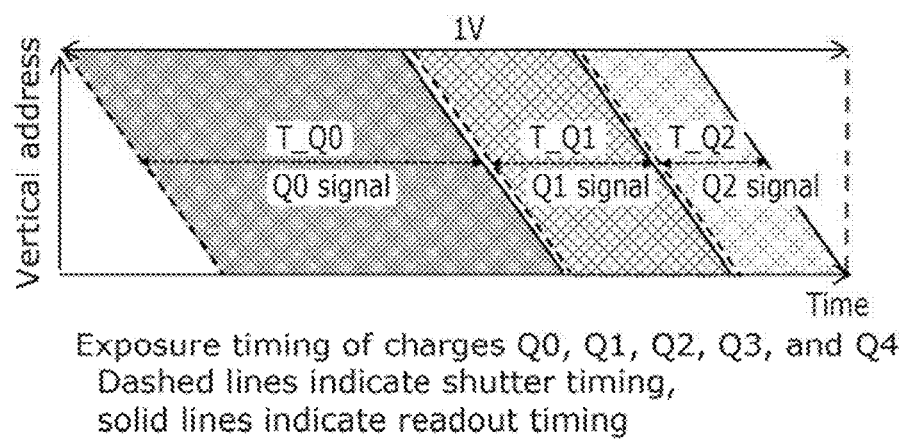
FIG. 44 illustrates one example of timing related to the accumulating of charges of a photodiode and two storage capacitive elements.

FIG. 44 illustrates one example of timing related to the accumulating of charges of photodiode PD, storage capacitive element C1, and storage capacitive element C2. With the same accumulation time for PD, C1, and C2, the first exposure time is T_Q0, the second exposure time is T_Q1, the third exposure time is T_Q2, and the 1V period (one vertical synchronization period) is continuously exposed in the relationship T_Q0>T_Q1>T_Q2.

When the charge of photodiode PD is expressed as Q0, the charge of storage capacitive element C1 is expressed as Q1, and the charge of storage capacitive element C2 is expressed as Q2, a signal charge of Q0 is accumulated at T_Q0, a signal charge of Q0+Q1 is accumulated at T_Q1, and a signal charge of Q0+Q1+Q2 is accumulated at T_Q2.

In the rolling shutter method, resetting is done row by row via row scanning. The charge from the photodiode is read out row by row to storage capacitive elements C1 and C2. The signal charges of storage capacitive elements C1 and C2 are then read out using the rolling shutter method.

Next, one example of the timing will be described with reference to FIG. 43A.

First, photodiode PD and FD0, FD1, and FD2 are reset at time t1 to t2, and the process waits for the exposure to start. Then, from time t3 to t4, the shutter operates to start the exposure. The exposure time ends at time t5.

A reset operation is performed between times t5 and t6. The HCG reset component is read out between times t6 and t7. Next, from time t7 to t8, the signal charge stored in the photodiode is transferred to FD0 by the transfer signal (TG). The HCG signal component is read out between times t8 and t9.

The signal charge stored in the photodiode at time t9 is transferred to FD1 by turning on transfer signal GC1. From time t9 to t10, the signal charge stored in the photodiode is transferred to FD1 by the transfer signal (TG). The LCG signal component is read out between times t10 and t11.

Next, photodiode PD and FD0, FD1, and FD2 are reset at time t9 to t10, and the process waits for the exposure to start. Then, from time t11 to t12, the shutter operates to start the exposure. The exposure time ends at time t13.

The signal charge stored in storage capacitive element C1 at time t13 is transferred to FD1 by turning on transfer signal GC1. From time t13 to t14, the signal charge stored in the photodiode and the charge stored in storage capacitive element C1 are transferred to FD1 by the transfer signal (TG). The LCG signal component is read out between times t14 and t15.

A reset operation is performed between times t15 and t16. The HCG reset component is read out between times t16 and t17.

Next, photodiode PD and FD0, FD1, and FD2 are reset at time t17 to t18, and the process waits for the exposure to start. Then, from time t19 to t20, the shutter operates to start the exposure. The exposure time ends at time t21.

The signal charge stored in storage capacitive element C2 at time t21 is transferred to FD1 by turning on transfer signal GC2. From time t23 to t24, the signal charge stored in the photodiode, the charge stored in storage capacitive element C1, and the charge stored in storage capacitive element C2 are transferred to FD1 by the transfer signal (TG). The LCG signal component is read out between times t22 and t23.

A reset operation is performed between times t23 and t24. The HCG reset component is read out between times t24 and t25.

Here, reset noise is generated during the shutter period at times t11 and t12, during the reset period at times t15 and t16, during the shutter period at times t19 and t20, and during the reset period at times t23 and t24. Therefore, during this period, negative feedback circuit 21 works to gradually turn off reset control signal RS and gain control signal GC2, thereby reducing the reset noise. This shows how a sloped signal is applied to the reset transistor (RS) and the gain control signal (GC2).

[8.4 Dynamic Range Extension]

In Embodiments 1 through 7, the three frames—the long, middle, and short frames—combined to achieve a WDR are exposed at exactly the same timing and the exact same pixels are used, which inhibits false colors, coloring, and blur.

The feature according to Embodiment 8 is that regarding the three frames—the long, middle, and short frames—combined to achieve a WDR, since the configuration includes two negative feedback circuits 21 and 21a for shutter and read, time can be changed independently. Thus, for example, the dynamic range can be extended by shortening the exposure time.

The relationship between subject illuminance and gain (S/N) for Embodiment 8 can extend the dynamic range by varying the exposure time in FIG. 39A through FIG. 39D of Embodiments 6 and 7.

With the same accumulation time for PD, C1, and C2, for example, the first exposure time is T_Q0, the second exposure time is T_Q1, the third exposure time is T_Q2, and the 1V period (one vertical synchronization period) is continuously exposed in the relationship T_Q0>T_Q1>T_Q2.

Here, when the charge of photodiode PD is expressed as Q0, the charge of storage capacitive element C1 is expressed as Q1, and the charge of storage capacitive element C2 is expressed as Q2, a signal charge of Q0 is accumulated at T_Q0, a signal charge of Q0+Q1 is accumulated at T_Q1, and a signal charge of Q0+Q1+Q2 is accumulated at T_Q2.

The intra-pixel gain×exposure time is set high for pixel signals in the frame for the low-illuminance region (i.e., for long exposures), set medium for pixel signals in the frame for the medium-illuminance region (i.e., for middle exposures), and set low for pixel signals in the frame for the high-illuminance region (i.e., for short exposures), which can also improve noise in low-illuminance conditions and extend the dynamic range in high-illuminance conditions.

Thus, the present embodiment makes it possible to improve both dynamic range and SN while reducing the reset noise of the storage capacitive element.

Here, as an example, line-by-line control of the exposure of three frames is used, but exposure of three or more frames is also possible.

Embodiment 9

Embodiment 7 includes one feedback amplifier because the read and shutter rows have the same readout due to 1V exposure, while Embodiment 9 is directed to readout when there are two feedback amplifiers because the read and shutter rows are not the same. Each can independently produce negative feedback, allowing the exposure time to be set freely and multiple times within one frame period.

[9.1 Pixel Circuit Configuration Example]

Next, an example of a configuration of pixel circuit 3 will be described.

Figure 45:
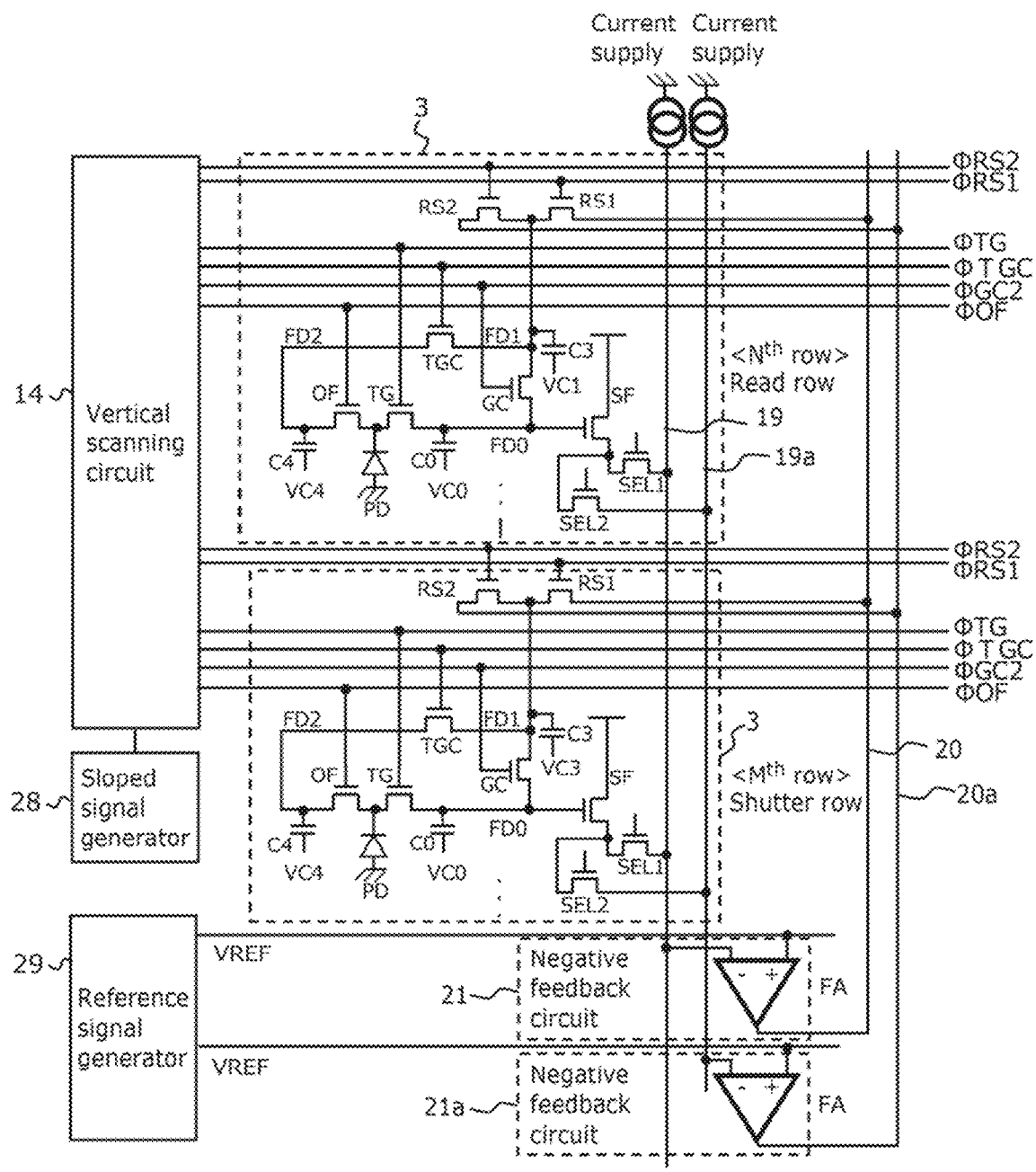
FIG. 45 illustrates a circuit example of a pixel circuit and a negative feedback circuit according to Embodiment 9.

FIG. 45 illustrates a circuit example of pixel circuit 3 and negative feedback circuit 21 according to Embodiment 9. FIG. 45 differs from the third configuration example of FIG. 1C and the configuration example of FIG. 40 according to Embodiment 7 in regard to the addition of second reset transistor RS2, selection transistor SEL2, a current supply, and negative feedback circuit 21a.

This configuration allows for resetting of two different pixel rows by negative feedback circuits 21 and 21a. For example, a reset can be performed on one row at the start of exposure and a reset can be performed on another row at readout.

[9.2 Readout Operation Example According to Present Embodiment]

Figure 46A:
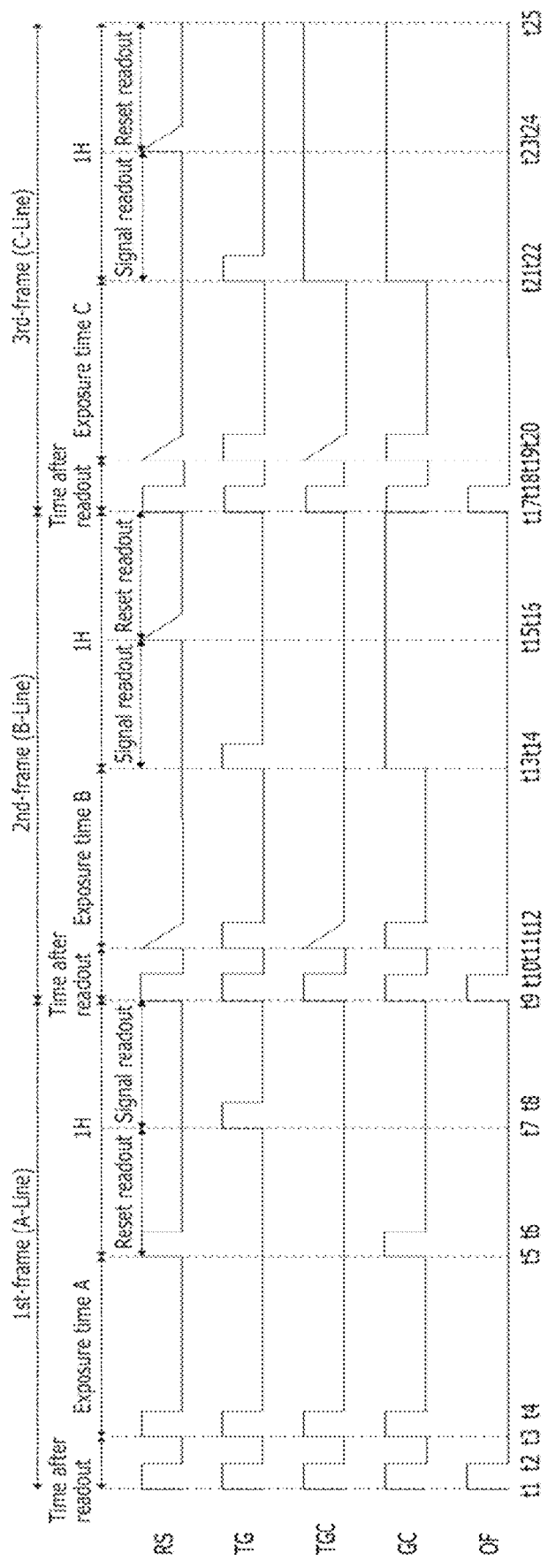
FIG. 46A is a time chart illustrating the readout order of one frame in Embodiment 9.

FIG. 46A is a time chart illustrating the readout order of one frame in Embodiment 9.

The gain that converts the signal charge at floating diffusion layer FD1 into voltage can be selectively switched between a high gain, a mid gain (MCG) and a low gain according to the on/off state of gain control transistor GC1 and storage transfer transistor (TG)C.

In HCG, the normal CDS order in 1H is HCG (R: reset component) to HCG (S: signal component). This transition results in the readout of signal charge from photodiode PD to floating diffusion layer FD0 with a high conversion gain in floating diffusion layer FD0. Since this transition is a normal CDS, the reset noise can be canceled to zero.

In MCG, the sequence is MCG (R: reset component) to MCG (S: signal component). This transition results in the readout of signal charge from photodiode PD to floating diffusion layers FD0 and FD1 with a medium conversion gain in floating diffusion layer FD0.

In LCG, the sequence is LCG (R: reset component) to LCG (S: signal component). This transition results in the readout of signal charge from photodiode PD to floating diffusion layers FD0, FD1, and FD2 with a medium conversion gain in floating diffusion layer FD0. Since this transition is not a normal CDS, the reset noise cannot be canceled, but is reduced using the negative feedback circuits.

FIG. 46B illustrates the readout sequence of the reset component and the signal component in the HCG readout, the MCG readout, and the LCG readout of FIG. 46A. FIG. 46B illustrates CDS order in 1H. The readout sequence is HCG (R: reset component) to HCG (S: signal component) to MCG (S: signal component) to MCG (R: reset component) to LCG (S: signal component) to LCG (R: reset component).

This MCG and LCG transition can remove DC-like offsets (reset coupling), but pixel reset noise cannot be canceled and will remain as kTC noise.

The kTC noise in this middle exposure (medium illuminance) appears on at medium illuminance. Here, kTC noise is expressed as √(kTC) at charge amount. Settings must be configured so that this noise is sufficiently smaller than the signal level. Accordingly, at the boundary between the middle exposure (medium illuminance) and the long exposure (low illuminance), it is necessary to sufficiently improve the latter SN more than the former SN.

The kTC noise in this short exposure (high illuminance) appears on the low illuminance side. Here, kTC noise is expressed as √(kTC) at charge amount. Settings must be configured so that this noise is sufficiently smaller than the signal level. Accordingly, at the boundary between the middle exposure (medium illuminance) and the long exposure (low illuminance), it is necessary to sufficiently improve the latter SN more than the former SN.

[9.3 Configuration and Operation Examples of Negative Feedback Circuit]

FIG. 44 illustrates one example of timing related to the accumulating of charges of photodiode PD, storage capacitive element C1, and storage capacitive element C2. With the same accumulation time for PD, C1, and C2, the first exposure time is T_Q0, the second exposure time is T_Q1, the third exposure time is T_Q2 and the 1V period (one vertical synchronization period) is continuously exposed in the relationship T_Q0>T_Q1>T_Q2.

When the charge of photodiode PD is expressed as Q0, the charge of storage capacitive element C3 is expressed as Q1, and the charge of storage capacitive element C4 is expressed as Q2, a signal charge of Q0 is accumulated at T_Q0, a signal charge of Q0+Q1 is accumulated at T_Q1, and a signal charge of Q0+Q1+Q2 is accumulated at T_Q2.

Next, one example of the timing will be described with reference to FIG. 46A.

First, photodiode PD and FD0, FD1, and FD2 are reset at time t1 to t2, and the process waits for the exposure to start. Then, from time t3 to t4, the shutter operates to start the exposure. The exposure time ends at time t5.

A reset operation is performed between times t5 and t6. The HCG reset component is read out between times t6 and t7. Next, from time t7 to t8, the signal charge stored in the photodiode is transferred to FD0 by the transfer signal (TG). The HCG signal component is read out between times t8 and t9.

The signal charge stored in the photodiode at time t9 is transferred to FD1 by turning on transfer signal GC1. From time t9 to t10, the signal charge stored in the photodiode is transferred to FD1 by the transfer signal (TG). The LCG signal component is read out between times t10 and t11.

Next, photodiode PD and FD0, FD1, and FD2 are reset at time t9 to t10, and the process waits for the exposure to start. Then, from time t11 to t12, the shutter operates to start the exposure. The exposure time ends at time t13.

The signal charge stored in storage capacitive element C1 at time t13 is transferred to FD1 by turning on transfer signal GC1. From time t13 to t14, the signal charge stored in the photodiode and the charge stored in storage capacitive element C1 are transferred to FD1 by the transfer signal (TG). The LCG signal component is read out between times t14 and t15.

A reset operation is performed between times t15 and t16. The HCG reset component is read out between times t16 and t17.

Next, photodiode PD and FD0, FD1, and FD2 are reset at time t17 to t18, and the process waits for the exposure to start. Then, from time t19 to t20, the shutter operates to start the exposure. The exposure time ends at time t21.

The signal charge stored in storage capacitive element C4 at time t21 is transferred to FD1 by turning on storage transfer transistor (TG)C. From time t23 to t24, the signal charge stored in the photodiode, the charge stored in storage capacitive element C1, and the charge stored in storage capacitive element C2 are transferred to FD1 by the transfer signal (TG) and storage transfer transistor (TG)C. The LCG signal component is read out between times t22 and t23.

A reset operation is performed between times t23 and t24. The HCG reset component is read out between times t24 and t25.

Here, reset noise is generated during the shutter period at times t11 and t12, and during the reset period at times t15 and t16. Reset noise is generated during the shutter period at times t19 and t20, and during the reset period at times t23 and t24. Therefore, during this period, negative feedback circuit 21 works to gradually turn off reset control signal RS and stored charge transfer element TGC, thereby reducing the reset noise. This shows how a sloped signal is applied to the reset transistor (RS) and the stored charge transfer element (TGC). Alternatively, as another method, negative feedback circuit 21 is activated in the shutter period at times t11 and t12 and the shutter period at times t19 and t20, reset control signal RS is turned off gradually, and stored charge transfer element TGC is turned off abruptly, as shown by the dashed line. In this case, due to the law of charge storage, the reset noise of storage capacitive element C4 is not reduced, but the reset noise in the positive and negative reverse directions is generated in FD0. Since the FD portion is not reset until signal readout (LCG), the reset noise of storage capacitive element C4 and the FD portion can be canceled to zero at this time.

[9.4 Dynamic Range Extension]

In Embodiments 1 through 7, the three frames—the long, middle, and short frames—combined to achieve a WDR are exposed at exactly the same timing and the exact same pixels are used, which inhibits false colors, coloring, and blur.

The feature according to Embodiment 9 is that regarding the three frames—the long, middle, and short frames—combined to achieve a WDR, since the configuration includes two negative feedback circuits 21 for shutter and read, time can be changed independently. Thus, for example, the dynamic range can be extended by shortening the exposure time.

The relationship between subject illuminance and gain (S/N) for Embodiment 9 can extend the dynamic range by varying the exposure time in FIG. 39A through FIG. 39D of Embodiments 6 and 7.

With the same accumulation time for PD, C1, and C2, for example, the first exposure time is T_Q0, the second exposure time is T_Q1, the third exposure time is T_Q2, and the 1V period (one vertical synchronization period) is continuously exposed in the relationship T_Q0>T_Q1>T_Q2.

Here, when the charge of photodiode PD is expressed as Q0, the charge of storage capacitive element C3 is expressed as Q1, and the charge of storage capacitive element C4 is expressed as Q2, a signal charge of Q0 is accumulated at T_Q0, a signal charge of Q0+Q1 is accumulated at T_Q1, and a signal charge of Q0+Q1+Q2 is accumulated at T_Q2.

The intra-pixel gain×exposure time is set high for pixel signals in the frame for the low-illuminance region (i.e., for long exposures), set medium for pixel signals in the frame for the medium-illuminance region (i.e., for middle exposures), and set low for pixel signals in the frame for the high-illuminance region (i.e., for short exposures), which can also improve noise in low-illuminance conditions and extend the dynamic range in high-illuminance conditions.

Thus, the present embodiment makes it possible to improve both dynamic range and SN while reducing the reset noise of the storage capacitive element.

Here, as an example, line-by-line control of the exposure of three frames is used, but exposure of three or more frames is also possible.

Embodiment 10

Hereinafter, an imaging apparatus according to Embodiment will be described with reference to the drawings. Note that the imaging apparatus according to the present embodiment includes one or more solid-state imaging apparatuses 100 according to Embodiment 1 through Embodiment 9 described above. The imaging apparatus will now be described in greater detail.

Figure 47:
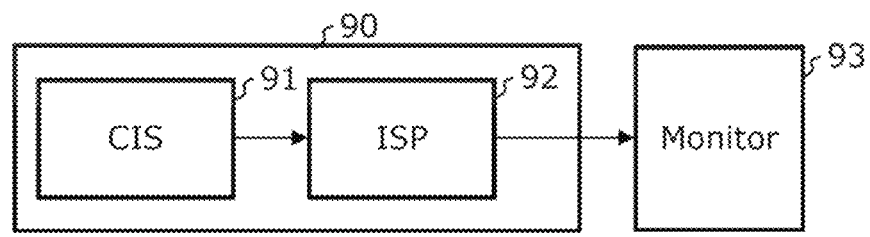
FIG. 47 is a block diagram of an example of the imaging apparatus according to Embodiment 10.

FIG. 47 is a block diagram of a view system, and illustrates an example of the imaging apparatus according to Embodiment 10. The imaging apparatus in FIG. 47 includes CMOS image sensor (CIS) 91, image signal processor (ISP) 92, and monitor 93. The imaging apparatus is, for example, a digital camera or the camera of a smartphone or the like. CIS 91 corresponds to solid-state imaging apparatus 100 described in the above embodiments. ISP 92 receives an image signal from CIS 91 and performs image processing on the image signal, such as enlarging, shrinking, compression encoding, decoding, etc. Monitor 93 is for the user to check the capturing of images.

Note that CIS 91 and ISP 92 may be realized as a system on a chip (SoC) 90, i.e., may be integrated on a single chip, or as individual chips. When CIS 91 and ISP 92 are individual chips, signal processor 70 may be provided in CIS 91 or ISP 92. Moreover, part of signal processor 70 may be realized as software instead of circuitry.

Figure 48:
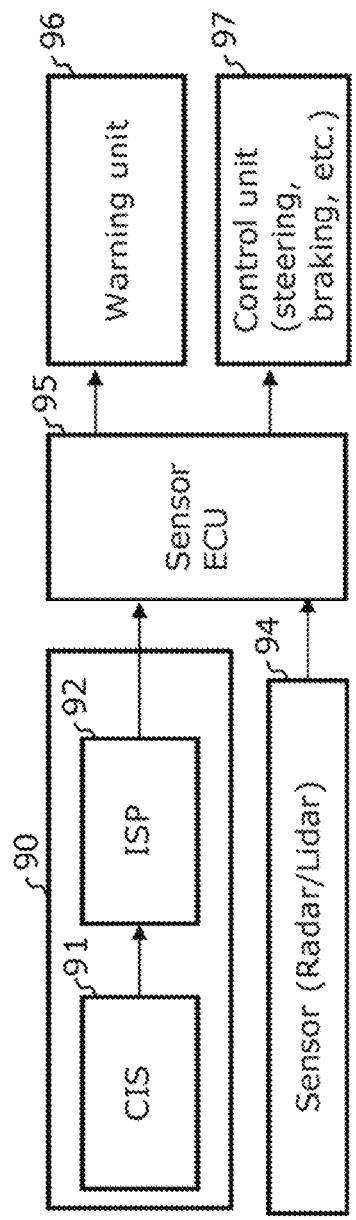
FIG. 48 is a block diagram of another example of the imaging apparatus according to Embodiment 10.

FIG. 48 is a block diagram of an advanced driver assistance systems (ADAS) sensing system or an autonomous driving sensing system, and illustrates another example of the imaging apparatus according to Embodiment 10. The imaging apparatus in FIG. 48 includes CMOS image sensor (CIS) 91, image signal processor (ISP) 92, sensor 94, sensor electronic control unit (ECU) 95, warning unit 96, and control unit 97. The imaging apparatus is, for example, a camera system provided in an automobile. CIS 91 and ISP 92 correspond to signal processor 70. Sensor 94 is, for example, a radar sensor for measuring distance or a light detection and ranging (lidar) sensor for measuring distance.

Sensor ECU 95 receives signals from ISP 92 and sensor 94, and controls warning unit 96 and control unit 97 accordingly. Warning unit 96 is, for example, a warning lamp or a status indicator lamp in the instrument panel of the automobile. Control unit 97 controls, for example, actuators that move steering and braking mechanisms in the automobile.

Note that the imaging apparatus illustrated in FIG. 2 may be connected to a monitor in the view system, may correspond to an advanced driver assistance systems (ADAS) sensing system or an autonomous driving sensing system, and may give warnings or carry out control (steering, braking, etc.) via the sensor ECU in the sensing system.

Figure 49:
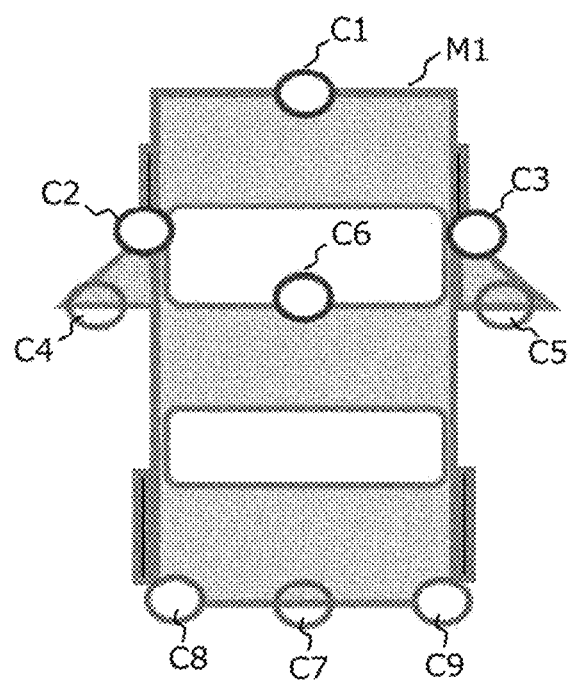
FIG. 49 illustrates an example of how an automobile is provided with the imaging apparatus according to Embodiment 10.
Figure 50:
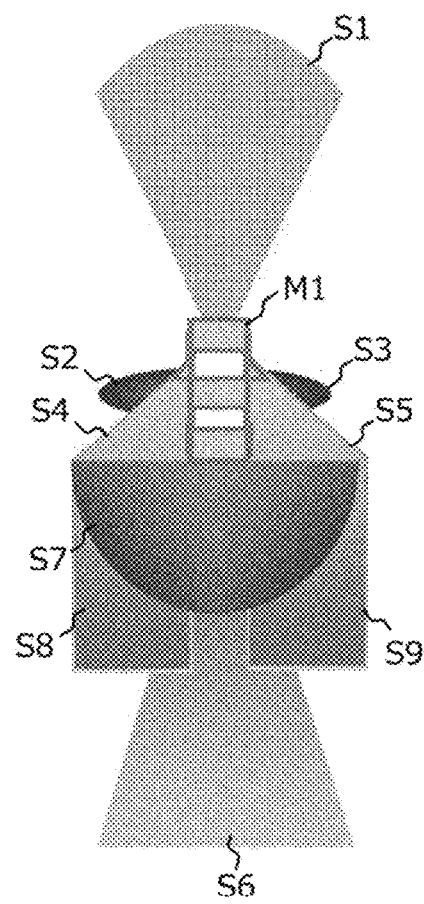
FIG. 50 illustrates an example of imaging ranges corresponding to the example in FIG. 49 according to Embodiment 10.

FIG. 49 illustrates an example of how automobile M1 is provided with the imaging apparatus according to Embodiment 10. FIG. 50 illustrates an example of imaging ranges corresponding to the example in FIG. 49 according to Embodiment 10.

In FIG. 49, for example, imaging apparatuses, each of which is the imaging apparatus illustrated in FIG. 2, are attached at attachment locations C1 through C9. Attachment location C1 is the front of automobile M1. Attachment location C2 is the left side of the body of automobile M1. Attachment location C3 is the right side of the body of automobile M1. Attachment location C4 is the left side-view mirror. Attachment location C5 is the right side-view mirror. Attachment location C6 is the rear-view mirror. Attachment location C7 is the central region of the rear of automobile M1. Attachment location C8 is the left side of the rear of automobile M1. Attachment location C9 is the right side of the rear of automobile M1.

In FIG. 50, imaging ranges S1 through S9 correspond to the cameras at attachment locations C1 through C9, respectively.

As illustrated in FIG. 49 and FIG. 50, imaging apparatuses can be positioned to function as front-view, surround-view, side-view, rear-view, or intelligent-rear-view cameras for a view system or sensing on transport equipment (vehicle, automobile), according to their respective imaging ranges.

As described above, the imaging apparatus according to Embodiment 10 includes the imaging apparatus described above and illustrated in FIG. 47 or FIG. 48, and forms any one of a view system, an advanced driver assistance systems (ADAS) sensing system, or an autonomous driving sensing system.

Here, the imaging apparatus is provided in at least one of a front mirror, a left side-mirror, a right side-mirror, or a rear-view mirror of the transport equipment.

An imaging apparatus includes solid-state imaging apparatus 100 described above. The imaging apparatus corresponds to at least one of a view system for transport equipment, an advanced driver assistance systems (ADAS) sensing system for transport equipment, or an autonomous driving sensing system for transport equipment. The imaging apparatus is provided in at least one of a front, a surround-view location, a side-view location, a rear-view location, or a rear-view mirror of the transport equipment.

Other Embodiments

The solid-state imaging apparatus and the imaging apparatus including the solid-state imaging apparatus according to the present disclosure have been described based on exemplary embodiments, but are not limited thereto. Those skilled in the art will readily appreciate that variations resulting from arbitrarily combining elements from the exemplary embodiments, variations resulting from modifying the exemplary embodiments that do not depart from the scope of the present disclosure, and various devices equipped with the solid-state imaging apparatus and the imaging apparatus including the solid-state imaging apparatus according to the present disclosure are included in the present invention.

INDUSTRIAL APPLICABILITY

The present disclosure is applicable in solid-state imaging apparatuses and imaging apparatuses.

The invention claimed is:
1. A solid-state imaging apparatus comprising:
a pixel circuit; and
a negative feedback circuit, wherein:
the pixel circuit includes:
a photodiode;
a charge storage;
a transfer transistor that transfers a signal charge generated by the photodiode to the charge storage;

an amplification transistor that outputs a pixel signal corresponding to a signal charge in the charge storage;
a first reset transistor that resets the charge storage;
a first storage capacitive element; and
a first transistor that controls a connection between the charge storage and the first storage capacitive element,
the negative feedback circuit negatively feeds back a feedback signal according to a reset output of the amplification transistor to the charge storage via the first reset transistor,
the first transistor is connected between the first reset transistor and the charge storage, in series with the first reset transistor,
the first storage capacitive element is connected to a connection point of the first reset transistor and the first transistor, and
the solid-state imaging apparatus further comprises:
  a second transistor inserted in series between the first transistor and the charge storage; and
  a second storage capacitive element that is connected to (i) a connection point of the first transistor and the second transistor and (ii) the charge storage via the second transistor.

2. The solid-state imaging apparatus according to claim 1, wherein
a gate voltage of the transfer transistor and a gate voltage of the first transistor are set to enable a signal charge that overflows from the photodiode to be transferred to the first storage capacitive element during exposure.

3. The solid-state imaging apparatus according to claim 1, further comprising:
an overflow element that transfers a signal charge that overflows from the photodiode to the first storage capacitive element.

4. The solid-state imaging apparatus according to claim 1, wherein
the pixel circuit comprises a plurality of pixel circuits, and
the solid-state imaging apparatus further comprises:
  a drive unit that drives simultaneous exposure of the plurality of pixel circuits; and
  a control circuit that reads out the pixel signals of the plurality of pixel circuits by scanning the plurality of pixel circuits.

5. The solid-state imaging apparatus according to claim 1, further comprising:
a control circuit that reads out, from the pixel circuit, a first pixel signal for forming a first frame, a second pixel signal for forming a second frame, and a third pixel signal for forming a third frame, the second frame being a frame for a higher illuminance level than the first frame, the third frame being a frame for a higher illuminance level than the second frame, wherein:
the first pixel signal corresponds to a signal charge transferred to the charge storage from the photodiode,
the second pixel signal corresponds to a signal charge transferred to and mixed in the charge storage and the first storage capacitive element from the photodiode,
the third pixel signal corresponds to a signal charge transferred to and mixed in the charge storage, the first storage capacitive element, and the second storage capacitive element from the photodiode, and
the first pixel signal, the second pixel signal, and the third pixel signal are based on signal charges generated in a same exposure period by the photodiode in a single pixel circuit.

6. The solid-state imaging apparatus according to claim 1, further comprising:
a control circuit that reads out, from the pixel circuit, a first pixel signal forming a first frame, a second pixel signal forming a second frame, and a third pixel signal forming a third frame, the second frame being a frame for a higher illuminance level than the first frame, the third frame being a frame for a higher illuminance level than the second frame, wherein:
the first pixel signal corresponds to a signal charge transferred to the charge storage from the photodiode,
the second pixel signal corresponds to a signal charge transferred to and mixed in the charge storage and the first storage capacitive element from the photodiode,
the third pixel signal corresponds to a signal charge transferred to and mixed in the charge storage, the first storage capacitive element, and the second storage capacitive element from the photodiode, and
the first pixel signal, the second pixel signal, and the third pixel signal are based on signal charges generated in different exposure periods by the photodiode in a single pixel circuit.

7. An imaging apparatus comprising:
the solid-state imaging apparatus according to claim 1, wherein:
the imaging apparatus corresponds to at least one of a view system for transport equipment, an advanced driver assistance systems (ADAS) sensing system for transport equipment, or an autonomous driving sensing system for transport equipment, and
the imaging apparatus is provided at at least one of a front, a surround-view location, a side-view location, a rear-view location, or a rear-view mirror of the transport equipment.

8. A solid-state imaging apparatus comprising:
a pixel circuit; and
a negative feedback circuit, wherein:
the pixel circuit includes:
  a photodiode;
  a charge storage;
  a transfer transistor that transfers a signal charge generated by the photodiode to the charge storage;
  an amplification transistor that outputs a pixel signal corresponding to a signal charge in the charge storage;
  a first reset transistor that resets the charge storage;
  a first storage capacitive element; and
  a first transistor that controls a connection between the charge storage and the first storage capacitive element,
the negative feedback circuit negatively feeds back a feedback signal according to a reset output of the amplification transistor to the charge storage via the first reset transistor,
the solid-state imaging apparatus further comprises:
  a second transistor inserted between (i) a connection point of the first reset transistor and the first transistor and (ii) the charge storage; and
  a second storage capacitive element connected to the connection point of the first reset transistor and the first transistor, and
the first transistor connects (i) a connection point of the first reset transistor and the second transistor and (ii) the first storage capacitive element.

9. An imaging apparatus comprising:
the solid-state imaging apparatus according to claim 8, wherein:

the imaging apparatus corresponds to at least one of a view system for transport equipment, an advanced driver assistance systems (ADAS) sensing system for transport equipment, or an autonomous driving sensing system for transport equipment, and the imaging apparatus is provided at at least one of a front, a surround-view location, a side-view location, a rear-view location, or a rear-view mirror of the transport equipment.

10. A solid-state imaging apparatus comprising:
a pixel circuit; and
a negative feedback circuit, wherein:
the pixel circuit includes:
  a photodiode;
  a charge storage;
  a transfer transistor that transfers a signal charge generated by the photodiode to the charge storage;
  an amplification transistor that outputs a pixel signal corresponding to a signal charge in the charge storage;
  a first reset transistor that resets the charge storage;
  a first storage capacitive element; and
  a first transistor that controls a connection between the charge storage and the first storage capacitive element,
the negative feedback circuit negatively feeds back a feedback signal according to a reset output of the amplification transistor to the charge storage via the first reset transistor,
the solid-state imaging apparatus further comprises a control circuit that reads out, from the pixel circuit, a first pixel signal for forming a first frame and a second pixel signal for forming a second frame, the second frame being a frame for a higher illuminance level than the first frame,
the first pixel signal corresponds to a signal charge transferred to the charge storage from the photodiode,
the second pixel signal corresponds to a signal charge transferred to and mixed in the charge storage and the first storage capacitive element from the photodiode, and
the first pixel signal and the second pixel signal are based on signal charges generated in a same exposure period by the photodiode in a single pixel circuit.

11. An imaging apparatus comprising:
the solid-state imaging apparatus according to claim 10, wherein:
the imaging apparatus corresponds to at least one of a view system for transport equipment, an advanced driver assistance systems (ADAS) sensing system for transport equipment, or an autonomous driving sensing system for transport equipment, and
the imaging apparatus is provided at at least one of a front, a surround-view location, a side-view location, a rear-view location, or a rear-view mirror of the transport equipment.

12. A solid-state imaging apparatus comprising:
a pixel circuit; and
a negative feedback circuit, wherein:
the pixel circuit includes:
  a photodiode;
  a charge storage;
  a transfer transistor that transfers a signal charge generated by the photodiode to the charge storage;
  an amplification transistor that outputs a pixel signal corresponding to a signal charge in the charge storage;
  a first reset transistor that resets the charge storage;
  a first storage capacitive element; and
  a first transistor that controls a connection between the charge storage and the first storage capacitive element,
the negative feedback circuit negatively feeds back a feedback signal according to a reset output of the amplification transistor to the charge storage via the first reset transistor, and
a control signal input into at least the first reset transistor among the first reset transistor and the first transistor includes a sloped voltage waveform that gradually transitions from an on state to an off state.

13. The solid-state imaging apparatus according to claim 12, wherein:
the pixel circuit comprises a plurality of pixel circuits, and
the solid-state imaging apparatus further comprises:
  a measurement unit configured to measure reset noise levels of pixel circuits located in a predetermined area among the plurality of pixel circuits; and
  a determination unit configured to determine an incline for the sloped voltage waveform that reduces variation in the reset noise levels, based on a measurement result of the measurement unit.

14. The solid-state imaging apparatus according to claim 13, wherein:
the measurement unit is configured to measure the reset noise levels while varying the incline of the sloped voltage waveform, per row of the pixel circuits located in the predetermined area, and
the determination unit is configured to determine an optimal incline for the sloped voltage waveform based on the variation per row of the pixel circuits located in the predetermined area.

15. An imaging apparatus comprising:
the solid-state imaging apparatus according to claim 12, wherein:
the imaging apparatus corresponds to at least one of a view system for transport equipment, an advanced driver assistance systems (ADAS) sensing system for transport equipment, or an autonomous driving sensing system for transport equipment, and
the imaging apparatus is provided at at least one of a front, a surround-view location, a side-view location, a rear-view location, or a rear-view mirror of the transport equipment.

16. A solid-state imaging apparatus comprising:
a pixel circuit; and
a negative feedback circuit, wherein:
the pixel circuit includes:
  a photodiode;
  a charge storage;
  a transfer transistor that transfers a signal charge generated by the photodiode to the charge storage;
  an amplification transistor that outputs a pixel signal corresponding to a signal charge in the charge storage;
  a first reset transistor that resets the charge storage;
  a first storage capacitive element; and
  a first transistor that controls a connection between the charge storage and the first storage capacitive element,
the negative feedback circuit negatively feeds back a feedback signal according to a reset output of the amplification transistor to the charge storage via the first reset transistor, the pixel circuit comprises a plurality of pixel circuits arranged in a matrix, the negative feedback circuit is provided per column of the plurality of pixel circuits or per pixel circuit, each negative feedback circuit includes a first feedback amplifier that outputs the feedback signal to the first reset transistors of the plurality of pixel circuits located in the column to which the negative feedback circuit corresponds or to the first reset transistor in the pixel circuit to which the negative feedback circuit corresponds, the negative feedback circuit is provided per column of the plurality of pixel circuits, each of the plurality of pixel circuits includes a second reset transistor that resets the charge storage, and each negative feedback circuit further includes a second feedback amplifier that outputs the feedback signal to the second reset transistors of the plurality of pixel circuits located in the column to which the negative feedback circuit corresponds.

17. An imaging apparatus comprising:

the solid-state imaging apparatus according to claim 16, wherein:

the imaging apparatus corresponds to at least one of a view system for transport equipment, an advanced driver assistance systems (ADAS) sensing system for transport equipment, or an autonomous driving sensing system for transport equipment, and the imaging apparatus is provided at at least one of a front, a surround-view location, a side-view location, a rear-view location, or a rear-view mirror of the transport equipment.

18. A solid-state imaging apparatus comprising:

a pixel circuit; and a negative feedback circuit, wherein:

the pixel circuit includes:
  a photodiode;
  a charge storage;
  a transfer transistor that transfers a signal charge generated by the photodiode to the charge storage;
  an amplification transistor that outputs a pixel signal corresponding to a signal charge in the charge storage;
  a first reset transistor that resets the charge storage;
  a first storage capacitive element; and
  a first transistor that controls a connection between the charge storage and the first storage capacitive element, the negative feedback circuit negatively feeds back a feedback signal according to a reset output of the amplification transistor to the charge storage via the first reset transistor, the pixel circuit comprises a plurality of pixel circuits arranged in a matrix, the negative feedback circuit is provided per column of the plurality of pixel circuits or per pixel circuit, each negative feedback circuit includes a first feedback amplifier that outputs the feedback signal to the first reset transistors of the plurality of pixel circuits located in the column to which the negative feedback circuit corresponds or to the first reset transistor in the pixel circuit to which the negative feedback circuit corresponds, the solid-state imaging apparatus includes a first semiconductor chip and a second semiconductor chip that are bonded together, the first semiconductor chip includes the photodiodes and the first storage capacitive elements of the plurality of pixel circuits, and the second semiconductor chip includes the first feedback amplifiers provided per column of the plurality of pixel circuits or per pixel circuit.

19. An imaging apparatus comprising:

the solid-state imaging apparatus according to claim 18, wherein:

the imaging apparatus corresponds to at least one of a view system for transport equipment, an advanced driver assistance systems (ADAS) sensing system for transport equipment, or an autonomous driving sensing system for transport equipment, and the imaging apparatus is provided at at least one of a front, a surround-view location, a side-view location, a rear-view location, or a rear-view mirror of the transport equipment.

20. A solid-state imaging apparatus comprising:

a pixel circuit; and a negative feedback circuit, wherein:

the pixel circuit includes:
  a photodiode;
  a charge storage;
  a transfer transistor that transfers a signal charge generated by the photodiode to the charge storage;
  an amplification transistor that outputs a pixel signal corresponding to a signal charge in the charge storage;
  a first reset transistor that resets the charge storage;
  a first storage capacitive element; and
  a first transistor that controls a connection between the charge storage and the first storage capacitive element, the negative feedback circuit negatively feeds back a feedback signal according to a reset output of the amplification transistor to the charge storage via the first reset transistor, the pixel circuit comprises a plurality of pixel circuits arranged in a matrix, the negative feedback circuit is provided per pixel circuit, each negative feedback circuit includes a first feedback amplifier that outputs the feedback signal to the first reset transistor in the pixel circuit to which the negative feedback circuit corresponds, the solid-state imaging apparatus includes a first semiconductor chip and a second semiconductor chip that are bonded together, the first semiconductor chip includes the photodiodes of the plurality of pixel circuits, and the second semiconductor chip includes:
  the first feedback amplifiers provided per pixel circuit; and
  the first storage capacitive elements of the plurality of pixel circuits.

21. An imaging apparatus comprising:

the solid-state imaging apparatus according to claim 20, wherein:

the imaging apparatus corresponds to at least one of a view system for transport equipment, an advanced driver assistance systems (ADAS) sensing system for transport equipment, or an autonomous driving sensing system for transport equipment, and the imaging apparatus is provided at at least one of a front, a surround-view location, a side-view location, a rear-view location, or a rear-view mirror of the transport equipment.

22. A solid-state imaging apparatus comprising:
a pixel circuit; and
a negative feedback circuit, wherein:
the pixel circuit includes:
- a photodiode;
- a charge storage;
- a transfer transistor that transfers a signal charge generated by the photodiode to the charge storage;
- an amplification transistor that outputs a pixel signal corresponding to a signal charge in the charge storage;
- a first reset transistor that resets the charge storage;
- a first storage capacitive element; and
- a first transistor that controls a connection between the charge storage and the first storage capacitive element, the negative feedback circuit negatively feeds back a feedback signal according to a reset output of the amplification transistor to the charge storage via the first reset transistor,
the pixel circuit comprises a plurality of pixel circuits arranged in a matrix,
the negative feedback circuit is provided per column of the plurality of pixel circuits or per pixel circuit,
each negative feedback circuit includes a first feedback amplifier that outputs the feedback signal to the first reset transistors of the plurality of pixel circuits located in the column to which the negative feedback circuit corresponds or to the first reset transistor in the pixel circuit to which the negative feedback circuit corresponds,
the solid-state imaging apparatus includes a first semiconductor chip and a second semiconductor chip that are bonded together,
the first semiconductor chip includes the photodiodes and the charge storages of the plurality of pixel circuits, and
the second semiconductor chip includes the first storage capacitive elements of the plurality of pixel circuits.

23. An imaging apparatus comprising:
the solid-state imaging apparatus according to claim 22, wherein:
the imaging apparatus corresponds to at least one of a view system for transport equipment, an advanced driver assistance systems (ADAS) sensing system for transport equipment, or an autonomous driving sensing system for transport equipment, and
the imaging apparatus is provided at at least one of a front, a surround-view location, a side-view location, a rear-view location, or a rear-view mirror of the transport equipment.

* * * * *